(12) United States Patent
Nakamura et al.

(10) Patent No.: US 6,891,450 B2
(45) Date of Patent: May 10, 2005

(54) SURFACE ACOUSTIC WAVE FILTER, BALANCED TYPE FILTER AND COMMUNICATION DEVICE

(75) Inventors: Hiroyuki Nakamura, Katano (JP); Narihiro Mita, Hirakata (JP); Shigeru Tsuzuki, Neyagawa (JP); Toru Yamada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 231 days.

(21) Appl. No.: 10/160,411

(22) Filed: May 30, 2002

(65) Prior Publication Data

US 2003/0001695 A1 Jan. 2, 2003

(30) Foreign Application Priority Data

| May 31, 2001 | (JP) | ............................ | 2001-165730 |
| Aug. 24, 2001 | (JP) | ............................ | 2001-255280 |
| Nov. 15, 2001 | (JP) | ............................ | 2001-349885 |

(51) Int. Cl.⁷ ............................ H03H 9/64; H03H 9/72
(52) U.S. Cl. ................ 333/193; 333/195; 333/133; 310/313 D
(58) Field of Search .................. 333/133, 193–196; 310/313 R, 313 B, 313 C, 313 D

(56) References Cited

U.S. PATENT DOCUMENTS

| 5,039,891 A | | 8/1991 | Wen et al. ............... 327/113 |
| 5,568,002 A | | 10/1996 | Kawakatsu et al. ...... 310/313 B |
| 5,790,000 A | * | 8/1998 | Dai et al. ................ 333/193 |
| 5,835,990 A | | 11/1998 | Saw et al. ............. 310/313 D |
| 5,936,487 A | * | 8/1999 | Solal et al. ............... 333/193 |
| 6,081,172 A | | 6/2000 | Strauss et al. ............. 333/193 |
| 6,441,704 B1 | * | 8/2002 | Ali-Hackl et al. .......... 333/193 |
| 6,472,959 B1 | * | 10/2002 | Beaudin et al. ............. 333/193 |
| 2002/0063612 A1 | * | 5/2002 | Takamine ................... 333/193 |

FOREIGN PATENT DOCUMENTS

| JP | 1-151621 U | 10/1989 |
| JP | 06-204781 | 7/1994 |
| JP | 11-97966 | 4/1999 |
| JP | 11-251861 | 9/1999 |
| JP | 2001-503212 | 3/2001 |
| JP | 2002-171155 | * 6/2002 |

OTHER PUBLICATIONS

"Behavior of SAW Device as Multi–Port Circuits . . . ", 2001 Engineering Science Society Convention of the Institute of Electronics, Information and Communication Engineers, publication date Aug. 29, 2001 (w/ English translation).

"Effect of Stray Coupling on the Balance of a Differential LSAW Front–End Resonator–Filter for Wireless/Mobile Circuits"—P. J. Edmonson et al.—1999 IEEE Ultrasonics Symposium 1999, vol. 1 (pp. 361–364).

* cited by examiner

*Primary Examiner*—Barbara Summons
(74) *Attorney, Agent, or Firm*—RatnerPrestia

(57) ABSTRACT

A longitudinal mode type surface acoustic wave filter comprising a first IDT electrode, second and third IDT electrodes, and first and second reflector electrodes are formed on a piezoelectric substrate. The upper electrode of the first IDT electrode is connected to one of balanced type terminals, and the lower electrode of the first IDT electrode is connected to the other balanced type terminal. Also, the lower electrode of the second IDT electrode is connected to an unbalanced type terminal, and the lower electrode is grounded. The lower electrode of the third IDT electrode is connected to the unbalanced type terminal, and the upper electrode is grounded.

49 Claims, 50 Drawing Sheets

SURFACE ACOUSTIC WAVE FILTER, BALANCED TYPE FILTER AND COMMUNICATION DEVICE

BACKGROUND OF THE INVENTION

1. Field of the Invention

The present invention relates to an surface acoustic wave filter, a balanced type filter and a communication device.

2. Related Art of the Invention

Electromechanical functional parts using surface acoustic waves (SAW), of which wave acoustic velocity is several kilometers per second and which have characteristics such that wave energy is concentrated on the surface of a propagation medium, have received attention with the general trend toward densification of hardware, and gone into actual use in delay lines for radars and band-pass filters for television image receptors in association with development of inter digital transducer electrodes (IDT electrodes) and progress in thin film formation technology and surface treatment technology, and are now widely used as RF and IF stage filters for transmit-receive circuits of communication apparatuses.

In recent years, balance characteristics of semiconductor parts such as IC has been promoted for the purpose of improving antinoise characteristics, and balance characteristics is also required in surface acoustic wave filters for use in the RF stage. Also, in recent years, it has been required that the surface acoustic wave filter should have unbalanced-balanced type terminals or balanced-balanced type terminals, due to IC placed in the pre-stage and post-stage of the surface acoustic wave filter, and the like. In addition, longitudinal mode type surface acoustic wave filters have been widely used as filters of RF stage. For such surface acoustic wave filters, the balance characteristics is one of important parameters.

(A) The conventional longitudinal mode type surface acoustic wave filter having an unbalanced-balanced type input/output terminal will be first described referring to FIGS. 12 to 13.

The configuration of the conventional longitudinal mode type surface acoustic wave filter having an unbalanced-balanced type input/output terminal is shown in FIG. 12. In FIG. 12, the surface acoustic wave filter comprises first, second and third IDT electrodes 1002, 1003 and 1004, and first and second reflector electrodes 1005 and 1006 on a piezoelectric substrate 1001. The upper electrode finger of the first IDT electrode 1002 is connected to one of balanced type terminals 1007, and the lower electrode finger of the first IDT electrode 1002 is connected to the other balanced type terminal 1008. In addition, the electrode fingers of the IDT electrodes 1003 and 1004 located on the same side are connected to an unbalanced type terminal 1009, and the electrode fingers on the other side are grounded. The above configuration makes it possible to obtain the surface acoustic wave filter having unbalanced-balanced type terminals.

As another example, the configuration of the longitudinal mode type surface acoustic wave filter having balanced-balanced type terminals is shown in FIG. 13. In FIG. 13, the surface acoustic wave filter comprises first, second and third IDT electrodes 1002, 1003 and 1004, and first and second reflector electrodes 1005 and 1006 on the piezoelectric substrate 1001. The upper electrode finger of the first IDT electrode 1002 is connected to one of balanced type terminals 1007, and the lower electrode finger of the first IDT electrode 1002 is connected to the other balanced type terminal 1008. In addition, the electrode fingers of the IDT electrodes 1003 and 1004 located on the same side are connected to a balanced type terminal 1010, and the electrode fingers of the IDT electrodes 1003 and 1004 located on the other side are connected to a balanced type terminal 1011. The above configuration makes it possible to obtain the surface acoustic wave filter having balanced-balanced type terminals.

(B) The conventional longitudinal mode type surface acoustic wave filter having unbalanced-balanced type input/output terminals will now be described referring to FIG. 27.

FIG. 27 shows a schematic diagram of the conventional longitudinal mode type surface acoustic wave filter having unbalanced-balanced type input/output terminals. In FIG. 27, the surface acoustic wave filter comprises a first-stage filter track 6 and a second-stage filter track 12 each placed on the piezoelectric substrate.

The first-stage filter track 6 comprises first, second and third IDT electrodes 1, 2 and 3, and first and second reflector electrodes 4 and 5. Also, the second-stage filter track 12 comprises fourth, fifth and sixth IDT electrodes 7, 8 and 9, and third and fourth reflector electrodes 10 and 11.

The second and third IDT electrodes 2 and 3 are located on both sides of the first IDT electrode 1, and on both side of this arrangement, the first and second reflector electrodes 4 and 5 are located. Also, the fifth and sixth IDT electrodes 8 and 9 are located on both sides of the fourth IDT electrode, and both sides of this arrangement, the third and fourth reflector electrodes 10 and 11 are located.

The first IDT electrode 1 is constituted by an upper electrode 1a located on the side opposite to the second-stage filter track 12, and a lower electrode 1b located on the side of the second-stage filter track 12.

The second IDT electrode 2 is constituted by an upper electrode 2a located on the side opposite to the second-stage filter track 12, and a lower electrode 2b located on the side of the second-stage filter track 12.

The third IDT electrode 3 is constituted by an upper electrode 3a located on the side opposite to the second-stage filter track 12, and a lower electrode 3b located on the side of the second-stage filter track 12.

The fourth IDT electrode 7 is constituted by an upper electrode 7a located on the side of the first-stage filter track 6, and a lower electrode 7b located on the side opposite to the first-stage filter track 6.

The fifth IDT electrode 8 is constituted by an upper electrode 8a located on the side of the first-stage filter track 6, and a lower electrode 8b located on the side opposite to the first-stage filter track 6.

The sixth IDT electrode 9 is constituted by an upper electrode 9a located on the side of the first-stage filter track 6, and a lower electrode 9b located on the side opposite to the first-stage filter track 6.

In this way, the IDT electrodes are each constituted by a pair of comb electrodes, namely upper and lower electrodes.

Also, the upper electrode 1a of the first IDT electrode 1 is connected to an inputting unbalanced type terminal IN of the first-stage filter track 6 provided on the side opposite to the second-stage filter track 12, and the lower electrode 1b of the first IDT electrode 1 is grounded.

The lower electrode 2b of the second IDT electrode 2 is connected to the upper electrode 8a of the fifth IDT electrode 8 by a leading electrode 32. The upper electrode 2a of the second IDT electrode 2 is grounded.

The lower electrode 3b of the third IDT electrode 3 is connected to the upper electrode 9a of the sixth IDT electrode 9 by a leading electrode 33. The upper electrode 3a of the third IDT electrode 3 is grounded.

The upper electrode 7a of the fourth IDT electrode 7 is connected to a balanced type terminal OUT1 provided on the side of the first-stage filter track 6, of a pair of outputting balanced type terminals, and the lower electrode 7b of the fourth IDT electrode 7 is connected to a balanced type terminal OUT2 provided on the side opposite to the first-stage filter track 6, of a pair of outputting balanced type terminals.

The lower electrode 8b of the fifth IDT electrode 8 and the lower electrode 9b of the sixth IDT electrode 9 are both grounded.

Operations of this conventional surface acoustic wave filter will now be described.

By inputting a signal to the unbalanced type terminal IN, an surface acoustic wave is produced in the first IDT electrode 1. Then, the surface acoustic wave is locked in by the first and second reflector electrodes 4 and 5 to produce a plurality of resonance modes. By using these resonance modes, filter characteristics can be obtained, and conversions into electrical signals are carried out in the second IDT electrode 2 and the third IDT electrode 3, respectively.

The electrical signal converted in the second IDT electrode 2 is outputted to the upper electrode 8a of the fifth IDT electrode 8 through the leading electrode 32. Also, the electrical signal converted in the third IDT electrode 3 is outputted to the upper electrode 9a of the sixth IDT electrode 9 through the leading electrode 33. At this time, by adjusting in advance the intervals between the IDT electrodes of the surface acoustic wave filter and the way of connecting electrode fingers, the phase of the electrical signal inputted to the leading electrode 32 is made opposite to that of the electrical signal inputted to the leading electrode 33.

The electrical signal inputted to the fifth IDT electrode 8 is converted into an surface acoustic wave in the fifth IDT electrode 8, and the electrical signal inputted to the sixth IDT electrode 9 is converted into an surface acoustic wave in the sixth IDT electrode 9. Then, the surface acoustic waves converted in the fifth IDT electrode 8 and the sixth IDT electrode 9 are locked in by the third and fourth reflector electrodes 10 and 11 to produce a plurality of resonance modes, respectively. By using these resonance modes, filter characteristics can be obtained, and the electrical signals are outputted from the balanced type terminals OUT1 and OUT2.

(C) The conventional longitudinal mode type surface acoustic wave filter having a balanced type input/output terminal will now be described referring to FIG. 40.

The configuration of the conventional longitudinal mode type surface acoustic wave filter having a balanced type terminal is shown in FIG. 40. In FIG. 40, the surface acoustic wave filter has a configuration similar to that of the aforementioned conventional surface acoustic wave filter (see FIG. 12), and comprises first, second and third interdigital transducer electrodes 4102, 4103 and 4104 (hereinafter referred to as IDT electrode), and first and second reflector electrodes 4105 and 4106 on a piezoelectric substrate 4101. One electrode finger of the first IDT electrode 4102 is connected to one of balanced type terminals 4107, and the other electrode finger of the first IDT electrode 4102 is connected to the other balanced type terminal 4108. Also, the electrode fingers of the second and third IDT electrodes 4103 and 4104 located on one side are connected to an unbalanced type terminal 4109, and the electrode fingers located on the other side are grounded. The above configuration makes it possible to obtain the surface acoustic wave filter having unbalanced-balanced type terminals.

However, the above described conventional surface acoustic wave filter has the following problems.

(A) For the surface acoustic wave filter of FIG. 12, there exist near the leading electrode connecting the balanced type terminal 1007 to the first IDT electrode 1002 a wiring connecting the second IDT electrode 1003 to the unbalanced type terminal 1009, and a wiring connecting the third IDT electrode 1004 to the unbalanced type terminal 1009.

On the other hand, the leading electrode connecting the balanced type terminal 1008 to the first IDT electrode 1002 is located at a greater distance from the wiring connecting the second IDT electrode 1003 to the unbalanced type terminal 1009 and the leading electrode connecting the third IDT electrode 1004 to the unbalanced type terminal 1009, than leading electrode connecting the balanced type terminal 1007 to the first IDT electrode 1002.

Therefore, the leading electrode connecting the balanced type terminal 1007 to the first IDT electrode 1002 has a larger parasitic component of high frequency existing between itself and the leading electrode connecting the unbalanced type terminal 1009 to the second IDT electrode 1003 and the third IDT electrode 1004, than the leading electrode connecting the balanced type terminal 1008 to the first IDT electrode 1002. Thus, balance characteristics will be degraded.

For the surface acoustic wave filter of FIG. 13, a leading electrode connecting the second IDT electrode 1003 to the balanced type terminal 1010 and a leading electrode connecting the third IDT electrode 1004 to the balanced type terminal 1010 exist near the leading electrode connecting the balanced type terminal 1007 to the first IDT electrode 1002, and signals substantially identical in phase are passed through these two leading electrodes. Therefore, the parasitic component of high frequency between the leading electrode connecting the balanced type terminal 1007 to the first IDT electrode 1002 and the leading electrode from the second IDT electrode 1003 is substantially identical in phase to the parasitic component of high frequency between the leading electrode connecting the balanced type terminal 1007 to the first IDT electrode 1002 and the leading electrode from the third IDT electrode 1004.

Similarly, a leading electrode connecting the second IDT electrode 1003 to the balanced type terminal 1011 and a leading electrode connecting the third IDT electrode 1004 to the balanced type terminal 1011 exist near the leading electrode connecting the balanced type terminal 1008 to the first IDT electrode 1002, and signals substantially identical in phase are passed through these two leading electrodes. Therefore, the parasitic component of high frequency between the leading electrode connecting the balanced type terminal 1008 to the first IDT electrode 1002 and the leading electrode from the second IDT electrode 1003 is substantially identical in phase to the parasitic component of high frequency between the leading electrode connecting the balanced type terminal 1008 to the first IDT electrode 1002 and the leading electrode from the third IDT electrode 1004.

Therefore, the signals outputted from the balanced type terminals 1007 and 1008 or the balanced type terminals 1010 and 1011 contain the above described parasitic components, and an unbalanced parasitic component is generated in each of the balanced type terminals, thus compromising the characteristic of the surface acoustic wave filter.

In this way, for the conventional surface acoustic wave filter (see FIGS. 12 and 13), there are cases where leading electrodes from IDT electrodes and each IDT electrodes are spatially coupling to each other to degrade balance characteristics and compromise the characteristic of the surface acoustic wave filter.

(B) Also, for the surface acoustic wave filter of FIG. 27, a leading electrode 32 connecting the lower electrode 2b of the second IDT electrode 2 to the upper electrode 8a of the fifth IDT electrode 8, and a leading electrode 33 connecting the lower electrode 3b of the third IDT electrode 3 to the upper electrode 9a of the sixth IDT electrode 9 exist near the leading electrode connecting the balanced type terminal OUT1 to the upper electrode 7a of the fourth IDT electrode 7. On the other hand, neither leading electrode 32 nor leading electrode 33 exists near the leas wiring connecting the balanced type terminal OUT2 and the lower electrode 7b of the fourth IDT electrode 7.

In this way, the leading electrode connecting the balanced type terminal OUT1 to the upper electrode 7a of the fourth IDT electrode 7 is located at a closer distance from the leading electrodes 32 and 33 than the leading electrode connecting the balanced type terminal OUT2 to the lower electrode 7b of the fourth IDT electrode 7.

The inventor therefore believes that unbalanced parasitic components exist in the leading electrode connecting the balanced type terminal OUT1 to the upper electrode 7a of the fourth IDT electrode 7 and the leading electrode connecting the balanced type terminal OUT2 to the lower electrode 7b of the IDT electrode 7, thus degrading the balance characteristics.

In this way, for the conventional surface acoustic wave filter (see FIG. 27), there are cases where leading electrodes from IDT electrodes and each IDT electrodes are spatially coupling to each other to make the parasitic component unbalanced, whereby the balance characteristics is degraded and the characteristic of the surface acoustic wave filter is compromised.

(C) Also, the surface acoustic wave filter of FIG. 40 suffers significant degradation in amplitude balance characteristic and phase balance characteristic in the passband with the value of amplitude balance characteristic being −1.2 dB to +1.0 dB and the value of phase balance characteristic being −8° to +10° as shown in FIGS. 41A to 41C. Furthermore, FIG. 41A shows the pass characteristic of the conventional 900 MHz band surface acoustic wave filter, FIG. 41B shows the amplitude balance characteristic in the passband (from 925 MHz to 960 MHz) of the conventional 900 MHz band surface acoustic wave filter, and FIG. 41C shows the phase balance characteristic in the passband of the conventional 900 MHz band surface acoustic wave filter.

Here, the amplitude balance characteristic means a difference between the signal amplitude between one of the balanced type terminals 4107 and the unbalanced type terminal 4109 and the signal amplitude between the other balanced type terminal 4108 and the unbalanced type terminal 4109, and if this value equals 0, the balance characteristic is never degraded. Also, the phase balance characteristic means a deviation from 180° of a difference between the phase of a signal between one of the balanced type terminals 4107 and the unbalanced type terminal 4109 and the phase of a signal between the other balanced type terminal 4108 and the unbalanced type terminal 4109, and if this value equals 0, the balance characteristic is never degraded.

In this way, the conventional surface acoustic wave filter (see FIG. 40) suffers degradation of the balance characteristic, one of important electric characteristics. Furthermore, detailed discussions have been rarely made regarding causes of this degradation.

SUMMARY OF THE INVENTION

The present invention has as its object provision of an surface acoustic wave filter having better filter characteristics, a balanced type filter, and a communication device in view of the above problems.

One aspect of the present invention is an surface acoustic wave filter comprising:

at least first to third IDT electrodes arranged substantially in the direction of propagation of surface acoustic waves, each constituted by a pair of opposing comb electrodes placed on a piezoelectric substrate, wherein of said first to third IDT electrodes, (1) said first IDT electrode with the other IDT electrodes located on its both sides has one of its comb electrodes connected to one of first balanced type terminals, and the other comb electrode connected to the other of said first balanced type terminals, (2) said second IDT electrode of the other IDT electrodes has a signal inputted to or outputted from one of its comb electrodes through a leading electrode, and (3) said third IDT electrode of the other IDT electrodes has a signal inputted to or outputted from, through a leading electrode, one of its comb electrodes located on the side opposite to the one comb electrode of said second IDT electrode.

Another aspect of the present invention is the surface acoustic wave filter, comprising:

a first reflector electrode located on the side of said second IDT electrode with respect to said first IDT electrode; and a second reflector electrode located on the side of said third IDT electrode with respect to said first IDT electrode, wherein said at least first to third IDT electrodes are placed between said first reflector electrode and said second reflector electrode, and said leading electrode for inputting a signal to or outputting a signal from the one comb electrode of said second IDT electrode and said leading electrode for inputting a signal to or outputting a signal from the one comb electrode of said third IDT electrode are connected to each other, and are connected to unbalanced type terminal.

Still another aspect of the present invention is the surface acoustic wave filter, wherein the other comb electrode of said second IDT electrode is grounded, and the other comb electrode of said third IDT electrode is grounded.

Yet still another aspect of the present invention is the surface acoustic wave filter, wherein said one comb electrode of said second IDT electrode is connected to one of second balanced type terminals, and said one comb electrode of said third IDT electrode is connected to said one of said second balanced type terminals.

Still yet another aspect of the present invention is the surface acoustic wave filter, wherein said first and second reflector electrodes are grounded, and the other electrode of said second IDT electrode is grounded by being connected to said first reflector electrode, and the other electrode of said third IDT electrode is grounded by being connected to said second reflector electrode.

A further aspect of the present invention is the surface acoustic wave filter, wherein said first and second reflector electrodes are connected to said unbalanced type terminal, and the one electrode of said second IDT electrode is connected to said unbalanced type terminal by being connected to said first reflector electrode, and the one electrode of said third IDT electrode is connected to said unbalanced type terminal by being connected to said second reflector electrode.

A still further aspect of the present invention is the surface acoustic wave filter, wherein said first reflector electrode and/or said second reflector electrode have divided into at least two segmented reflector electrodes.

A yet further aspect of the present invention is the surface acoustic wave filter, wherein the segmented reflector electrode adjacent to said second and/or third IDT electrode, of said at least two segmented reflector electrodes, is directly grounded or grounded through the other segmented reflector electrode.

A still yet further aspect of the present invention is the surface acoustic wave filter, wherein (1) said first reflector electrode is divided, the other electrode of said second IDT electrode is grounded by being connected to the grounded segmented reflector electrode of said segmented reflector electrodes constituting said first reflector electrode, and (2) said second reflector electrode is divided, the other electrode of said third IDT electrode is grounded by being connected to the grounded segmented reflector electrode of said segmented reflector electrodes constituting said second reflector electrode.

An additional aspect of the present invention is the surface acoustic wave filter, wherein (1) said first reflector electrode is divided, the one electrode of said second IDT electrode is connected to the non-grounded segmented reflector electrode of said segmented reflector electrodes constituting said first reflector electrode, and said segmented reflector electrode with the one electrode of the second IDT electrode connected thereto is connected to said unbalanced type terminal, and (2) said second reflector electrode is divided, the one electrode of said third IDT electrode is connected to the non-grounded segmented reflector electrode of said segmented reflector electrodes constituting said second reflector electrode, and said segmented reflector electrode with the one electrode of the third IDT electrode connected thereto is connected to said unbalanced type terminal.

A still additional aspect of the present invention is the surface acoustic wave filter, wherein (1) said first reflector electrode is divided into said at least two segmented reflector electrodes, at least two segmented reflector electrodes of the segmented reflector electrodes have mutually different pitches of electrode fingers, and (2) said second reflector electrode is divided into said at least two segmented reflector electrodes, at least two segmented reflector electrodes of the segmented reflector electrodes have mutually different pitches of electrode fingers.

A yet additional aspect of the present invention is the surface acoustic wave filter, wherein (1) said first reflector electrode is divided into said at least two segmented reflector electrodes, at least two segmented reflector electrodes of the segmented reflector electrodes have mutually different metallization ratios, and (2) said second reflector electrode is divided into said at least two segmented reflector electrodes, at least two segmented reflector electrodes of the segmented reflector electrodes have mutually different metallization ratios.

A still yet additional aspect of the present invention is the surface acoustic wave filter, wherein (1) said first reflector electrode is divided into said at least three segmented reflector electrodes, not all the intervals between two neighboring segmented reflector electrodes of said segmented reflector electrodes are equal, and (2) said second reflector electrode is divided into said at least three segmented reflector electrodes, not all the intervals between two neighboring segmented reflector electrodes of said segmented reflector electrodes are equal.

A supplementary aspect of the present invention is the surface acoustic wave filter, wherein said the segmented reflector electrodes is divided in the crossing direction to the direction in which said first to third IDT electrodes are arranged.

A still supplementary aspect of the present invention is the surface acoustic wave filter, wherein (1) said first reflector electrode is divided into said at least two segmented reflector electrodes, one electrode of said second IDT electrode is connected to said segmented reflector electrode constituting said first reflector electrode, and said segmented reflector electrode with the one electrode of the second IDT electrode connected thereto is connected to said unbalanced type terminal, and (2) said second reflector electrode is divided into said at least two segmented reflector electrodes, one electrode of said third IDT electrode is connected to said segmented reflector electrode constituting said second reflector electrode, and said segmented reflector electrode with the one electrode of the third IDT electrode connected thereto is connected to said unbalanced type terminal.

A yet supplementary aspect of the present invention is the surface acoustic wave filter, wherein (1) said first reflector electrode is divided into said at least two segmented reflector electrodes, the other electrode of said second IDT electrode is connected to said segmented reflector electrode constituting said first reflector electrode, and said segmented reflector electrode with the one electrode of the second IDT electrode connected thereto is grounded, and (2) said second reflector electrode is divided into said at least two segmented reflector electrodes, the other electrode of said third IDT electrode is connected to said segmented reflector electrode constituting said second reflector electrode, and said segmented reflector electrode with the one electrode of the third IDT electrode connected thereto is grounded.

A still yet supplementary aspect of the present invention is the surface acoustic wave filter, wherein (1) said first reflector electrode is divided into said at least two segmented reflector electrodes, the segmented reflector electrode adjacent to said second IDT electrode, of said segmented reflector electrodes constituting said first reflector electrode, is further divided into two or more laterally segmented reflector electrodes in the direction orthogonal to the direction in which said first to third IDT electrodes are arranged, and (2) said second reflector electrode is divided into said at least two segmented reflector electrodes, the segmented reflector electrode adjacent to said third IDT electrode, of said segmented reflector electrodes constituting said second reflector electrode, is further divided into two or more laterally segmented reflector electrodes in the direction orthogonal to the direction in which said first to third IDT electrodes are arranged.

Another aspect of the present invention is the surface acoustic wave filter, wherein (1) said first reflector electrode is divided into said at least two segmented reflector electrodes and the segmented reflector electrode adjacent to said second IDT electrode is further divided into said two or more lateral segmented reflector electrodes, some of the lateral segmented reflector electrodes are connected to said unbalanced type terminal, and (2) if said second reflector electrode is divided into said at least two segmented reflector electrodes, and the segmented reflector electrode adjacent to said third IDT electrode is further divided into said two or more lateral segmented reflector electrodes, some of the lateral segmented reflector electrodes are connected to said unbalanced type terminal.

Still another aspect of the present invention is the surface acoustic wave filter, wherein (1) said first reflector electrode is divided into said at least two segmented reflector electrodes, and the segmented reflector electrode adjacent to said second IDT electrode is further divided into said two or more lateral segmented reflector electrodes, some of the lateral segmented reflector electrodes are grounded, and (2) said second reflector electrode is divided into said at least two segmented reflector electrodes and the segmented reflector electrode adjacent to said third IDT electrode is further divided into said two or more lateral segmented reflector electrodes, some of the lateral segmented reflector electrodes are grounded.

Yet still another aspect of the present invention is the surface acoustic wave filter, wherein one or more surface acoustic wave resonators are connected to said imbalances type terminal in series and/or in parallel.

Still yet another aspect of the present invention is the surface acoustic way filter, the surface acoustic wave filter having a function to convert the unbalanced type into the balanced type or convert the balanced type into the unbalanced type.

A further aspect of the present invention is the surface acoustic wave filter, comprising:

a first filter track having (1) a fourth IDT electrode with other IDT electrodes located on its both sides, (2) a fifth IDT electrode of the other IDT electrodes having a signal inputted to or outputted from one of its comb electrodes through a leading electrode, and (3) a sixth IDT electrode of the other IDT electrodes located on the side opposite to said fifth IDT electrode having a signal inputted to or outputted from one of its comb electrodes through a leading electrode, the fourth to sixth IDT electrodes being arranged in the direction of propagation of said surface acoustic wave, each constituted by a pair of opposing comb electrodes placed on said piezoelectric substrate; and a second filter track having said first IDT electrode, said second IDT electrode and said third IDT electrode, wherein said first filter track and said second filter track are connected to each other in cascade, said leading electrode for inputting a signal to or outputting a signal from the one comb electrode of said second IDT electrode and said leading electrode for inputting a signal to or outputting a signal from the one comb electrode of said fifth IDT electrode are connected to each other, and said leading electrode for inputting a signal to or outputting a signal from the one comb electrode of said third IDT electrode and said leading electrode for inputting a signal to or outputting a signal from the one comb electrode of said sixth IDT electrode are connected to each other.

A still further aspect of the present invention is the surface acoustic wave filter, wherein the one comb electrode of said fifth IDT electrode is located on the side same as that of the one comb electrode of said sixth IDT electrode.

A yet further aspect of the present invention is the surface acoustic wave filter, wherein the one comb electrode of said fifth IDT electrode is located on the side opposite to the one comb electrode of said sixth IDT electrode.

A still yet further aspect of the present invention is the surface acoustic wave filter, wherein the one comb electrode of said fourth IDT electrode is connected to an unbalanced type terminal.

An additional aspect of the present invention is the surface acoustic wave filter, wherein the one comb electrode of said fourth IDT electrode is located opposite to said second filter track.

A still additional aspect of the present invention is the surface acoustic wave filter, wherein the other comb electrode of said second IDT electrode is grounded.

the other comb electrode of said third IDT electrode is grounded, the other comb electrode of said fifth IDT electrode is grounded, and the other comb electrode of said sixth IDT electrode is grounded.

A yet additional aspect of the present invention is the surface acoustic wave filter, wherein (1) the phase in which a signal is inputted to or outputted from the one comb electrode of said second IDT electrode is substantial opposite to (2) the phase in which a signal is inputted to or outputted from the one comb electrode of said third IDT electrode.

A still yet additional aspect of the present invention is the surface acoustic wave filter, wherein (1) the reactance component of wiring for connecting the leading electrode for inputting a signal to or outputting a signal from the one comb electrode of said second IDT electrode to the leading electrode for inputting a signal to or outputting a signal from the one comb electrode of said fifth IDT electrode is substantially equal to (2) the reactance component of wiring for connecting the leading electrode for inputting a signal to or outputting a signal from the one comb electrode of said third IDT electrode to the leading electrode for inputting a signal to or outputting a signal from the one comb electrode of said sixth IDT electrode.

A supplementary aspect of the present invention is the surface acoustic wave filter, wherein one comb electrode of said fourth EDT electrode is connected to one of second balanced type terminals, and the other comb electrode of said fourth IDT electrode is connected to the other of said second balanced type terminals.

Another aspect of the present invention is the surface acoustic wave filter comprising:

a first reflector electrode located on the side of said second IDT electrode with respect to said first IDT electrode;

a second reflector electrode located on the side of said third IDT electrode with respect to said first IDT electrode;

a third reflector electrode located on the side of said fifth IDT electrode with respect to said fourth IDT electrode; and a fourth reflector electrode located on the side of said sixth IDT electrode with respect to said fourth IDT electrode, wherein said at least first to third IDT electrodes are placed between said first reflector electrode and said second reflector electrode, and said at least fourth to sixth IDT electrodes are placed between said third reflector electrode and said fourth reflector electrode.

Still another aspect of the present invention is the surface acoustic wave flute wherein at least one of said first to sixth IDT electrodes is divided into a plurality of segmented IDT electrodes, all or part of the comb electrodes located on one side, of the comb electrodes of said plurality of segmented IDT electrodes, are electrically connected together, and all or part of the comb electrodes located on the other side, of the comb electrodes of said plurality of segmented IDT electrodes, is electrically connected together.

Yet still another aspect of the present invention is the surface acoustic wave filter, wherein at least one of said first to sixth IDT electrodes is divided into two or three segmented IDT electrodes.

Still yet another aspect of the present invention is the surface acoustic wave filter, wherein the central pitch of neighboring electrode fingers of a pair of said opposing comb electrodes has a value substantially in the range of from $0.9 \times \lambda/2$ to $1.1 \times \lambda/2$ with respect to the central frequency $\lambda$ of the surface acoustic wave filter.

A further aspect of the present invention is an surface acoustic wave filter, comprising:

a first IDT electrode constituted by a pair of opposing comb electrodes placed on a piezoelectric substrate, with one of the comb electrodes connected to one of first balanced type terminals; and a second IDT electrode constituted by a pair of opposing comb electrodes placed on said piezoelectric substrate, with one of the comb electrodes connected to one of second balanced type terminals or an unbalanced type terminal, wherein a reactance element is connected between the one comb electrode of said first IDT electrode and the one comb electrode of said second IDT electrode.

A still further aspect of the present invention is the surface acoustic wave filter, further comprising:

a third IDT electrode constituted by a pair of opposing comb electrodes placed on said piezoelectric substrate, with one of the comb electrodes connected to said unbalanced type terminal, wherein said first to third IDT electrodes are arranged substantially in the direction of propagation of the surface acoustic wave so that said second IDT electrode is located on the side opposite to said third IDT electrode with respect to said first IDT electrode, and the other comb electrode of said first IDT electrode is connected to the other of said first balanced type terminals.

A yet further aspect of the present invention is the surface accoustic wave filter, wherein a reactance element is connected between the one comb electrode of said first IDT electrode and the one comb electrode of said third IDT electrode.

A still yet further aspect of the present invention is the surface acoustic wave filter, wherein the one comb electrode of said second IDT electrode is located on the side opposite to the one comb electrode of said third IDT electrode with respect to the first to third IDT electrodes arranged substantially in the direction of propagation of said surface acoustic wave.

An additional aspect of the present invention is the surface acoustic wave filter, further comprising:

a third IDT electrode constituted by a pair of opposing comb electrodes placed on said piezoelectric substrate, with one of the comb electrodes connected to the other of said first balanced type terminals, wherein said first to third IDT electrodes are arranged substantially in the direction of propagation of the surface acoustic wave so that said first IDT electrode is located on the side opposite to said third IDT electrode with respect to said second IDT electrode.

A still additional aspect of the present invention is the surface accoustic wave filter, wherein a reactance element is connected between the one comb electrode of said first IDT electrode and the one comb electrode of said third IDT electrode.

A yet additional aspect of the present invention is the surface accoustic wave filter, comprising (1)a first surface accoustic wave resonator, having said first IDT electrode, and two reflector electrodes with said first IDT electrodes located therebetween, and (2) a second surface accoustic wave resonator, having said second IDT electrode, and two reflector electrodes with said second IDT electrodes located therebetween, wherein said first surface accoustic wave resonator and second surface accoustic wave resonator are connected in a ladder form.

A still yet additional aspect of the present invention is the surface acoustic wave filter, wherein a parallel resonance circuit with the resonance frequency set in the pass band is formed by parasitic components existing between said unbalanced type terminal and said balanced type terminal, and said reactance element.

A supplementary aspect of the present invention is the surface acoustic wave filter, wherein said reactance element is an inductance.

A still supplementary aspect of the present invention is the surface acoustic wave filter, wherein said piezoelectric substrate has an effective relative dielectric constant of 40 or greater.

A yet supplementary aspect of the present invention is the surface acoustic wave filter, wherein said piezoelectric substrate is made by using lithium tantalate or lithium niobate.

A still yet supplementary aspect of the present invention is a balanced type filter comprising an unbalanced type terminal and a balanced type terminal, wherein at least one predetermined reactance element is connected between said unbalanced type terminal and said at least one of balanced type terminals.

Another aspect of the present invention is the balanced type filter, wherein a parallel resonance circuit with the resonance frequency set in the pass band is formed by parasitic components existing between said unbalanced type terminal and said balanced type terminal, and said reactance element.

Still another aspect of the present invention is a communication device comprising:

transmission/reception means of performing transmission and/or reception; and the surface acoustic wave filter or the balanced type filter filtering a send signal to be used in said transmission and/or a receive signal to be used in said reception.

Yet still another aspect of the present invention is the surface accoustic wave filter, further comprising:

a third IDT electrode constituted by a pair of opposing comb electrodes placed on said piezoelectric substrate, with one of the comb electrodes connected to said unbalanced type terminal, wherein said first to third IDT electrodes are arranged substantially in the direction of propagation of the surface accoustic wave so that said second IDT electrode is located on the side opposite to said third IDT electrode with respect to said first IDT electrode, said one of the comb electrodes of said first IDT electrode is divided into a first divided comb electrode and a second divided comb electrode, said first divided comb electrode is connected to the one of said first balanced type terminals, and said second divided comb electrode is connected to the other of said first balanced type terminals.

DESCRIPTION OF SYMBOLS

Figure 1:
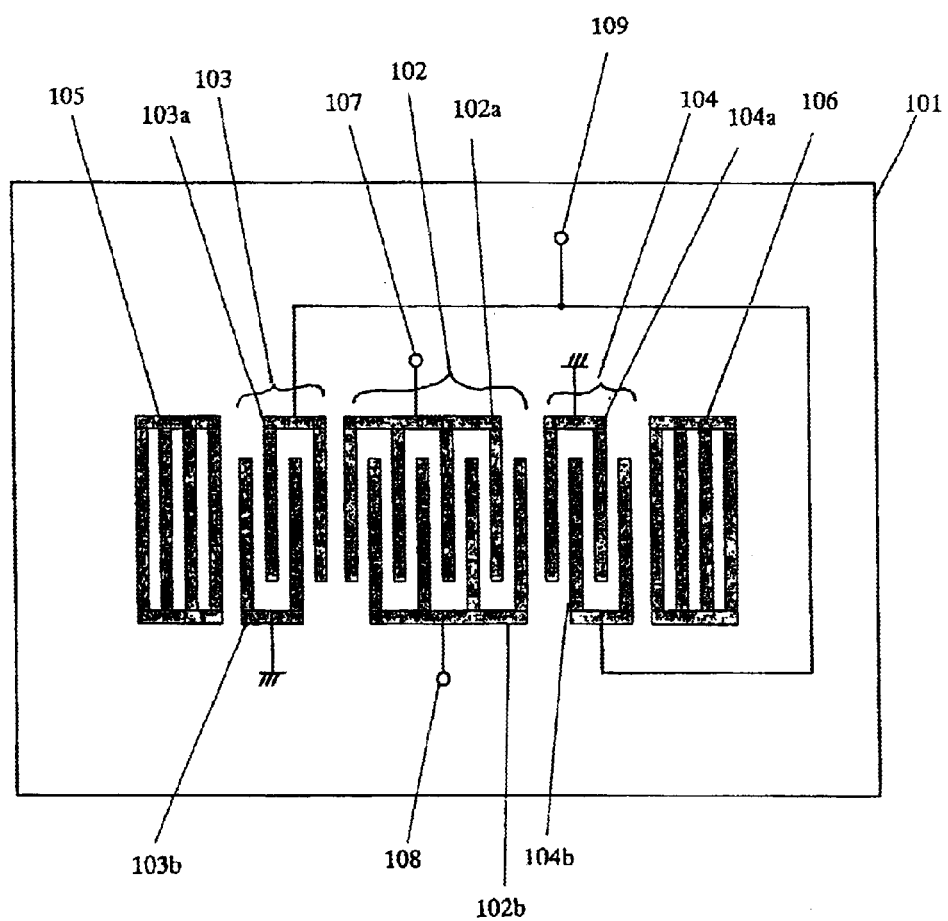
FIG. 1 is a block diagram of an surface acoustic wave filter in Embodiment 1 of the present invention.

101 Piezoelectric substrate
102 First IDT Electrode
102a Upper Electrode of First IDT Electrode
102b Lower Electrode of First IDT Electrode
103 Second IDT Electrode
103a Upper Electrode of Second IDT Electrode
103b Lower Electrode of Second IDT Electrode
104 Third IDT Electrode
104a Upper Electrode of Third IDT Electrode
104b Lower Electrode of Third IDT Electrode
105 First Reflector Electrode
106 Second Reflector Electrode
107 One of Balanced Type Terminals
108 Other Balanced Type Terminal
109 Unbalanced Type Terminal

PREFERRED EMBODIMENTS OF THE INVENTION

The embodiments of the present invention will be described below referring to the drawings.

(Embodiment 1)

An surface acoustic wave filter of Embodiment 1 of the present invention will be described below referring to the drawings. Furthermore, FIG. 1 is a schematic diagram of the surface acoustic wave filter in Embodiment 1.

Furthermore, a first IDT electrode 102 corresponds to the first IDT electrode of the present invention, a second IDT electrode 103 corresponds to the second IDT electrode of the present invention, and a third IDT electrode 104 corresponds to the third IDT electrode of the present invention. Also, a first reflector electrode 105 corresponds to the first reflector electrode of the present invention, and a second reflector electrode 106 corresponds to the second reflector electrode of the present invention. Also, one of balanced type terminals 107 corresponds to the one of the first balanced type terminals of the present invention, the other balanced type terminal 108 corresponds to the other of first balanced type terminals of the present invention, and an unbalanced type terminal 109 corresponds to the unbalanced type terminal of the present invention.

In FIG. 1, reference numeral 101 denotes a piezoelectric substrate, and the surface acoustic wave can be excited by forming on this piezoelectric substrate 101 electrode patterns crossing in such a manner as to create periodic structured strip lines. A longitudinal mode type surface acoustic wave filter comprising the first IDT electrode 102, the second and third IDT electrodes 103 and 104, and the first and second reflector electrodes 105 and 106 is formed on the piezoelectric substrate 101.

In the above surface acoustic wave filter, an upper electrode 102a of the first IDT electrode 102 is connected to one of the balanced type terminals 107 and a lower electrode 102b of the first IDT electrode 102 is connected to the other balanced type terminal 108. Also, an upper electrode 103a of the second IDT electrode 103 is connected to the unbalanced type terminal 109 and a lower electrode 103b is grounded. A lower electrode 104b of the third IDT electrode 104 is connected to the unbalanced type terminal 109 and an upper electrode 104a is grounded.

In this way, the above surface acoustic wave filter is configured to have unbalanced-balanced type terminals and the signal path from the unbalanced type terminal 109 is connected upside down from a structural viewpoint. Also, the upper electrode 102a and the lower electrode 102b of the first IDT electrode 102 have same numbers of electrode fingers.

The above configuration makes it possible to prevent degradation of balance characteristics caused by the unbalanced spatial bonding between leading electrodes from the second and third IDT electrodes 103 and 104 both connected to the unbalanced type terminal 109 and a leading electrode from the first IDT electrode 102 connected to the balanced type terminal 107 and 108 to obtain an surface acoustic wave filter having satisfactory balance characteristics.

That is, the signal path from the unbalanced type terminal 109 is connected upside down from a structural viewpoint, whereby the spatial bonding between the leading electrodes from the second IDT electrode 103 and the third IDT electrode 104 and the leading electrode from the first IDT electrode 102 connected to the balanced type terminal 107 is substantially identical to the spatial bonding between the leading electrodes from the second IDT electrode 103 and the third IDT electrode 104 and the leading electrode from the first IDT electrode 102 connected to the balanced type terminal 108. Thus, degradation of balance characteristics can be prevented.

Also, the arrangement of electrode fingers in the second and third IDT electrodes 103 and 104 is such that surface acoustic waves do not balance each other out. That is, given that the upper electrode 103a of the second IDT electrode 103 and the lower electrode 104b of the third IDT electrode 104 both connected to the unbalanced type terminal 109 are positive (+), and the electrodes grounded are negative (−), an in-phase arrangement is provided as shown in FIG. 2A.

Figure 2:
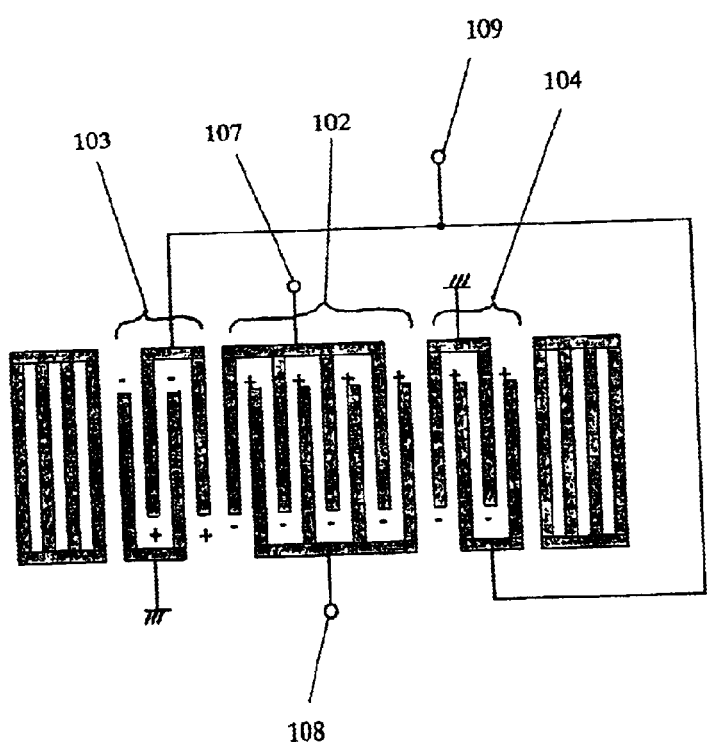
FIG. 2A is a schematic layout of electrode fingers of the surface acoustic wave filter in Embodiment 1 of the present invention.
FIG. 2B is a schematic layout of electrode fingers of another surface acoustic wave filter in Embodiment 1 of the present invention.
Figure 2:
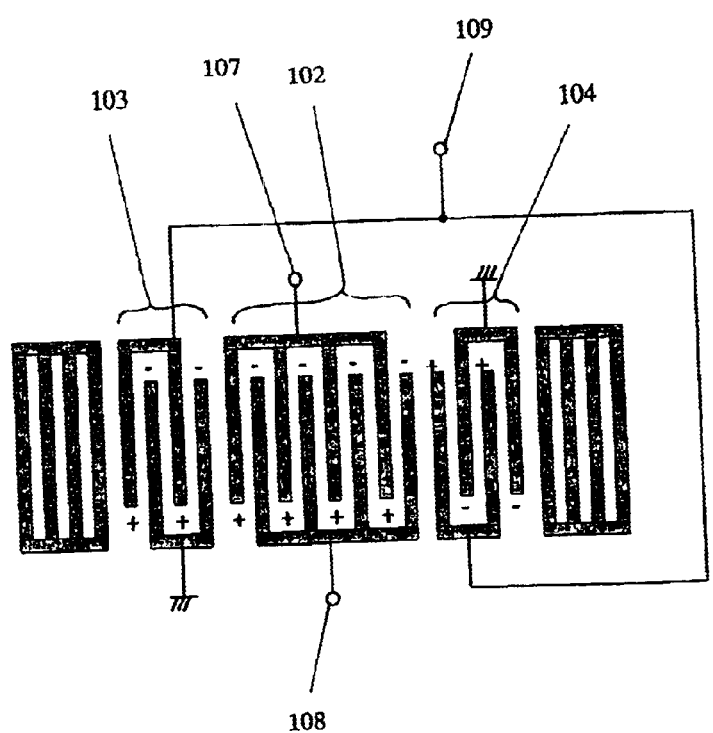

Furthermore, even the configuration shown in FIG. 2B does not influence the effect of the present invention. FIG. 2B shows the configuration in which the upper electrode of the second IDT electrode 103 and the lower electrode of the third IDT electrode 104 are shifted by one electrode finger, respectively. In this case, only the first IDT electrode 102 has just an opposite polarity, and thus the effect by the embodiment of the present invention is unchanged.

Also, the upper electrode 103a of the second IDT electrode 103 and the lower electrode 104b of the third IDT electrode 104 are connected to the unbalanced type terminal 109, but instead thereof, the lower electrode 103b of the second IDT electrode 103 and the upper electrode 104a of the third IDT electrode 104 may be connected to the unbalanced type terminal 109. That is, if the signal paths are connected to the second and third IDT electrodes 103 and 104 upside down from a structural viewpoint, an effect similar to that of the embodiment of the present invention can be achieved.

(Embodiment 2)

The surface acoustic wave filter of Embodiment 2 of the present invention will now be described referring to the drawings. Furthermore, FIG. 3 is a schematic diagram of the surface acoustic wave filter in Embodiment 2.

The surface acoustic wave filter of the present invention is characterized in that the unbalanced type terminal 309 is connected to the input terminal IN with a first surface acoustic wave resonator 310 connected in series therebetween, and a second surface acoustic wave resonator 311 is connected in parallel between the first surface acoustic wave resonator 310 and the unbalanced type terminal 309.

Furthermore, a first IDT electrode 302 corresponds to the first IDT electrode of the present invention, a second IDT electrode 303 corresponds to the second IDT electrode of the present invention, and a third IDT electrode 304 corresponds to the third IDT electrode of the present invention. Also, a first reflector electrode 305 corresponds to the first reflector electrode of the present invention, and a second reflector electrode 306 corresponds to the second reflector electrode of the present invention. Also, one of balanced type terminals 307 corresponds to one of the first balanced type terminals of the present invention, the other balanced type terminal 308 corresponds to the other of balanced type terminals of the present invention, and an unbalanced type terminal 309 corresponds to the unbalanced type terminal of the present invention.

Figure 3:
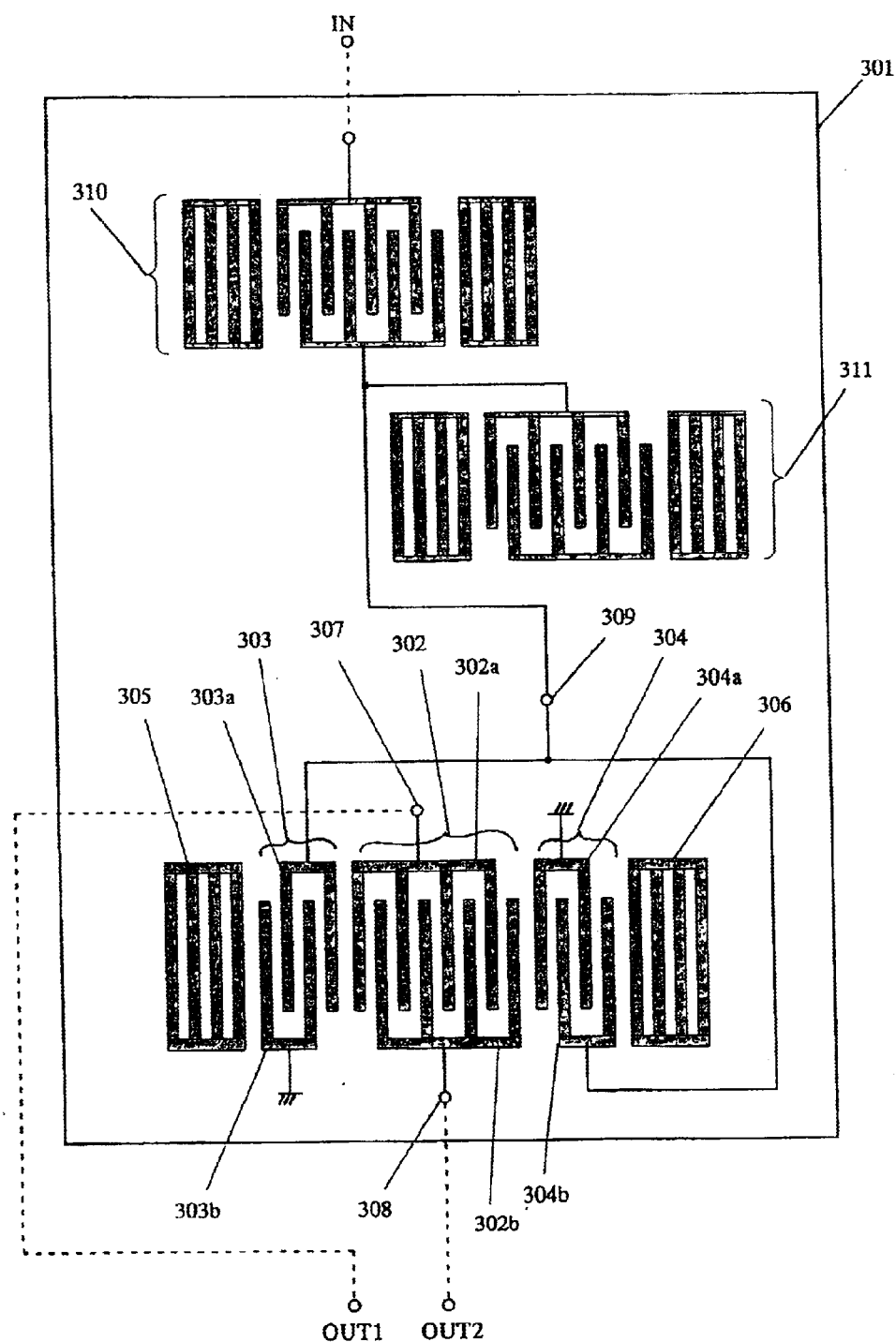
FIG. 3 is a block diagram of the surface acoustic wave filter in Embodiment 2 of the present invention.

In FIG. 3, reference numeral 301 denotes a piezoelectric substrate, and the surface acoustic wave can be excited by forming on this piezoelectric substrate 301 electrode patterns crossing in such a manner as to create periodic structured strip lines. A longitudinal mode type surface acoustic wave filter comprising the first IDT electrode 302, the second and third IDT electrodes 303 and 304, and the first and second reflector electrodes 305 and 306 is formed on the piezoelectric substrate 301.

In the above surface acoustic wave filter, an upper electrode 302a of the first IDT electrode 302 is connected to one of the balanced type terminals 307 and a lower electrode 302b of the first IDT electrode 302 is connected to the other balanced type terminal 308. Also, an upper electrode 303a of the second IDT electrode 303 is connected to the unbalanced type terminal 309 and a lower electrode 303b is grounded. A lower electrode 304b of the third IDT electrode 304 is connected to the unbalanced type terminal 309 and an upper electrode 303a is grounded. In this way, the above surface acoustic wave filter is configured to have unbalanced-balanced type terminals and the signal path from the unbalanced type terminal 309 is connected upside down from a structural viewpoint. Also, the upper electrode 302a and the lower electrode 302b of the first IDT electrode 302 have same numbers of electrode fingers.

In addition, the unbalanced type terminal 309 is connected to the input terminal IN with the first surface acoustic wave resonator 310 connected in series therebetween, the second surface acoustic wave resonator 311 is connected in parallel between the first surface acoustic wave resonator 310 and the unbalanced type terminal 309 and one end of the surface acoustic wave resonator 311 is grounded. The first surface acoustic wave resonator 310 and the second surface acoustic wave resonator 311 are inserted for forming an attenuation pole. Also, the balanced type terminals 307 and 308 are connected to the output terminals OUT1 and OUT2, respectively. Furthermore, connections to the terminals IN, OUT1 and OUT2 are provided in such a manner as to lead to terminals outside the piezoelectric substrate by wire bonding implementation, face down implementation or the like.

Balance characteristics in the surface acoustic wave filter of this embodiment will now be described using FIGS. 4A and 4B.

Furthermore, shown in FIG. 4A is the characteristic when a conventional configuration for comparison (i.e. the conventional configuration shown in FIG. 12 as the connection of the second and third IDT electrodes connected to the unbalanced type terminal) is used. That is, FIG. 4A shows differences in amplitude and phase between the signal from the unbalanced type terminal 1009 to the balanced type terminal 1007 and the signal from the unbalanced type terminal 1009 to the balanced type terminal 1008 for the surface acoustic wave filter of FIG. 12. Furthermore, assuming that an ideal state is provided in which the surface acoustic wave filter is completely balanced, there is a phase difference of 180° between the signal from the unbalanced type terminal 1009 to the balanced type terminal 1007 and the signal from the unbalanced type terminal 1009 to the balanced type terminal 1008. The phase difference of FIG. 4A represents plotted deviations from this ideal state.

Figure 4:
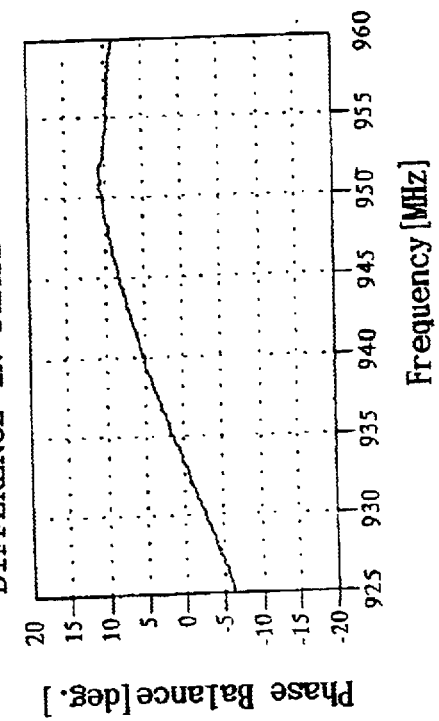
FIG. 4A is an illustrative view for explaining the characteristics of the conventional surface acoustic wave filter.
FIG. 4B is an illustrative view for explaining the characteristics of the surface acoustic wave filter in Embodiment 2 of the present invention.
Figure 4:
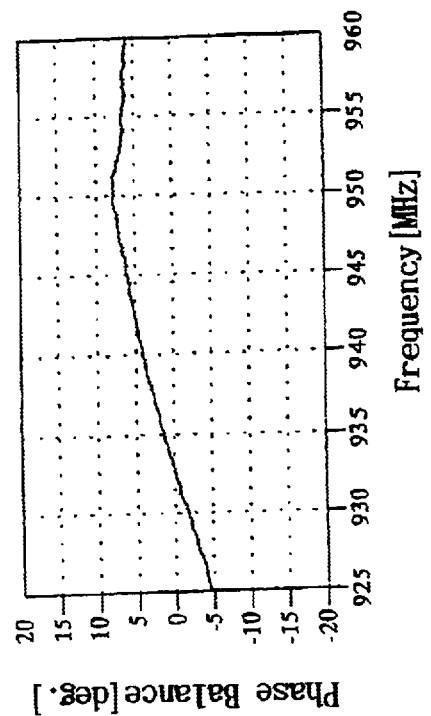
Figure 4:
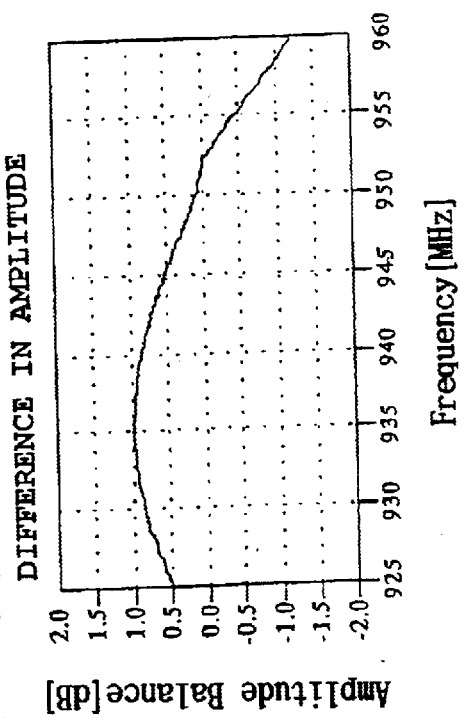
Figure 4:
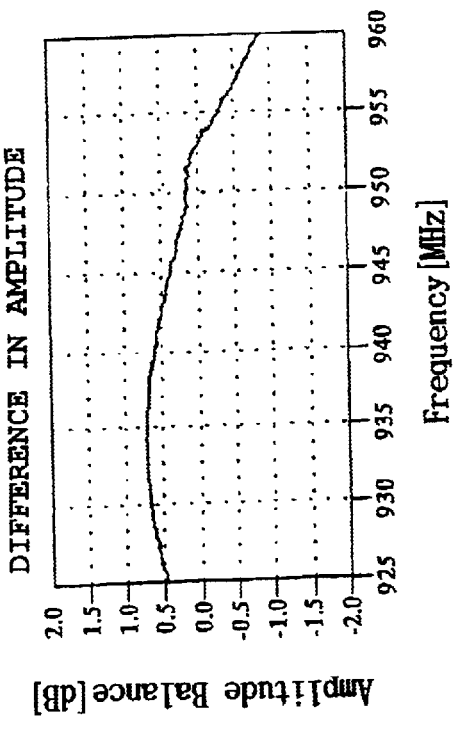

Then, shown in FIG. 4B is the balance characteristic of the 900 MHz band surface acoustic wave filter in this embodiment. FIG. 4 shows differences in amplitude and phase between the signal from the terminal IN to the terminal OUT1 and the signal from the terminal IN to the terminal OUT2. Furthermore, if an ideal state is provided in which the surface acoustic wave filter of FIG. 3 is completed balanced, there is a phase difference of 180° between the signal from the terminal IN to the terminal OUT1 and the signal from the terminal IN to the terminal OUT2. The phase difference of FIG. 4B represents plotted deviations from this ideal state.

As apparent from FIGS. 4A and 4B, the balance characteristic of the surface acoustic wave filter in this embodiment is improved in both amplitude and phase differences compared to the conventional surface acoustic wave filter. In the range of from 925 MHz to 960 MHz, there is an amplitude difference of 2.2 dB (between −1.2 dB and +1.0 dB) for the conventional configuration, while for the configuration of the present invention, there is an amplitude difference of 1.5 dB (between −0.8 dB and +0.7 dB), which represents an improvement by 0.7 dB compared to the conventional configuration. Also, with respect to the phase difference, there is a difference of 19° (between −7° and +12°) for the conventional configuration, while for the configuration of the present invention, there is a difference of 13° (between −5° and +8°), which represents an improvement by 6° compared to the conventional configuration.

As described above, it is made possible to prevent spatial unbalance between the leading electrode for the second and third IDT electrodes connected to the unbalanced type terminal and the leading electrode for the first IDT electrode connected to the balanced type terminal, resulting in an surface acoustic wave filter having satisfactory balance characteristics.

Furthermore, in this embodiment, the unbalanced type terminal is an input terminal and the balanced type terminal is an output terminal, but this may be reversed.

Also, in this embodiment, the configuration has been described in which the unbalanced type terminal 309 is connected to the input terminal IN with the first surface acoustic wave resonator 310 connected in series therebetween, and the second surface acoustic wave resonator 311 is connected in parallel between the first surface acoustic wave resonator 310 and the unbalanced type terminal 309, but other configurations are also possible. Anyone of the first surface acoustic wave resonator 310 and the second surface acoustic wave resonator 311 may be eliminated. Also, the unbalanced type terminal 309 may be connected to the input terminal IN with two or more surface acoustic wave resonators connected in series therebetween. In addition, two or more surface acoustic wave resonators may be connected in parallel to these two or more surface acoustic wave resonators. In short, any number of surface acoustic wave resonators may be inserted in series and/or in parallel between the unbalanced type terminal 309 and the terminal IN as long as appropriate characteristics can be obtained as an surface acoustic wave filter.

(Embodiment 3)

The surface acoustic wave filter of Embodiment 3 of the present invention will be described below referring to the drawings. Furthermore, FIG. 5 is a schematic diagram of the surface acoustic wave filter in Embodiment 3.

Furthermore, a first IDT electrode 502 corresponds to the first IDT electrode of the present invention, a second IDT electrode 503 corresponds to the second IDT electrode of the present invention, and a third IDT electrode 504 corresponds to the third IDT electrode of the present invention Also, a first reflector electrode 505 corresponds to the first reflector electrode of the present invention and a second reflector electrode 506 corresponds to the second reflector electrode of the present invention. Also, one of balanced type terminals 507 corresponds to one of the first balanced type terminals of the present invention, the other balanced type terminal 508 corresponds to the other of the first balanced type terminals of the present invention and an unbalanced type terminal 509 corresponds to the unbalanced type terminal.

Figure 5:
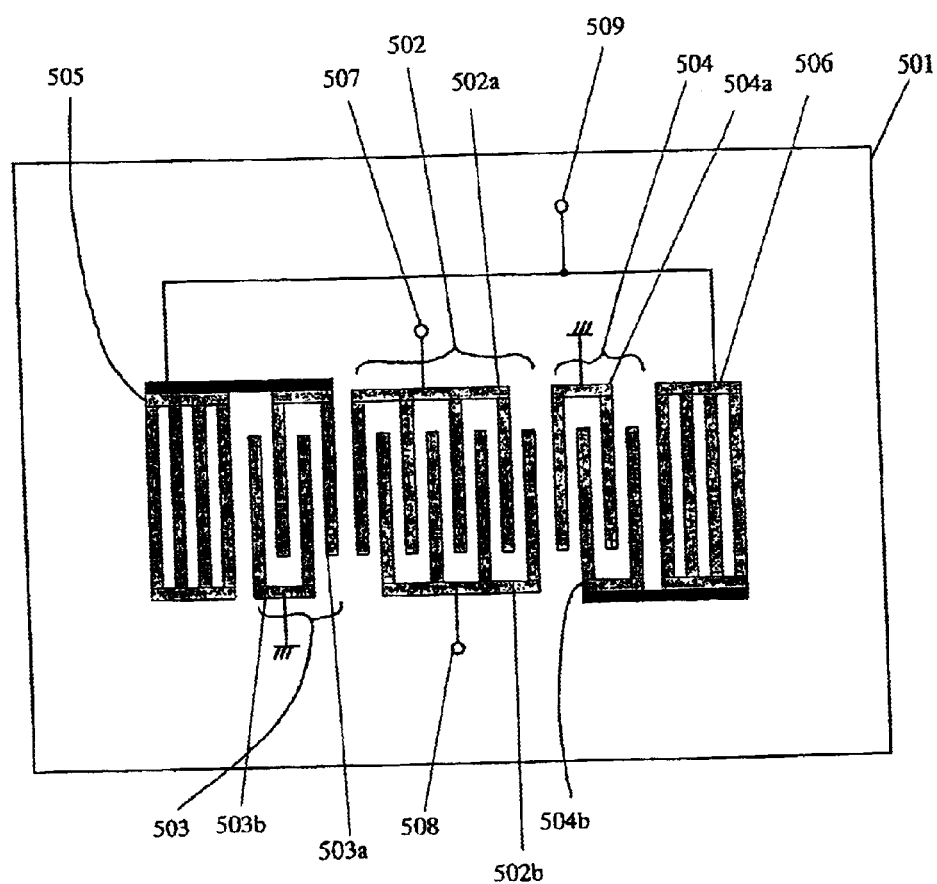
FIG. 5 is a block diagram of the surface acoustic wave filter in Embodiment 3 of the present invention.

In FIG. 5, reference numeral 501 denotes a piezoelectric substrate, and the surface acoustic wave can be excited by forming on this piezoelectric substrate 501 electrode patterns crossing in such a manner as to create periodic structured strip lines. A longitudinal mode type surface acoustic wave filter comprising the first IDT electrode 502, the second and third IDT electrodes 503 and 504, and the first and second reflector electrodes 505 and 506 is formed on the piezoelectric substrate 501.

In the above surface acoustic wave filter, an upper electrode 502a of the first IDT electrode 502 is connected to one of the balanced type terminals 507 and a lower electrode 502b of the first IDT electrode 502 is connected to the other balanced type terminal 508. Also, an upper electrode 503a of the second IDT electrode 503 is connected to the unbalanced type terminal 509 through the first reflector electrode 505 and a lower electrode 503b is grounded. A lower electrode 504b of the third IDT electrode 504 is connected to the unbalanced type terminal 509 through the second reflector electrode 506 and an upper electrode 503a is grounded.

In this way, the above surface acoustic wave filter is configured to have unbalanced-balanced type terminals, and the signal path from the unbalanced type terminal 509 is connected upside down from a structural viewpoint. Also, the upper electrode 502a and the lower electrode 502b of the first IDT electrode 502 have same numbers of electrode fingers.

The above configuration makes it possible to improve balance characteristics compared to the conventional configuration. In the range of from 925 MHz to 960 MHz, there is an amplitude difference of 2.2 dB (between −1.2 dB and +1.0 dB) for the conventional configuration, while for the configuration of the present invention, there is an amplitude difference of 1.8 dB (between −1.0 dB and +0.8 dB), which represents an improvement by 0.4 dB compared to the conventional configuration. Also, with respect to the phase difference, there is a difference of 19° (between −7° and +12°) for the conventional configuration, while for the configuration of the present invention, there is a difference of 16° (between −6° and +10°), which represents an improvement by 3° compared to the conventional configuration. Furthermore, the definition for the phase difference is similar to that of Embodiment 2.

In the configuration of the surface acoustic wave filter of this embodiment, the wiring to signal paths to the second and third IDT electrodes can be reduced, thus making it possible to curb more significantly resistance by the wiring and degradation of characteristics by inductance components, and increase the degree of freedom for the arrangements of electrodes and terminals on the plate.

(Embodiment 4)

The surface acoustic wave filter of Embodiment 4 of the present invention will be described below referring to the drawings. Furthermore, FIG. 6 is a schematic diagram of the surface acoustic wave filter in Embodiment 4.

Furthermore, a first IDT electrode 602 corresponds to the first IDT electrode of the present invention, a second IDT electrode 603 corresponds to the second IDT electrode of the present invention and a third IDT electrode 604 corresponds to the third IDT electrode of the present invention. Also, a first reflector electrode 605 corresponds to the first reflector electrode of the present invention and a second reflector electrode 606 corresponds to the second reflector electrode of the present invention. Also, one of balanced type terminals 607 corresponds to one of the first balanced type terminals of the present invention, the other balanced type terminal 608 corresponds to the other of the first balanced type terminals of the present invention, and an unbalanced type terminal 609 corresponds to the unbalanced type terminal of the present invention.

Figure 6:
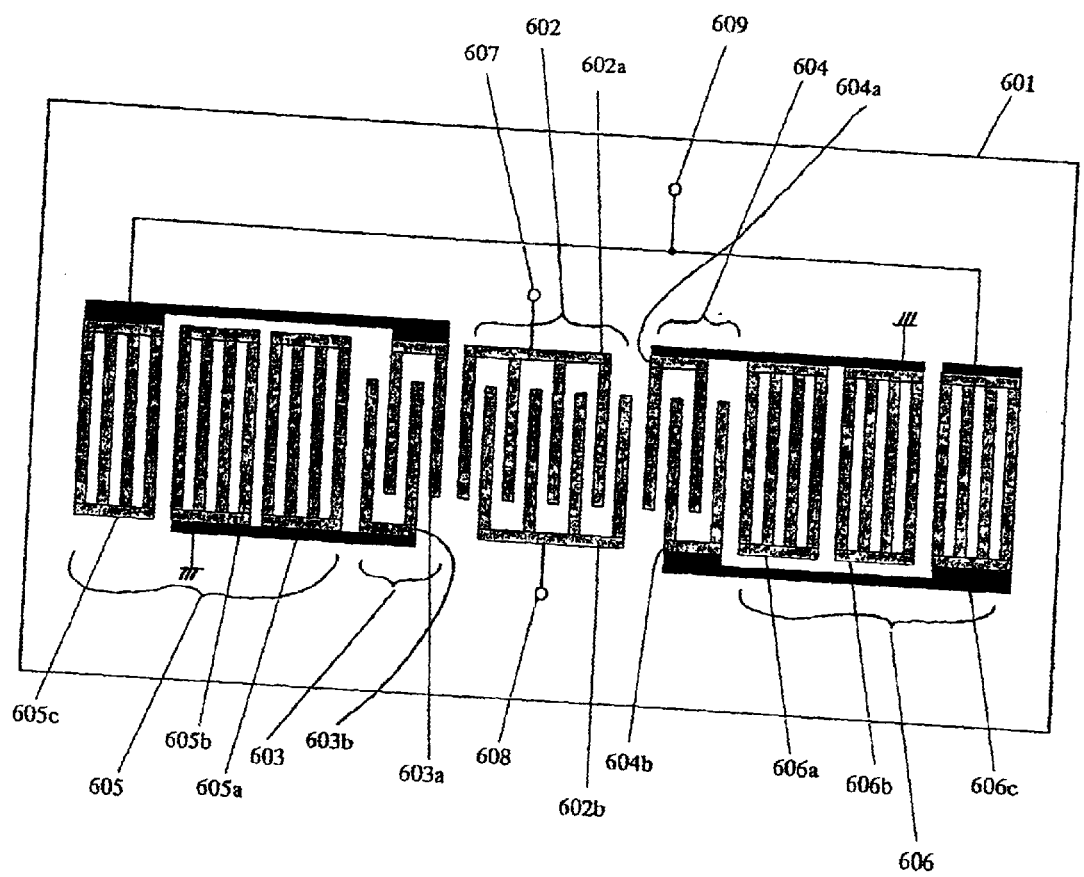
FIG. 6 is a block diagram of the surface acoustic wave filter in Embodiment 4 of the present invention.

In FIG. 6, reference numeral 601 denotes a piezoelectric substrate, and the surface acoustic wave can be excited by forming on this piezoelectric substrate 601 electrode patterns crossing in such a manner as to create periodic structured strip lines. A longitudinal mode type surface acoustic wave filter comprising the first IDT electrode 602, the second and third IDT electrodes 603 and 604, and the first and second reflector electrodes 605 and 606 is formed on the piezoelectric substrate 601. Also, the first reflector electrode 605 is constituted by first, second and third segmented reflector electrodes 605a, 605b and 605c, and the second reflector electrode 606 is constituted by fourth, fifth and sixth segmented reflector electrodes 606a, 606b and 606c.

In the above surface acoustic wave filter, an upper electrode 602a of the first IDT electrode 602 is connected to one of the balanced type terminals 607 and a lower electrode 602b of the first IDT electrode 602 is connected to the other balanced type terminal 608. Also, an upper electrode 603a of the second IDT electrode 603 is connected to the unbalanced type terminal 609 through the third segmented reflector electrode 605c and the lower electrode 603b and the first and second segmented reflector electrodes 605a and 605b are grounded. The lower electrode 604b of the third IDT electrode 604 is connected to the unbalanced type terminal 609 through the sixth segmented reflector electrode 606c and the upper electrode 603a and the fourth and fifth segmented reflector electrodes 606a and 606b are grounded.

In this way, the above surface acoustic wave filter is configured to have unbalanced-balanced type terminals, and the signal path from the unbalanced type terminal 609 is connected upside down from a structural viewpoint. Also, the upper electrode 602a and the lower electrode 602b of the first IDT electrode 602 have same numbers of electrode fingers.

The above configuration makes it possible to improve balance characteristics compared to the conventional configuration. In the range of from 925 MHz to 960 MHz, there is an amplitude difference of 2.2 dB (between −1.2 dB and +1.0 dB) for the conventional configuration, while for the configuration of the present invention, there is an amplitude difference of 1.7 dB (between −1.0 dB and +0.7 dB), which represents an improvement by 0.5 dB compared to the conventional configuration. Also, with respect to the phase difference, there is a difference of 19° (between −7 and +12°) for the conventional configuration, while for the configuration of the present invention, there is a difference of 13° (between −5° and +8°), which represents an improvement by 6° compared to the conventional configuration. Furthermore, the definition for the phase difference in this embodiment is similar to that of the above described embodiment.

Furthermore, in this configuration, the first, second, fourth and fifth segmented reflector electrodes are grounded between the second and third IDT electrodes 603 and 604 and the third and sixth segmented reflector electrodes used as signal paths, and therefore spatial bonding to the IDT electrodes from the signal paths can further be reduced to obtain still better characteristics than those in Embodiment 3. Also, the wiring to signal paths to the second and third IDT electrodes can be reduced, thus making it possible to curb more significantly resistance by the wiring and degradation of characteristics by inductance components, and increase the degree of freedom for the arrangements of electrodes and terminals on the plate.

Also, in this configuration, the lower electrode 602b and the first segmented reflector electrode 605a, and the upper electrode 603a and the fourth segmented reflector electrode 606a are grounded together, therefore earth terminals can be lead, thus making it possible to further increase the degree of freedom for the arrangements of electrodes on the plate.

Furthermore, the first and fourth segmented reflector electrodes are grounded, but a configuration in which they are not grounded may also be adopted.

Also, the third and sixth segmented reflector electrodes are used as signal paths, but instead thereof, the second, third, fifth and sixth segmented reflector electrodes may be used as signal paths. If the segmented reflector electrodes adjacent to the second and third IDT electrodes are grounded or separated from the signal paths, spatial bonding can be prevented to achieve the same effect of the present invention.

Figure 7:
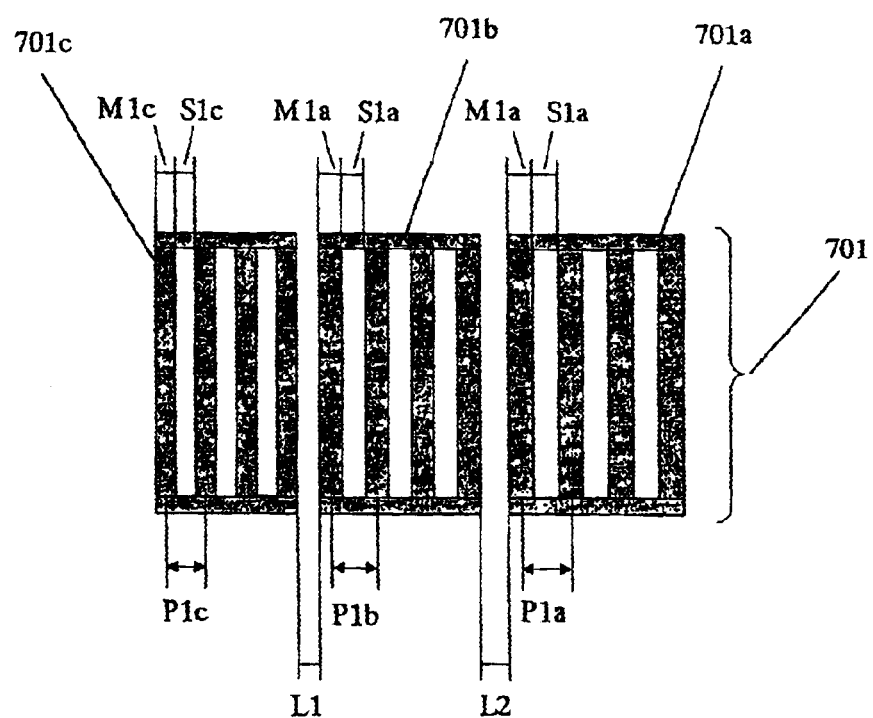
FIG. 7 is a block diagram of a reflector electrode in Embodiment 4 of the present invention.

Also, with respect to the segmented reflector electrode, the first, second and third segmented reflector electrodes 605a, 605b and 605c may have configurations similar to those of first, second and third segmented reflector electrodes 701a, 701b and 701c as shown in FIG. 7. In FIG. 7, the first, second and third segmented reflector electrodes 701a, 701b and 701c may have different pitches of electrode fingers P1a, P1b and P1c, and different metallization ratios $\eta 1a = M1a/S1a$, $\eta 1b = M1b/S1b$ and $\eta 1c = M1c/S1c$, which are ratios of electrode areas M1a, M1b and M1c to free surface plate areas S1a, S1b and S1c, respectively.

Also, an interval L1 between the first segmented reflector electrode 701a and the second segmented reflector electrode 701b may be different from an interval L2 between the second segmented reflector electrode 701b and the third segmented reflector electrode 701c. In this case, by differentiating spurious frequencies of reflection characteristics of the segmented reflector electrodes, the out-of-band attenuation can be improved.

Furthermore, the first, second and third segmented reflector electrodes have been described, but this configuration may be applied not only to the first, second and third segmented reflectors 605a, 605b and 605c but also to the fourth, fifth and sixth segmented reflector electrodes 606a, 606b and 606c.

The above configuration makes it possible to achieve an surface acoustic wave filter excellent in out-of-band attenuation having good balance characteristics.

(Embodiment 5)

The surface acoustic wave filter of Embodiment 5 of the present invention will be described below referring to the drawings. Furthermore, FIG. 8 is a schematic diagram of the surface acoustic wave filter in Embodiment 5.

Furthermore, a first IDT electrode 802 corresponds to the first IDT electrode of the present invention, a second IDT electrode 803 corresponds to the second IDT electrode of the present invention and a third IDT electrode 804 corresponds to the third IDT electrode of the present invention. Also, a first reflector electrode 805 corresponds to the first reflector electrode of the present invention and a second reflector electrode 806 corresponds to the second reflector electrode of the present invention. Also, one of balanced type terminals 807 corresponds to one of the first balanced type terminals of the present invention, the other balanced type terminal 808 corresponds to the other of the first balanced type terminals of the present invention and an unbalanced type terminal 809 corresponds to the unbalanced type terminal of the present invention.

Figure 8:
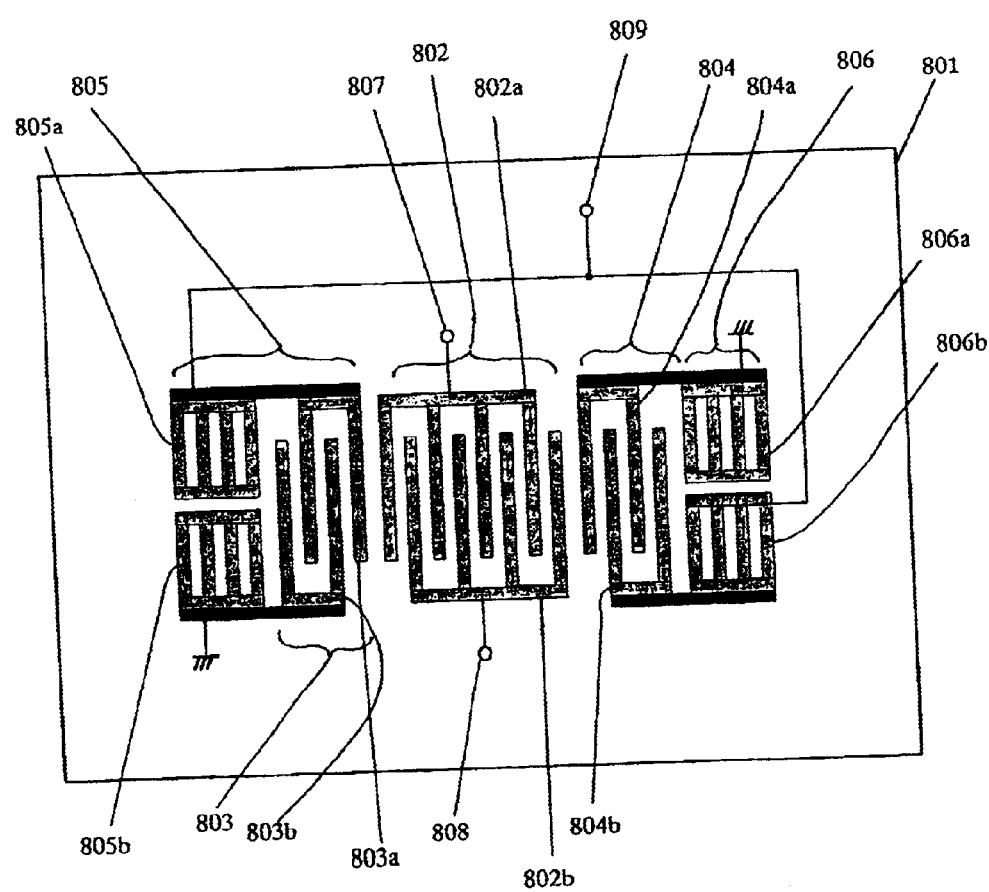
FIG. 8 is a block diagram of the surface acoustic wave filter in Embodiment 5 of the present invention.

In FIG. 8, reference numeral 801 denotes a piezoelectric substrate, and the surface acoustic wave can be excited by forming on this piezoelectric substrate 801 electrode patterns crossing in such a manner as to create periodic structured strip lines.

A longitudinal mode type surface acoustic wave filter comprising the first IDT electrode 802, the second and third IDT electrodes 803 and 804, and the first and second reflector electrodes 805 and 806 is formed on the piezoelectric substrate 801.

Also, the first reflector electrode 805 is laterally divided and constituted by a first upper reflector electrode 805a and a first lower reflector electrode 805b, and the second reflector electrode 806 is constituted by a second upper reflector electrode 806a and a second lower reflector electrode 806b.

Also, in the above surface acoustic wave filter, an upper electrode 802a of the first IDT electrode 802 is connected to one of the balanced type terminals 807 and a lower electrode 802b of the first IDT electrode 802 is connected to the other balanced type terminal 808. An upper electrode 803a of the second IDT electrode 803 is connected to the unbalanced type terminal 809 through the first upper reflector electrode 805a and the lower electrode 803b and the first lower reflector electrode 805b are grounded. The lower electrode 804b of the third IDT electrode 804 is connected to the unbalanced type terminal 809 through the second lower reflector electrode 806b and the upper electrode 803a and the second upper reflector electrode 806a are grounded.

In this way, the above surface acoustic wave filter is configured to have unbalanced-balanced type terminals, and the signal path from the unbalanced type terminal 809 is connected upside down from a structural viewpoint. Also, the upper electrode 802a and the lower electrode 802b of the first IDT electrode 802 have same numbers of electrode fingers.

The above configuration makes it possible to improve balance characteristics compared to the conventional configuration. In the range of from 925 MHz to 960 MHz, there is an amplitude difference of 2.2 dB (between −1.2 dB and +1.0 dB) for the conventional configuration, while for the configuration of the present invention, there is an amplitude difference of 1.7 dB (between −1.0 dB and +0.7 dB), which represents an improvement by 0.5 dB compared to the conventional configuration. Also, with respect to the phase difference, there is a difference of 19° (between −7° and +12°) for the conventional configuration, while for the configuration of the present invention, there is a difference of 13° (between −5° and +8°), which represents an improvement by 6° compared to the conventional configuration. Furthermore, the definition for the phase difference in this embodiment is similar to that of Embodiment 2.

In this configuration, connections are provided through the first upper reflector electrode 805a and the second lower reflector electrode 806b, and therefore the wiring to signal paths to the second and third IDT electrodes can be reduced, thus making it possible to decrease more significantly resistance by the wiring and degradation of characteristics by inductance components, and increase the degree of freedom for the arrangements of electrodes and terminals on the plate.

Also, in this configuration, the lower electrode 802b and the first lower reflector electrode 805b, and the upper electrode 803a and the second upper reflector electrode 806a are grounded together, therefore earth terminals can be lead, thus making it possible to further increase the degree of freedom for the arrangements of electrodes on the plate.

Figure 9:
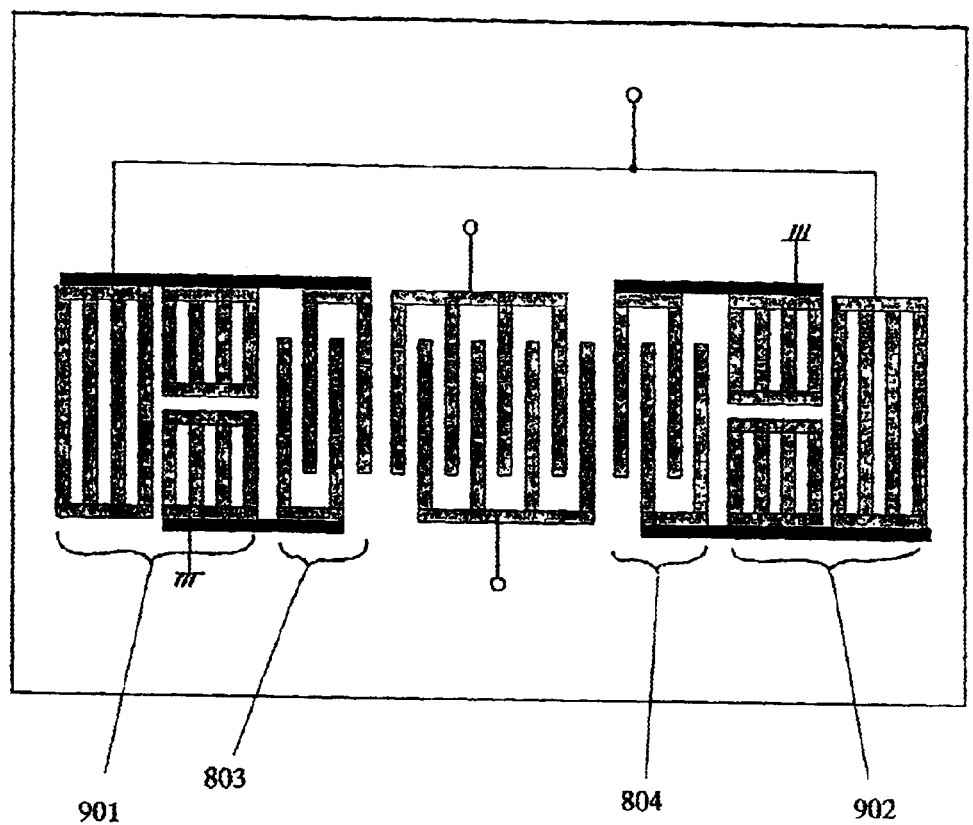
FIG. 9 is another block diagram of the surface acoustic wave filter in Embodiment 5 of the present invention.

Furthermore, the reflector electrodes 805 and 806 may also be arranged as shown in FIG. 9. In FIG. 9, first and second reflector electrodes 901 and 902 are each divided into two segmented reflector electrodes and the segmented reflector electrodes adjacent to the input IDT electrode are each constituted by an upper reflector electrode and a lower reflector electrode. For the configuration shown in FIG. 9, the effect of improving the balance characteristics in the present invention is unchanged and the effect of increasing the degree of freedom can be achieved in a same way. Furthermore, the first reflector electrode 901 corresponds to the first reflector electrode of the present invention and the second reflector electrode 902 corresponds to the second reflector electrode of the present invention.

(Embodiment 6)

Figure 10:
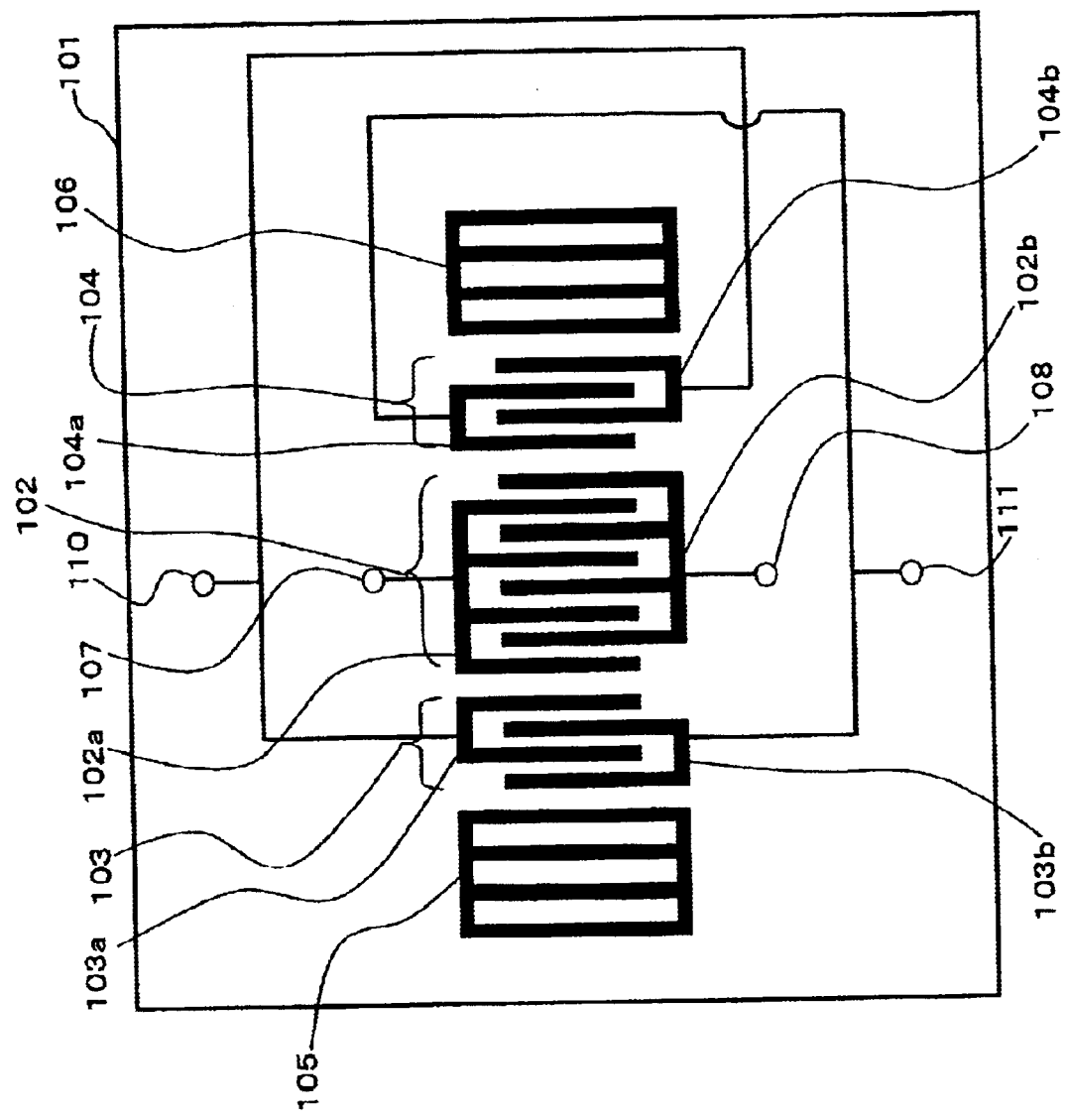
FIG. 10 is a block diagram of the surface acoustic wave filter in Embodiment 6 of the present invention.

The surface acoustic wave filter of Embodiment 6 of the present invention will be described below referring to the drawings. Furthermore, FIG. 10 is a schematic diagram of the surface acoustic wave filter in Embodiment 6.

In the above embodiments, the surface acoustic wave filter having unbalanced-balanced type terminals has been described, but in Embodiment 6, the surface acoustic wave filter having balanced-balanced type terminals will be described.

The same parts as those found in Embodiment 1 will be given same symbols, and detailed descriptions thereof will not be presented.

Furthermore, a balanced type terminal 111 corresponds to the other of second balanced type terminals of the present invention.

In FIG. 10, a longitudinal mode surface acoustic wave filter comprising the first IDT electrodes 102, the second and third IDT electrodes 103 and 104, and the first and second reflector electrodes 105 and 106 is formed on the piezoelectric substrate 101.

In the above surface acoustic wave filter, the upper electrode 102a of the first IDT electrode 102 is connected to one of the balanced type terminals 107 and the lower electrode 102b of the first IDT electrode 102 is connected to the other balanced type terminal 108. Also, the upper electrode 103a of the second IDT electrode 103 is connected to the balanced type terminal 110 and the lower electrode 103b is connected to the balanced type terminal 111. Also, the lower electrode 104b of the third IDT electrode 104 is connected to the balanced type terminal 110 and the upper electrode 103a is connected to the balanced type terminal 111.

In this way, the above surface acoustic wave filter is configured to have balanced-balanced type terminals, and the signal paths from the balanced type terminal 110 and the balanced type terminal 111 are each connected upside down from a structural viewpoint. Also, the upper electrode 102*a* and the lower electrode 102*b* of the first IDT electrode 102 have same numbers of electrode fingers.

By making the surface acoustic wave filter have the above configuration, the signal passing through the leading electrode connecting the upper electrode 103*a* of the second IDT electrode to the balanced type terminal 110 and the signal passing through the leading electrode connecting the upper electrode 104*a* of the third IDT electrode 104 to the balanced type terminal 111 have mutually opposite phases. Also, the signal passing through the leading electrode connecting the lower electrode 103*b* of the second IDT electrode to the balanced type terminal 111 and the signal passing through the leading electrode connecting the lower electrode 104*b* of the third IDT electrode 104 to the balanced type terminal 110 have mutually opposite phases.

Therefore, signals spatially leaked from these leading electrodes have opposite phases on the left and right sides, thus making it possible to alleviate impacts on the leading electrode connecting the upper electrode 102*a* to the balanced type terminal 107. Also, impacts on the leading electrode connecting the lower electrode 102*b* to the balanced type terminal 108 can be alleviated. It is therefore possible to prevent degradation of the characteristics of the surface acoustic wave filter.

As shown in FIG. 1A, the electrode fingers in the second and third IDT electrodes 103 and 104 are arranged in a same manner as Embodiment 1 so that surface acoustic waves do not balance each other out. That is, given that the upper electrode 103*a* of the second IDT electrode 103 and the lower electrode 104*b* of the third IDT electrode 104 connected to the balanced type terminals 110 and 111, respectively, are positive (+), and the electrode connected to the balanced type terminal 111 is negative (−), an in-phase arrangement is provided as shown in FIG. 11A.

Figure 11:
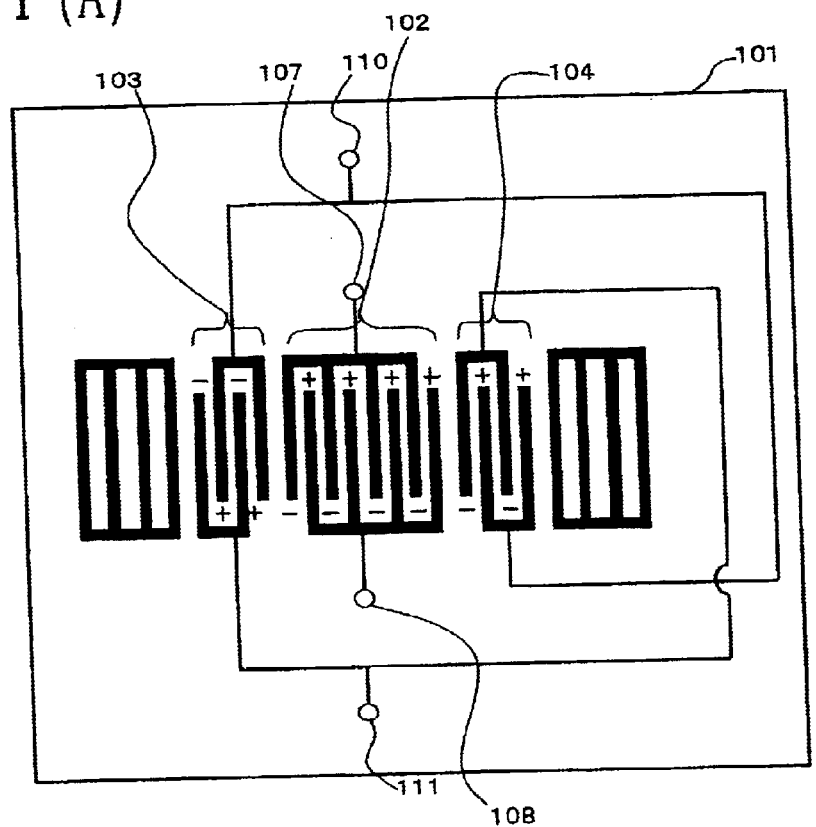
FIG. 11A is a schematic layout of electrode fingers of the surface acoustic wave filter in Embodiment 6 of the present invention.
FIG. 11B is a schematic layout of electrode fingers of another surface acoustic wave filter in Embodiment 6 of the present invention.
Figure 11:
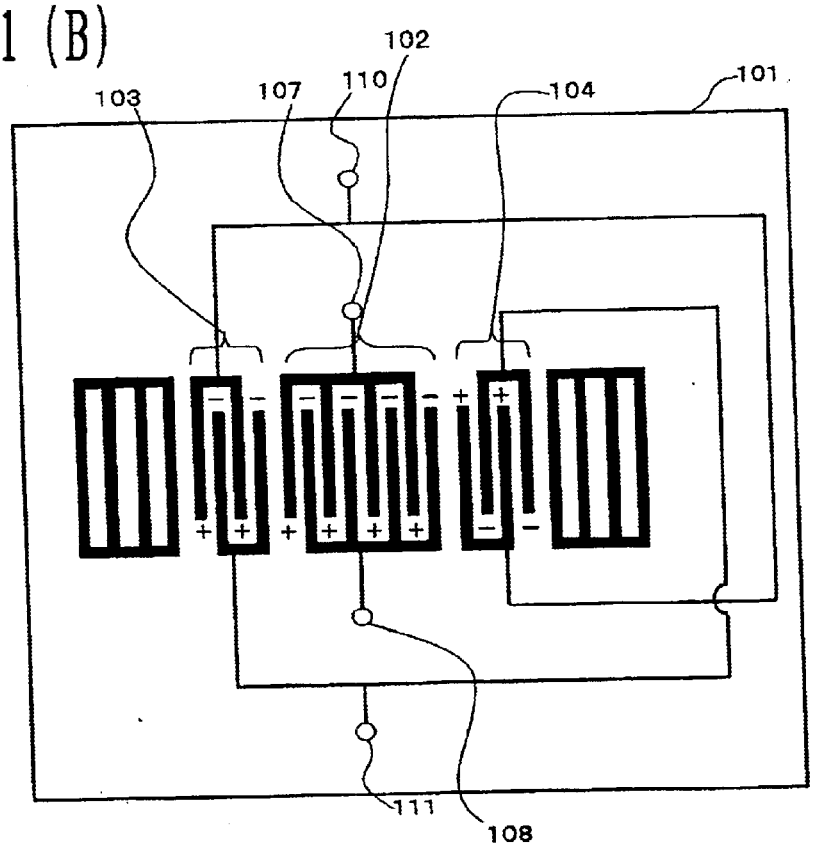

Furthermore, even the configuration shown in FIG. 11B does not affect the influence of the present invention. FIG. 11B shows the configuration in which the upper electrode of the second IDT electrode 103 and the lower electrode of the third IDT electrode 104 are shifted by one electrode finger, respectively. In this case, only the first IDT electrode 102 has just an opposite polarity, and thus the effect by the embodiment of the present invention is unchanged.

Also, the upper electrode 103*a* of the second IDT electrode 103 and the lower electrode 104*b* of the third IDT electrode 104 are connected to the balanced type terminal 110, but instead thereof, the lower electrode 103*b* of the second IDT electrode 103 and the upper electrode 104*a* of the third IDT electrode 104 may be connected to the balanced type terminal 110. That is, if the signal paths are connected to the second and third IDT electrodes 103 and 104 upside down from a structural viewpoint, an effect similar to that of the embodiment of the present invention can be achieved.

Furthermore, corresponding parts of the surface acoustic wave filter of each of Embodiments 2 to 5 may be used for the surface acoustic wave filter of Embodiment 6. In this way, effects equivalent to those obtained in the above embodiments for the unbalanced-balanced type surface acoustic wave filter can be achieved for the balanced-balanced type surface wave filter.

(Embodiment 7)

Figure 14:
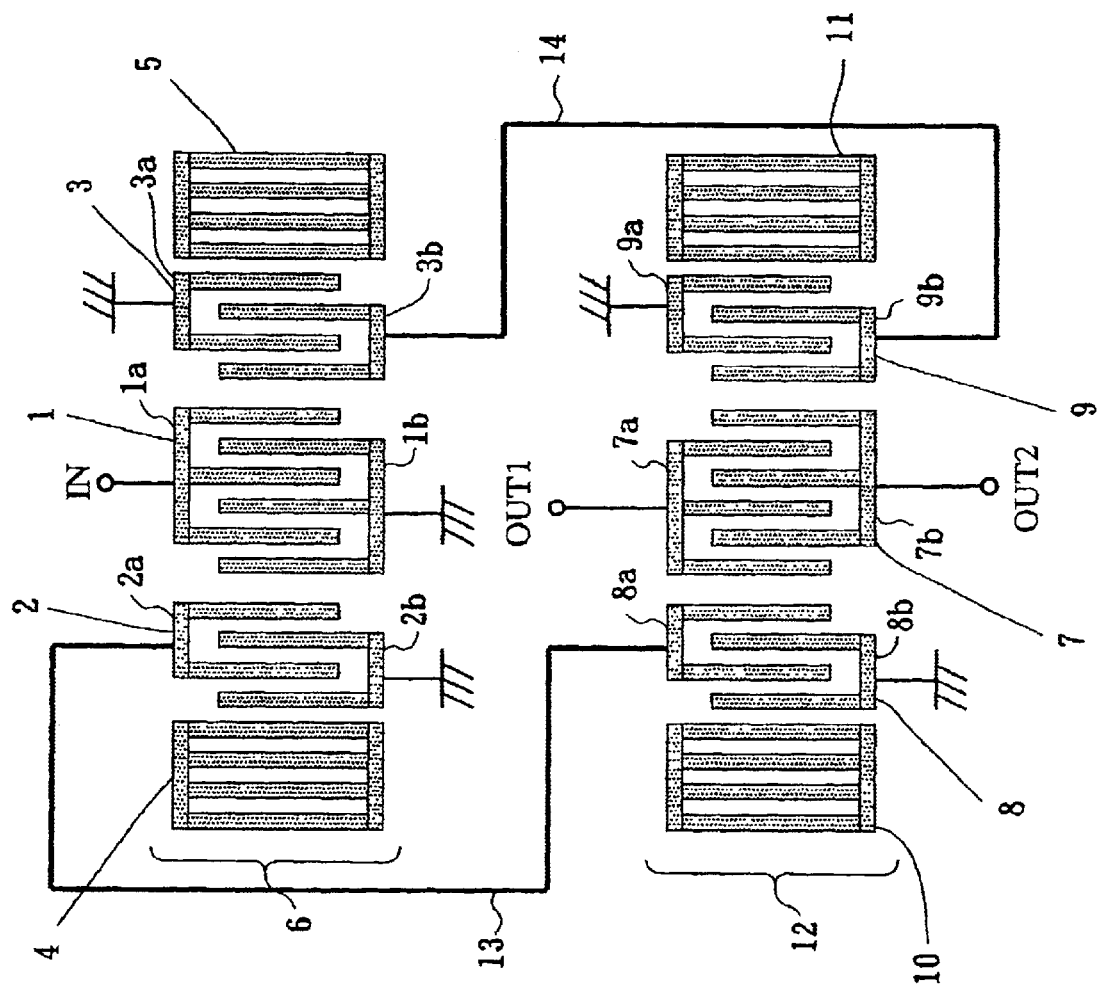
FIG. 14 is a schematic diagram of the surface acoustic wave filter in Embodiment 7 of the present invention.

The surface acoustic wave filter of Embodiment 7 of the present invention will be described below referring to the drawings. FIG. 14 is a schematic diagram of the surface acoustic wave filter in Embodiment 7.

The surface acoustic wave filter of the present invention is a longitudinal mode type surface acoustic wave filter having unbalanced-balanced type input/output terminals.

Furthermore, a fourth IDT electrode 7 corresponds to the first IDT electrode of the present invention, a fifth IDT electrode 8 corresponds to the second IDT electrode of the present invention, a sixth IDT electrode 9 corresponds to the third IDT electrode of the present invention, a first IDT electrode 1 corresponds to the fourth IDT electrode of the present invention, a second IDT electrode 2 corresponds to the fifth IDT electrode of the present invention, and a third IDT electrode 3 corresponds to the sixth IDT electrode of the present invention. Also, a third reflector electrode 10 corresponds to the first reflector electrode of the present invention, a fourth reflector electrode 11 corresponds to the second reflector electrode of the present invention, a first reflector electrode 4 corresponds to the third reflector electrode of the present invention, and a second reflector electrode 5 corresponds to the fourth reflector electrode of the present invention. Also, the terminal OUT1 corresponds to one of the first balanced type terminals of the present invention and the terminal OUT2 corresponds to the other of the first balanced type terminals of the present invention, and the terminal IN corresponds to the unbalanced type terminal of the present invention.

In FIG. 14, the surface acoustic wave filter is constituted by the first-stage filter track 6 and the second-stage filter track 12 each placed on the piezoelectric substrate.

The first-stage filter track 6 comprises the first, second and third IDT electrodes 1, 2 and 3, and the first and second reflector electrodes 4 and 5. Also, the second-stage filter track 12 comprises the fourth, fifth and sixth IDT electrodes 7, 8 and 9, and the fourth and fifth reflector electrodes 10 and 11.

The second and third IDT electrodes 2 and 3 are located on both sides of the first IDT electrode 1, and on both side of this arrangement, the first and second reflector electrodes 4 and 5 are located. These IDT electrodes and reflector electrodes are arranged in the direction of propagation of surface acoustic waves. Also, the fifth and sixth IDT electrodes 8 and 9 are located on both sides of the fourth IDT electrode, and both sides of this arrangement, the third and fourth reflector electrodes 10 and 11 are located. These IDT electrodes and reflector electrodes are arranged in the direction of propagation of surface acoustic waves. Then, the first-stage filter track 6 is connected to the second-stage filter track 12 in cascade to form a two-stage longitudinal mode filter.

Furthermore, in FIG. 14, the first IDT electrode 1 and the fourth IDT electrode 7 are arranged in such a manner that they are located mutually opposite to each other, the second IDT electrode 2 and the fifth IDT electrode 8 are arranged in such a manner that they are located mutually opposite to each other, and the third IDT electrode 3 and the sixth IDT electrode 9 are arranged in such a manner that they are located mutually opposite to each other, but the form of their arrangements is not limited thereto. For example, in FIG. 14, even an surface acoustic wave filter having the first-stage filter track 6 shifted parallel to itself with respect to the second-stage filter-track 12 in the direction in which the first IDT electrode 1, the second IDT electrode 2 and the third IDT electrode 3 are arranged, or an surface acoustic wave filter having the first-stage filter track 6 and the second-stage filter track 12 provided on different piezoelectric substrates makes it possible to achieve effects equivalent to those of this embodiment. In short, for the surface acoustic wave filter of this embodiment, it is only necessary that the first-stage filter track 6 should be connected to the second-stage filter track 12 in the cascade to form a two-stage longitudinal mode filter.

The first IDT electrode 1 is constituted by an upper electrode 1a and a lower electrode 1b, the second IDT electrode 2 is constituted by an upper electrode 2a and a lower electrode 2b, the third IDT electrode 3 is constituted by an upper electrode 3a and a lower electrode 3b, the fourth IDT electrode 7 is constituted by an upper electrode 7a and a lower electrode 7b, the fifth IDT electrode 8 is constituted by an upper electrode 8a and a lower electrode 8b and the sixth IDT electrode 9 is constituted by an upper electrode 9a and a lower electrode 9b. In this way, the IDT electrodes are each constituted by a pair of comb electrodes, namely the upper and lower electrodes.

Also, the upper electrode 1a of the first IDT electrode 1 is connected to the inputting unbalanced type terminal IN and the lower electrode 1b of the first IDT electrode 1 is grounded.

The upper electrode 2a of the second IDT electrode 2 is connected to the upper electrode 8a of the fifth IDT electrode 8 by a leading electrode 13. The lower electrode 2b of the second IDT electrode 2 is grounded.

The lower electrode 3b of the third IDT electrode 3 is connected to the lower electrode 9b of the sixth IDT electrode 9 by a leading electrode 14. The upper electrode 3a of the third IDT electrode 3 is grounded.

The upper electrode 7a of the fourth IDT electrode 7 is connected to one balanced type terminal OUT1 of a pair of outputting balanced type terminals, and the lower electrode 7b of the fourth IDT electrode 7 is connected to the other balanced type terminal OUT2 of a pair of outputting balanced type terminals.

The lower electrode 8b of the fifth IDT electrode 8 and the upper electrode 9a of the sixth IDT electrode 9 are both grounded.

Also, the leading electrodes 13 and 14 are drawn on the piezoelectric substrate provided thereon with IDT electrodes such as the first IDT electrode 1. Furthermore, at this time, the leading electrodes are preferably drawn so that the reactance components of the leading electrode 13 and the leading electrode 14 are identical to each other. Furthermore, the leading electrodes 13 and 14 may be drawn on the underlying substrate of the piezoelectric substrate instead of drawing the leading electrodes on the piezoelectric substrate.

Furthermore, connections to the terminals IN, OUT1 and OUT2 are provided in such a manner as to lead to terminals outside the piezoelectric substrate by wire bonding implementation, face down implementation or the like.

Also, in each of the above IDT electrodes and reflector electrodes, the central pitch between neighboring electrode fingers is in the range of from $0.9 \times \lambda/2$ to $1.1 \times \lambda/2$. Thereby, bulk radiation losses can be reduced, thus making it possible to decrease the loss of the filter.

Operations of this surface acoustic wave filter of this embodiment will now be described.

By inputting a signal to the unbalanced type terminal IN, an surface acoustic wave is produced in the first IDT electrode 1. Then, the surface acoustic wave produces a plurality of resonance modes by the first and second reflector electrodes 4 and 5. By using these resonance modes, filter characteristics can be obtained, and conversions into electrical signals are carried out in the second IDT electrode 2 and the third IDT electrode 3, respectively.

The electrical signal converted in the second IDT electrode 2 is outputted to the upper electrode 8a of the fifth IDT electrode 8 through the leading electrode 13. Also, the electrical signal converted in the third IDT electrode 3 is outputted to the upper electrode 9a of the sixth IDT electrode 9 through the leading electrode 14. At this time, by adjusting in advance the intervals between the IDT electrodes of the surface acoustic wave filter and the way of connecting electrode fingers, the phase of the electrical signal inputted to the leading electrode 13 is made opposite to that of the electrical signal inputted to the leading electrode 14.

The electrical signal inputted to the fifth IDT electrode 8 is converted into an surface acoustic wave in the fifth IDT electrode 8 and the electrical signal inputted to the sixth IDT electrode 9 is converted into an surface acoustic wave in the sixth IDT electrode 9. Then, the surface acoustic waves converted in the fifth IDT electrode 8 and the sixth IDT electrode 9 are propagated through the piezoelectric substrate. The propagated surface acoustic waves are reflected at the third and fourth reflector electrodes 10 and 11, thereby producing a plurality of resonance modes.

By using these resonance modes, filter characteristics can be obtained, and the waves are outputted from the balanced type terminals OUT1 and OUT2.

The surface acoustic wave filter of the present invention is operated in this way.

In the above embodiments, how to improve the degradation of balance characteristics caused by unbalanced parasitic components has been described. Now, causes of degradation of balance characteristics will be specifically described.

The inventor has compared the filter characteristics of the conventional surface acoustic wave filter (see FIG. 27) to the filter characteristics of the surface acoustic wave filter of this embodiment (see FIG. 14) by simulation.

Figure 12:
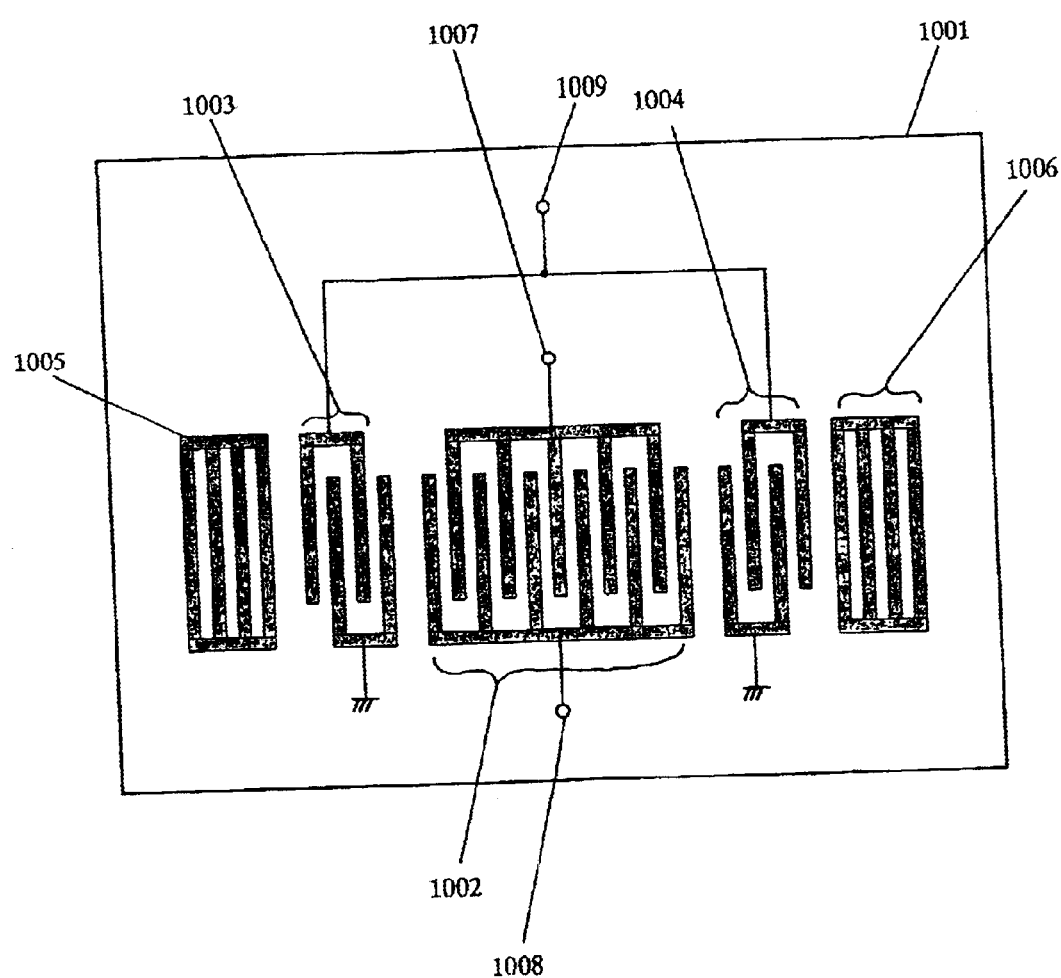
FIG. 12 is a block diagram of the conventional surface acoustic wave filter.
Figure 13:
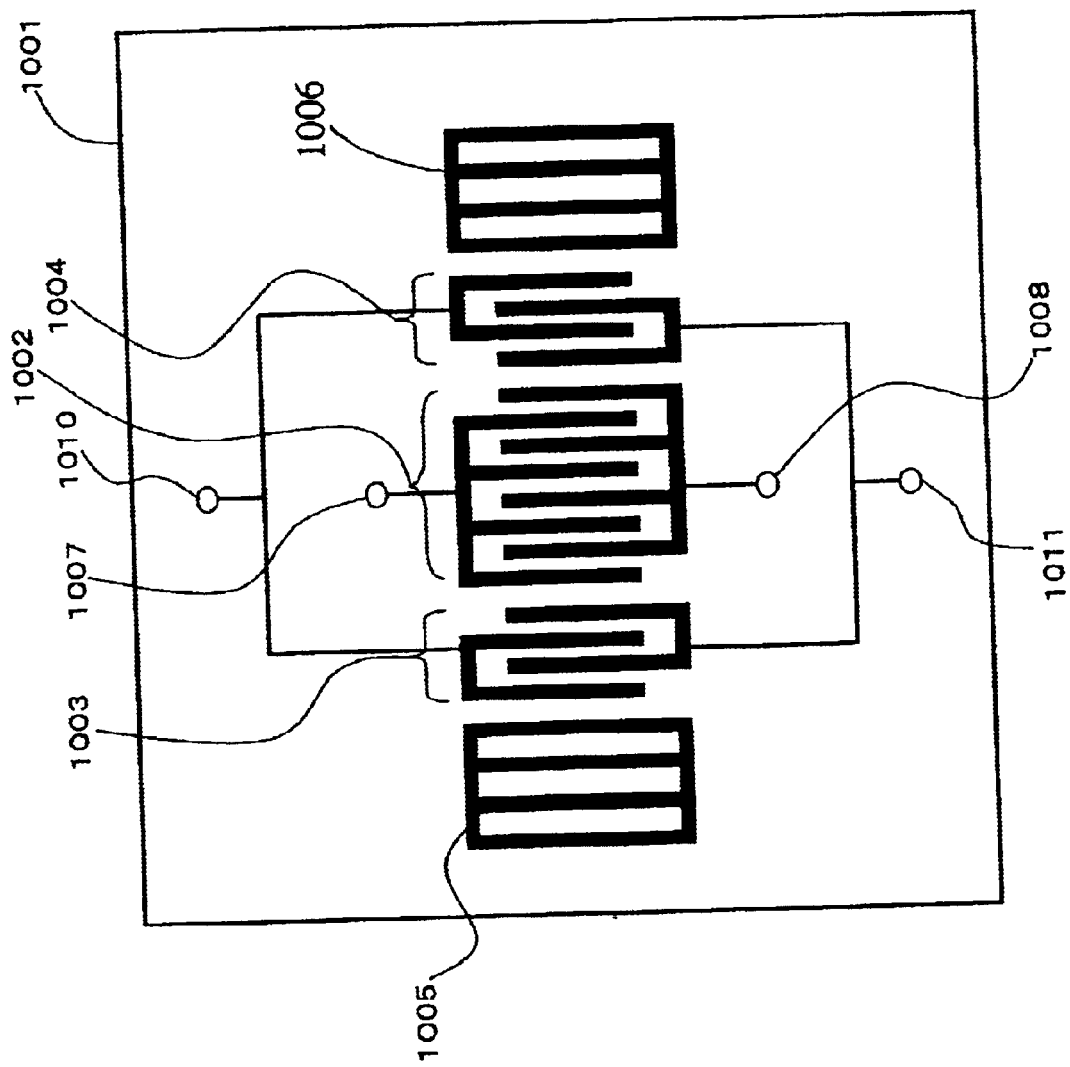
FIG. 13 is a structural view of the conventional surface acoustic wave filter.

The inventor has also carried out simulation with respect to the filter characteristics of the aforesaid surface acoustic wave filter of Embodiment 1 (see FIG. 1) and the filter characteristics of the conventional surface acoustic wave filter (see FIG. 12).

In the following discussion, (1) the filter characteristics of the conventional surface acoustic wave filter (see FIG. 12) and the filter characteristic of the surface acoustic wave filter of Embodiment 1 (see FIG. 1) will be first described, and (2) the filter characteristics of the conventional surface acoustic wave filter (see FIG. 27) and the filter characteristics of the surface acoustic wave filter of this embodiment (see FIG. 14) will be then described.

Figure 42:
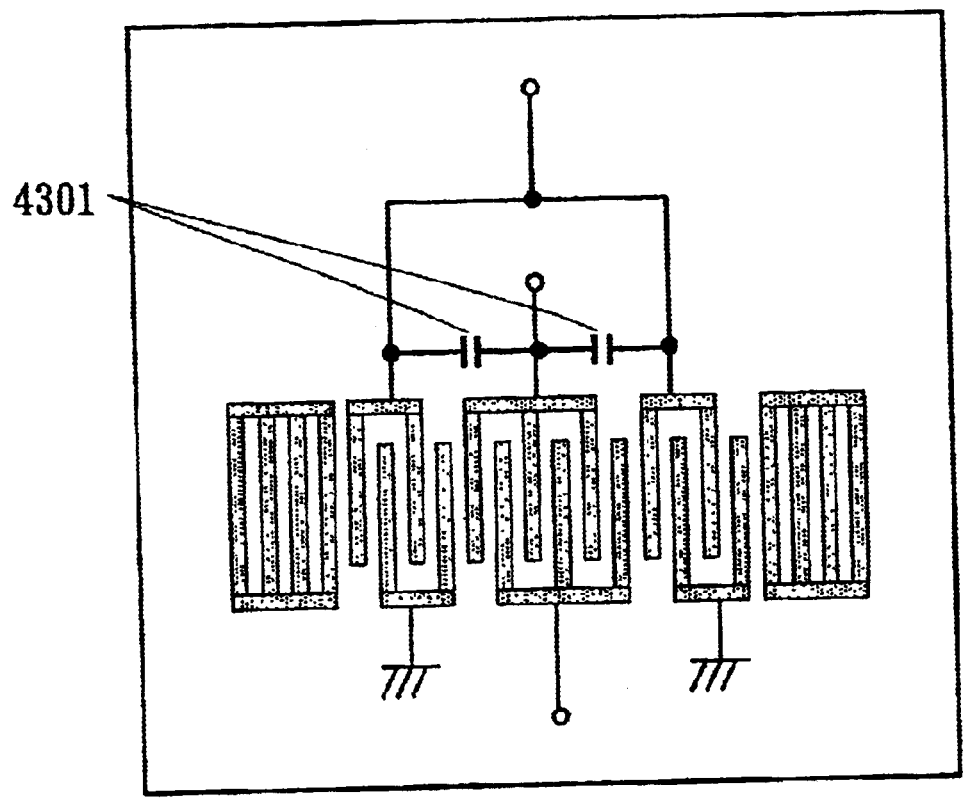
FIG. 42 is a block diagram of the surface acoustic wave filter in contemplation of parasitic components.
Figure 47:
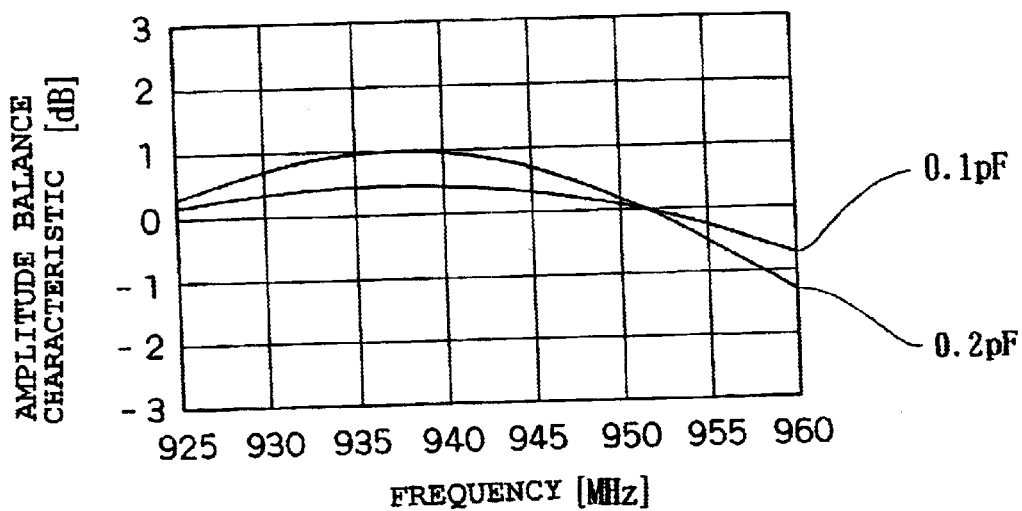
FIG. 47 is an illustrative view for the amplitude balance characteristic and the phase balance characteristic of the simulation model for the conventional surface acoustic wave filter.
Figure 47:
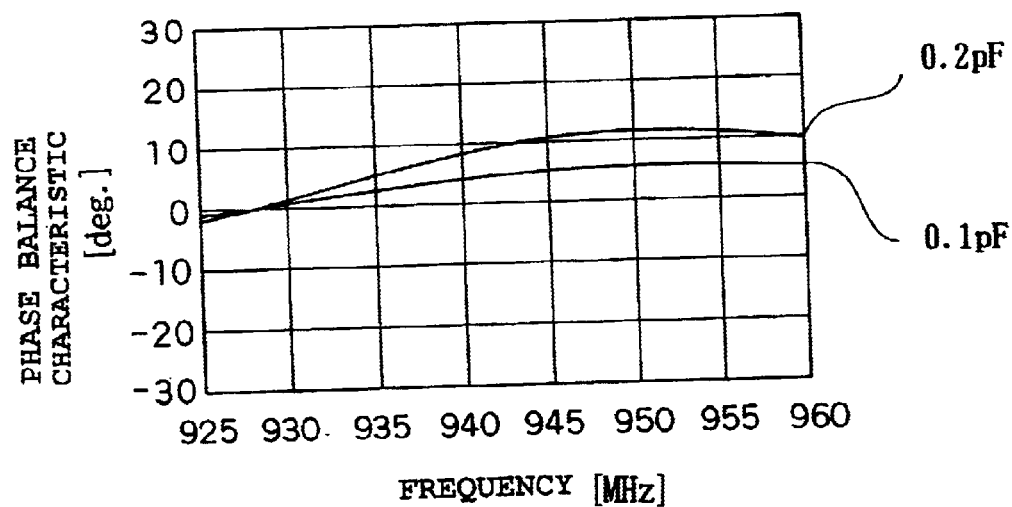

(1) Conditions in determining by simulation the filter characteristics of the conventional surface acoustic wave filter (see FIG. 12) are shown in FIG. 42, and the filter characteristics (amplitude balance characteristic and phase balance characteristic) determined in accordance with the conditions are shown in FIG. 47. The amplitude balance characteristic and phase balance characteristic are shown for the case where the parasitic capacities (capacitance components 4301) in two places, generation of which has been predicted by the inventor, are both 0.1 pF and where they are both 0.2 pF.

These filter characteristics determined by simulation have tendencies similar to those of the filter characteristics determined by experiments (see FIG. 41), and the aforesaid prediction of generated parasitic capacities made by the inventor can be appropriate.

Figure 48:
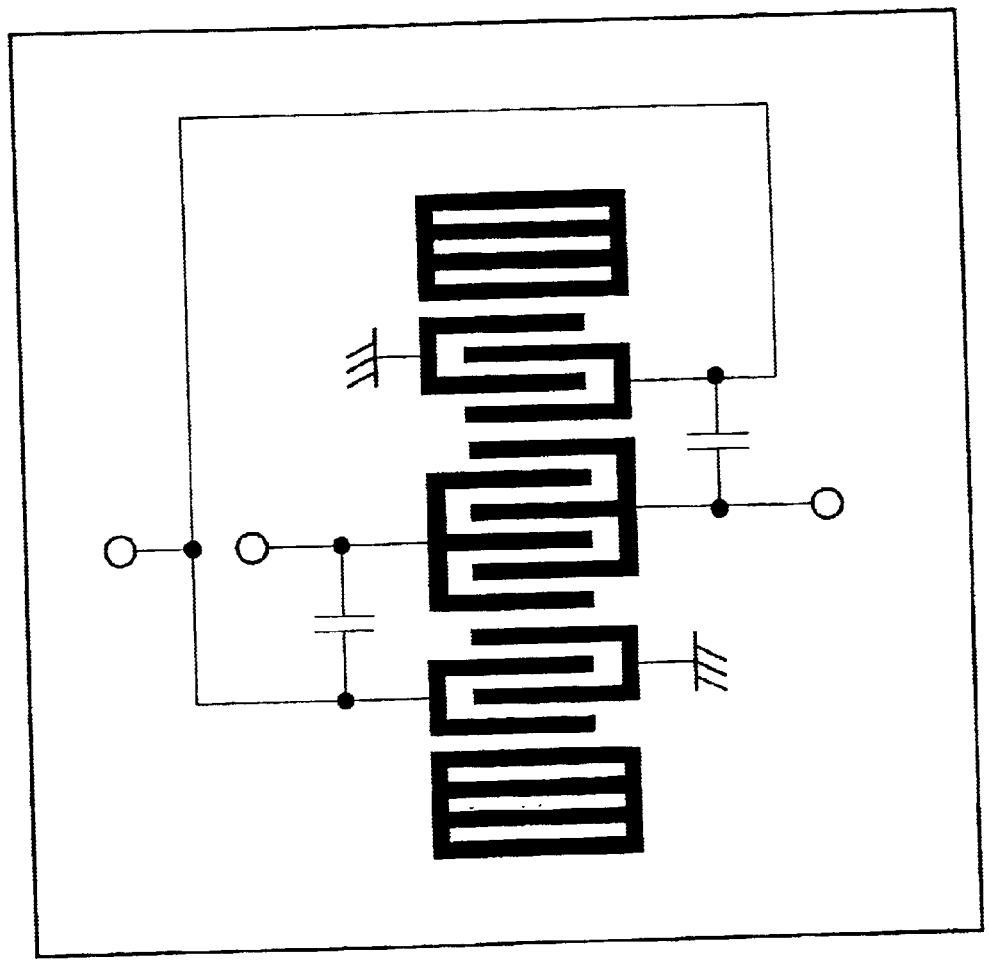
FIG. 48 is an illustrative view of the simulation model for the surface acoustic wave filter of the embodiment according to the present invention.
Figure 49:
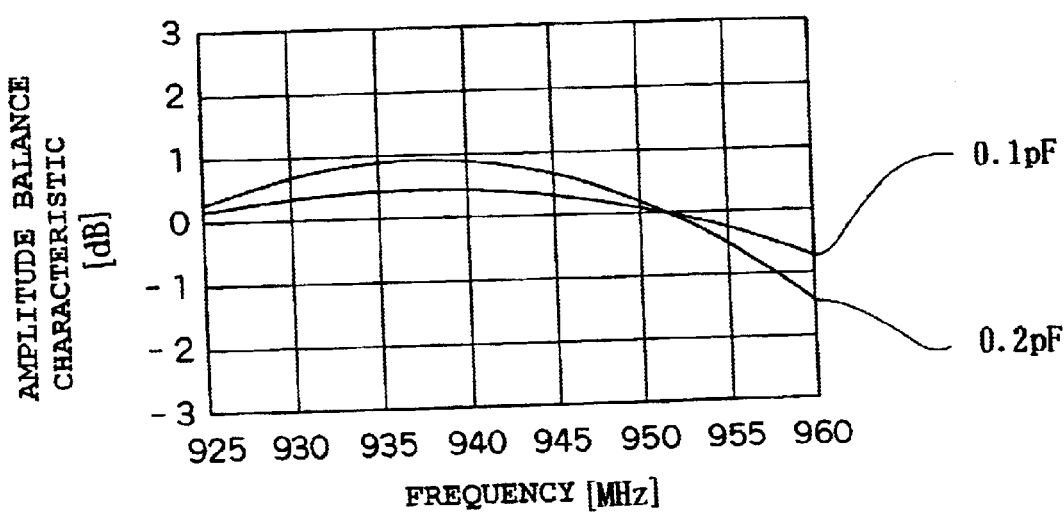
FIG. 49 is an illustrative view for the amplitude balance characteristic and the phase balance characteristic of the simulation model for the surface acoustic wave filter of the embodiment according to the present invention.
Figure 49:
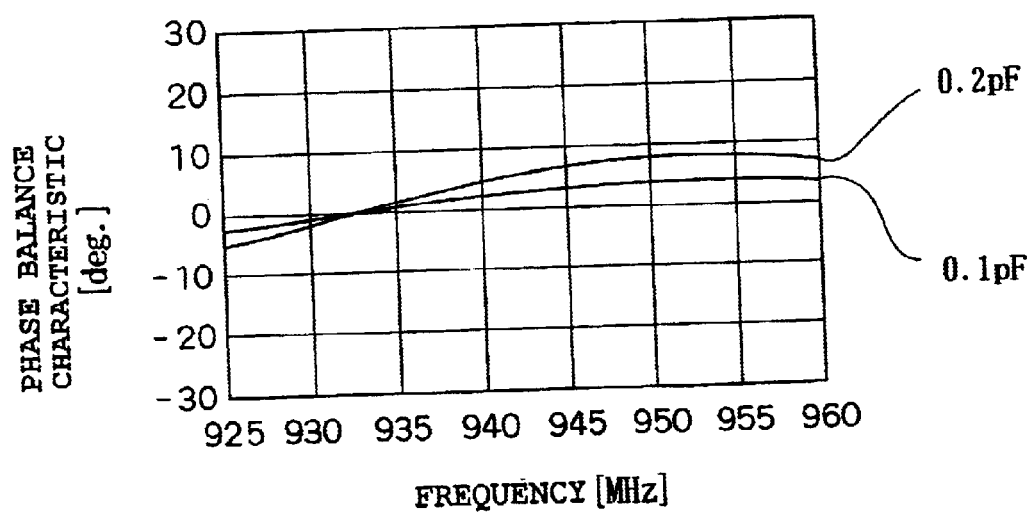

Conditions in determining by simulation the filter characteristics of the surface acoustic wave filter of Embodiment 1 (see FIG. 1) are shown in FIG. 48, and the filter characteristics (amplitude balance characteristic and phase balance characteristic) determined in accordance with the conditions are shown in FIG. 49. The amplitude balance characteristic and phase balance characteristic are shown for the case where the parasitic capacities in two places, generation of which has been predicted by the inventor, are both 0.1 pF and where they are both 0.2 pF. Furthermore, FIGS. 43A and 43B show the relationship between the maximum value and the minimum value in the parasitic capacitance and the passband with respect to the amplitude balance characteristic and the phase balance characteristic.

These filter characteristics determined by simulation have tendencies similar to those of the filter characteristics determined by experiments, and the aforesaid prediction of generated parasitic capacities made by the inventor can be appropriate.

Figure 15:
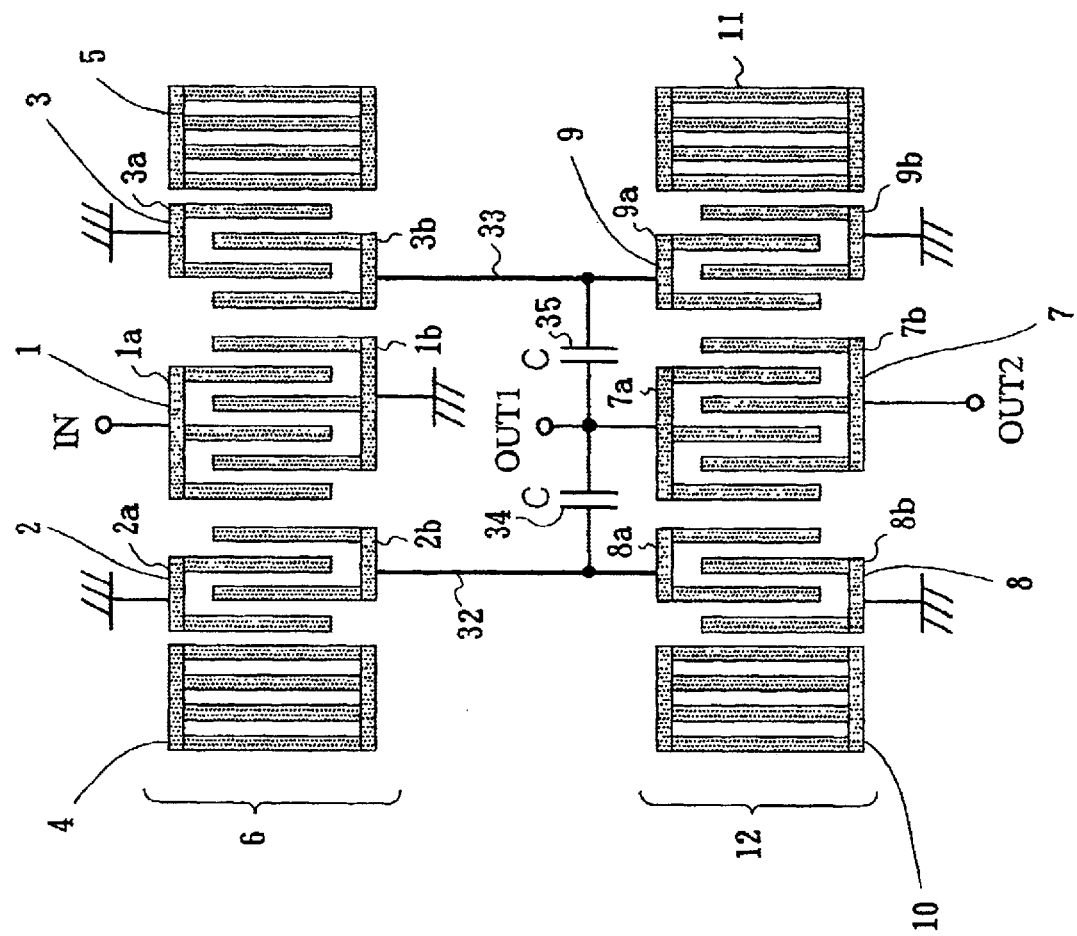
FIG. 15 shows simulation conditions of the conventional surface acoustic wave filter.
Figure 16:
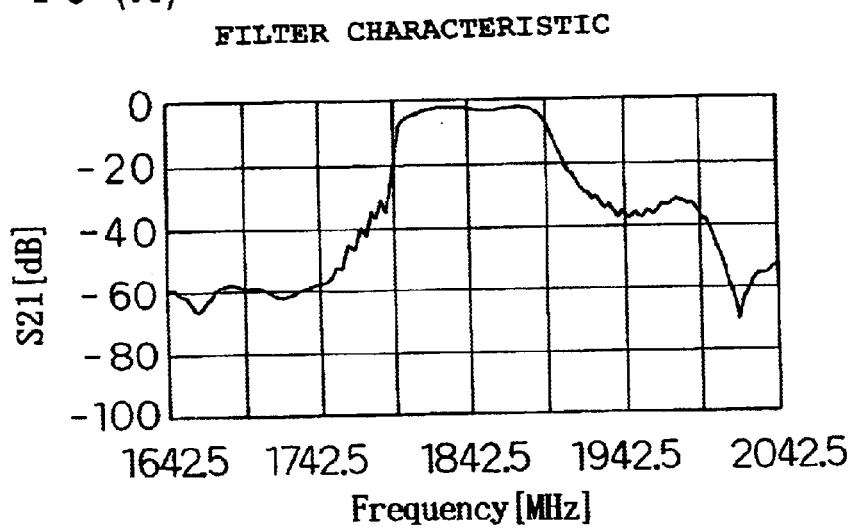
FIG. 16A shows the filter characteristic of the conventional surface acoustic wave filter determined by simulation.
FIG. 16B shows the amplitude balance of the conventional surface acoustic wave filter determined by simulation.
FIG. 16C shows the phase balance of the conventional surface acoustic wave filter determined by simulation.
Figure 16:
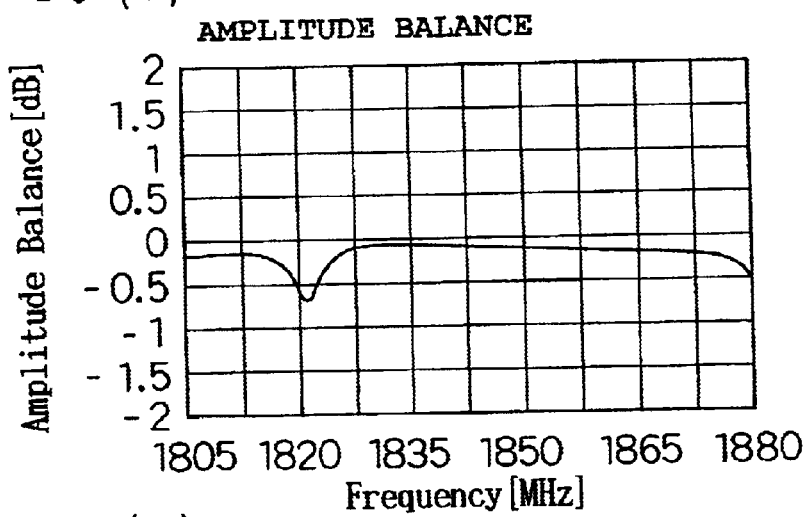
Figure 16:
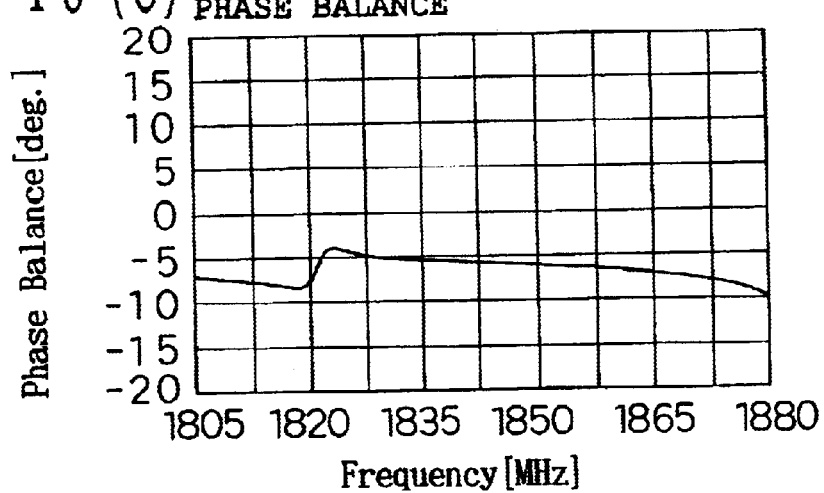
Figure 27:
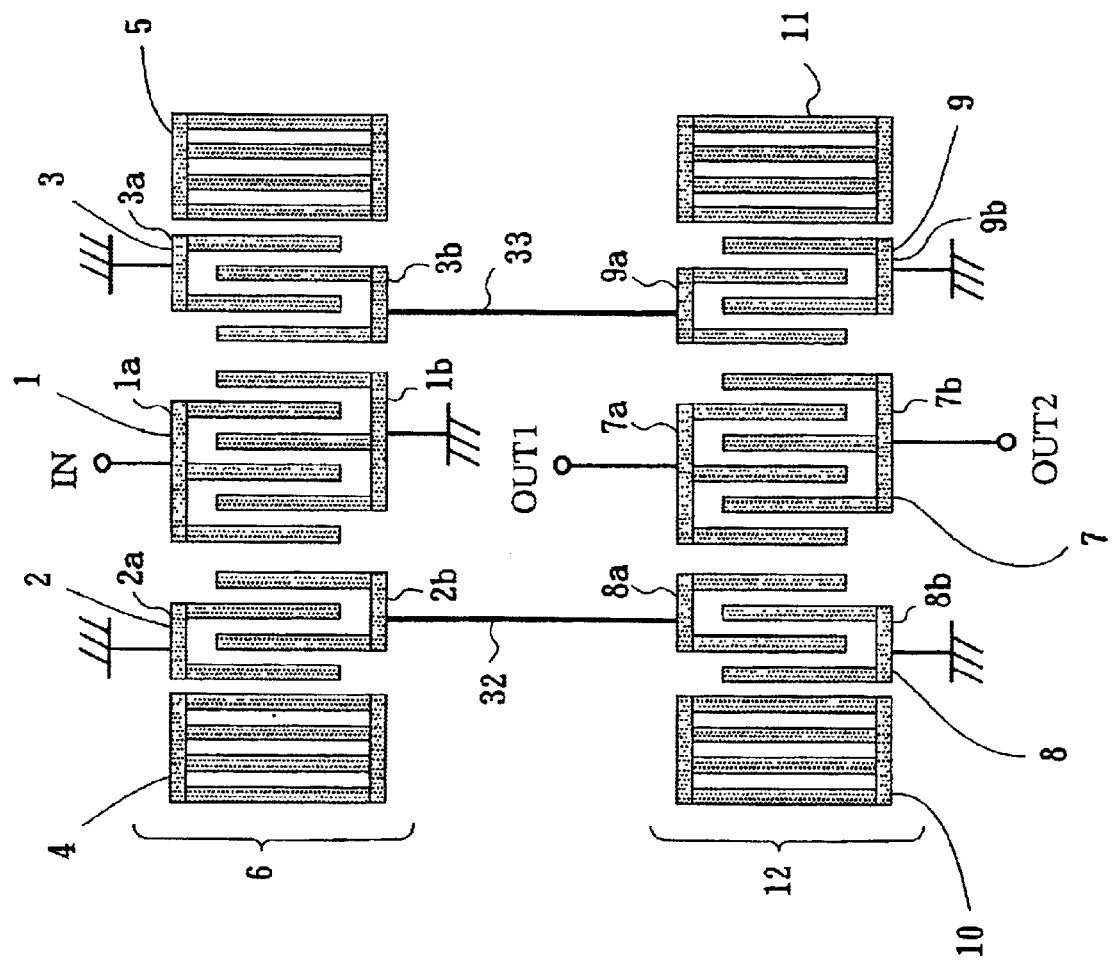
FIG. 27 is a schematic diagram of the conventional surface acoustic wave filter.

(2) Then, conditions in determining by simulation the filter characteristics of the conventional surface acoustic wave filter of FIG. 27 are shown in FIG. 15, and the filter characteristics determined in accordance with the conditions are shown in FIG. 16.

Figure 17:
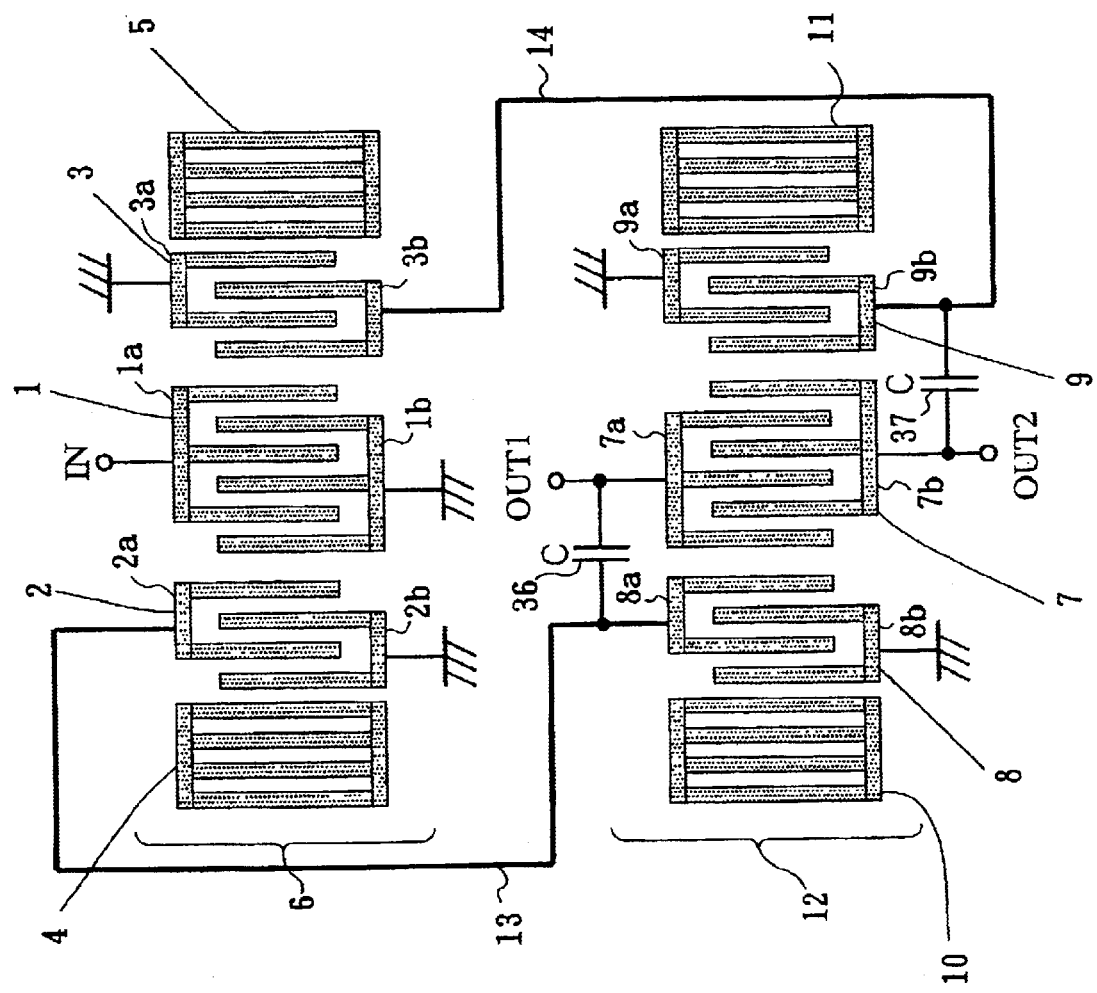
FIG. 17 shows simulation conditions of the surface acoustic wave filter in Embodiment 7 of the present invention.
Figure 18:
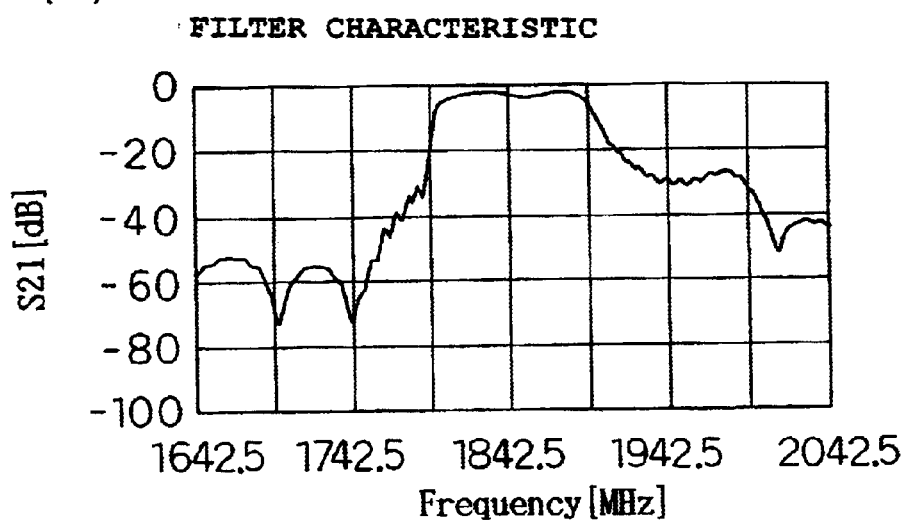
FIG. 18A shows the filter characteristic of the surface acoustic wave filter in Embodiment 7 of the present invention determined by simulation.
FIG. 18B shows the amplitude balance of the surface acoustic wave filter in Embodiment 7 of the present invention determined by simulation.
FIG. 18C shows the phase balance of the surface acoustic wave filter in Embodiment 7 of the present invention determined by simulation.
Figure 18:
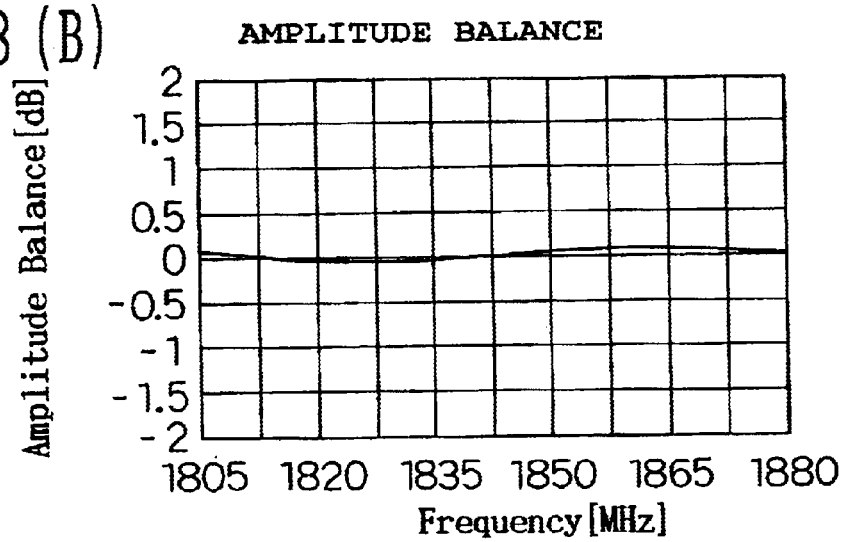
Figure 18:
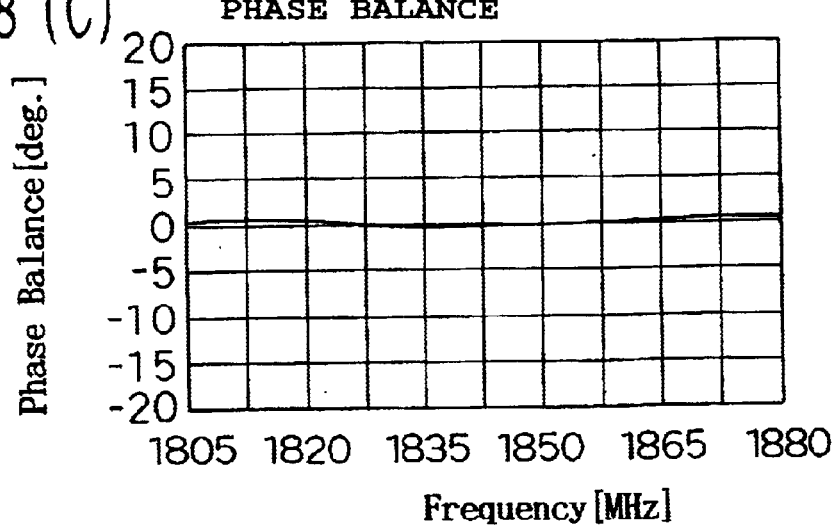

In addition, conditions in determining by simulation the filter characteristics of the surface acoustic wave filter of this embodiment of FIG. 14 are shown in FIG. 17, and the filter characteristics determined in accordance with the conditions are shown in FIG. 18.

First, for the conventional surface acoustic wave filter, it has been predicted that because the leading electrode connecting the balanced type terminal OUT1 to the upper electrode 7a of the fourth IDT electrode 7 is close to the leading electrode 32 as shown in FIG. 15, a parasitic capacitance 34 is generated by these leading electrodes. Also, it has been predicted that because the leading electrode connecting the balanced type terminal OUT1 to the upper electrode 7a of the fourth IDT electrode 7 is close to the leading electrode 33, a parasitic capacitance 35 is generated by these leading electrodes. Also, it has been predicted that because the leading electrode connecting the balanced type terminal OUT2 to the lower electrode 7b of the fourth IDT electrode 7 is located at some distance from both the leading electrode 32 and leading electrode 33, the leading electrode connecting the balanced type terminal OUT2 to the lower electrode 7b of the fourth IDT electrode 7 never generates a parasitic capacitance either with the leading electrode 32 or with the leading electrode 33.

Also, the IDT electrodes and reflector electrodes were arranged so that the phase of the signal inputted to the leading electrode 32 was opposite to that of the signal inputted to the leading electrode 33.

As a result of carrying out simulation under these simulation conditions, the filter characteristics shown in FIG. 16 have been obtained for the conventional surface acoustic wave filter.

The filter characteristic of the conventional surface acoustic wave filter determined by simulation is shown in FIG. 16A. Also, the amplitude balance of the conventional surface acoustic wave filter determined by simulation is shown in FIG. 16B. Furthermore, the amplitude balance refers to plotted ratios (unit: decibels) of the amplitude of the signal outputted to the balanced type terminal OUT1 to the amplitude of the signal outputted to the balanced type terminal OUT2, when the input signal is inputted from the unbalanced type terminal IN. Given that an ideal state is provided in which the surface acoustic wave filter is completely balanced, the signal detected from the balanced type terminal OUT1 and the signal detected from the balanced type terminal OUT2 are identical in amplitude and mutually different in phase by 180°. Therefore, as the magnitude of amplitude balance increases, the deviation from the ideal state becomes larger. The phase balance of the conventional surface acoustic wave filter determined by simulation is shown in FIG. 16C. Furthermore, the phase balance refers to plotted differences (unit: degrees) of the phase of the signal outputted to the balanced type terminal OUT1 and the phase of the signal outputted to the balanced type terminal OUT2, when the input signal is inputted from the unbalanced type terminal IN. Given that an ideal state is provided in which the surface acoustic wave filter is completely balanced, the signal detected from the balanced type terminal OUT1 and the signal detected from the balanced type terminal OUT2 are identical in amplitude and mutually different in phase by 180°. Therefore, the phase balance indicates how the phase difference between the signal detected from the balanced type terminal OUT1 and the signal detected from the balanced type terminal OUT2 is deviated from 180°. Therefore, as the magnitude of phase balance increases, the deviation from the ideal state becomes larger.

Then, for the surface acoustic wave filter of this embodiment shown in FIG. 14, it has been predicted that because the leading electrode connecting the balanced type terminal OUT1 to the upper electrode 7a of the fourth IDT electrode 7 is close to the leading electrode 13 as shown in FIG. 17, a parasitic capacitance 36 is generated by these leading electrodes. Also, it has been predicted that because the leading electrode connecting the balanced type terminal OUT2 to the lower electrode 7b of the fourth IDT electrode 7 is close to the leading electrode 14, a parasitic capacitance 37 is generated by these leading electrodes.

On the other hand, it has been predicted that because the leading electrode connecting the balanced type terminal OUT1 to the upper electrode 7a of the fourth IDT electrode 7 is not close to the leading electrode 14, these leading electrodes never generate the parasitic capacitance therebetween. Also, it has been predicted that because the leading electrode connecting the balanced type terminal OUT2 to the lower electrode 7b of the fourth IDT electrode 7 is not close to the leading electrode 13, these leading electrodes never generate the parasitic capacitance therebetween.

Also, the IDT electrodes and reflector electrodes were arranged so that the phase of the signal inputted to the leading electrode 13 was mutually opposite to that of the signal inputted to the leading electrode 14.

As a result of carrying out simulation under these simulation conditions, the filter characteristics shown in FIG. 18 have been obtained for the surface acoustic wave filter of this embodiment.

The filter characteristic of the surface acoustic wave filter of this embodiment, determined by simulation, is shown in FIG. 18A. Also, the amplitude balance of the surface acoustic wave filter of this embodiment, determined by simulation, is shown in FIG. 18B. Also, the phase balance of the surface acoustic wave filter of this embodiment, determined by simulation, is shown in FIG. 18C.

If comparing FIG. 16 and FIG. 17, for the filter characteristic of the surface acoustic wave filter of this embodiment shown in FIG. 17A, the attenuation limit is obtained outside the passband, and there is a rapid attenuation outside the passband. For the filter characteristic of the conventional surface acoustic wave filter shown in FIG. 16A, on the other hand, the attenuation limit is not obtained outside the passband, and there is no rapid attenuation outside the passband.

Also, for the amplitude balance of the surface acoustic wave filter of this embodiment shown in FIG. 18B, a good characteristic is obtained over a wide frequency range. On the other hand, the amplitude balance of the conventional surface acoustic wave filter shown in 16B is degraded compared to the amplitude balance shown in FIG. 18B.

Also, for the phase balance of the surface acoustic wave filter of this embodiment shown in FIG. 18C, a good characteristic is obtained over a wide frequency range. On the other hand, the phase balance of the conventional surface acoustic wave filter shown in FIG. 16C is degraded compared to the phase balance shown in FIG. 18C.

In this way, as a result of determining by simulation the characteristics of the surface acoustic wave filter of this embodiment and the characteristics of the conventional surface acoustic wave filter, it has been found that the surface acoustic wave filter of this embodiment has better balance characteristics and has a better filter characteristic than the conventional surface acoustic wave filter.

This result may be interpreted as follows. That is, for the surface acoustic wave filter of this embodiment, it can be considered that because the parasitic component produced by the leading electrode connecting the balanced type terminal OUT1 to the upper electrode 7a of the fourth IDT electrode 7 and the leading electrode 13 is substantially identical to the parasitic component produced by the leading electrode connecting the balanced type terminal OUT2 to the lower electrode 7b of the fourth IDT electrode 7 and the leading electrode 14, an surface acoustic wave filter having good balance characteristics and a good filter characteristic can be obtained. For the conventional surface acoustic wave filter, however, it-can be considered that because the parasitic component produced by the leading electrode connecting the balanced type terminal OUT1 to the upper electrode 7a of the fourth IDT electrode 7 and the leading electrodes 32 and 33 is different from the unbalanced parasitic component produced by the leading electrode connecting the balanced type terminal OUT2 to the lower electrode 7b of the fourth IDT electrode 7 and the leading electrodes 32 and 33, the balance characteristics and filter characteristic are both degraded compared to the surface acoustic wave filter of this embodiment.

In addition, the improved characteristics of the surface acoustic wave filter of this embodiment can also be attributed to the fact that the phase of the signal inputted to the leading electrode 13 is mutually opposite to the phase of the signal inputted to the leading electrode 14.

Then, the characteristics of the surface acoustic wave filter of this embodiment of FIG. 14 and the characteristics of the conventional surface acoustic wave filter of FIG. 27 have been determined by experiments.

Figure 19:
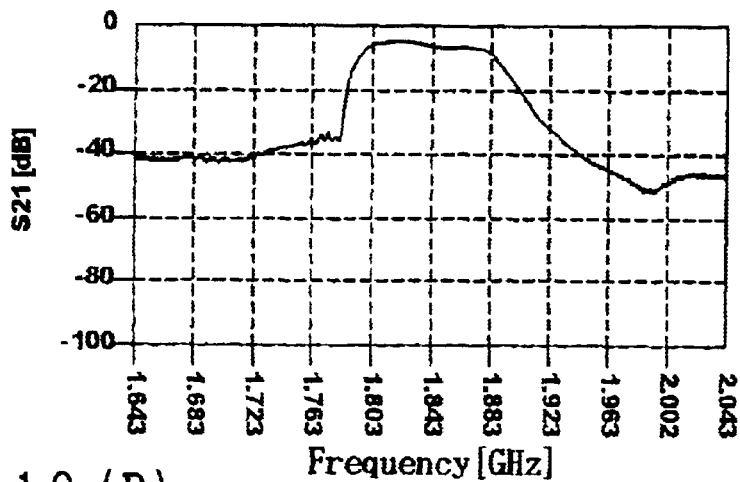
FIG. 19A shows the filter characteristic of the surface acoustic wave filter in Embodiment 7 of the present invention determined by experiments.
FIG. 19B shows the amplitude balance of the surface acoustic wave filter in Embodiment 7 of the present invention determined by experiments.
FIG. 19C shows the phase balance of the surface acoustic wave filter in Embodiment 7 of the present invention determined by experiments.
Figure 19:
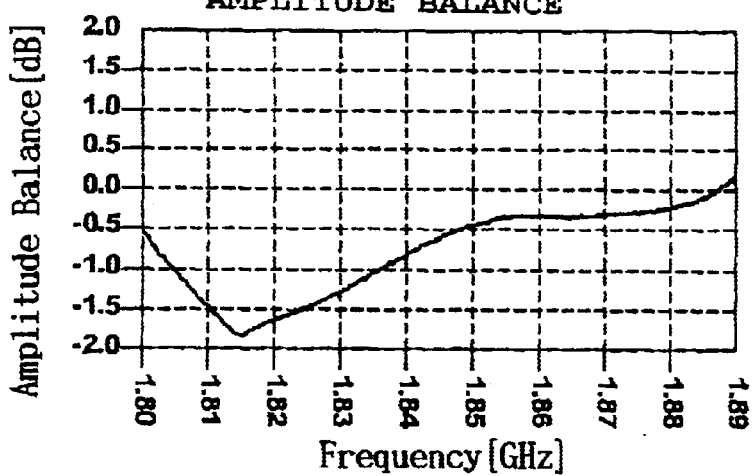
Figure 19:
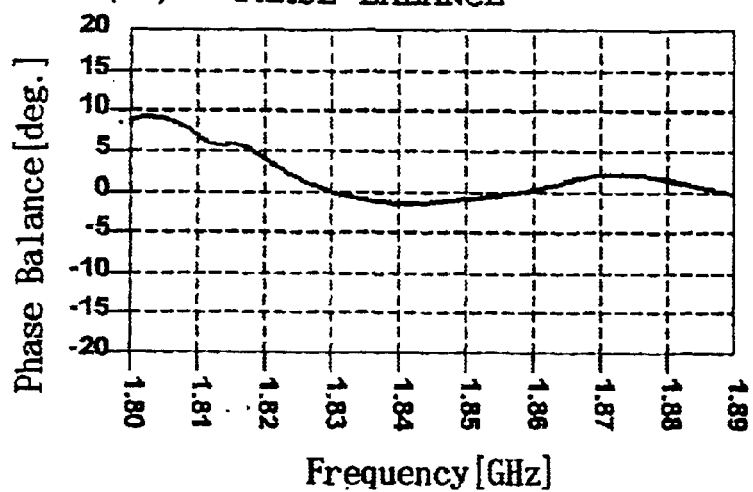
Figure 20:
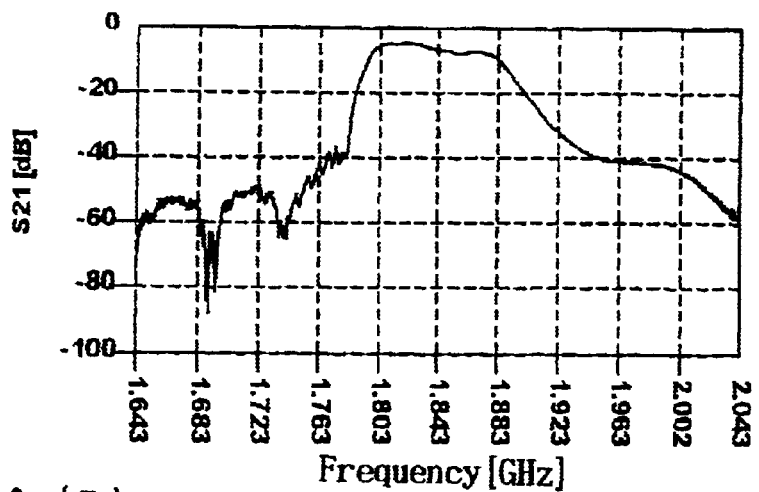
FIG. 20A shows the filter characteristic of the conventional surface acoustic wave filter determined by experiments.
FIG. 20B shows the amplitude balance of the conventional surface acoustic wave filter determined by experiments.
FIG. 20C shows the phase balance of the conventional surface acoustic wave filter determined by experiments.
Figure 20:
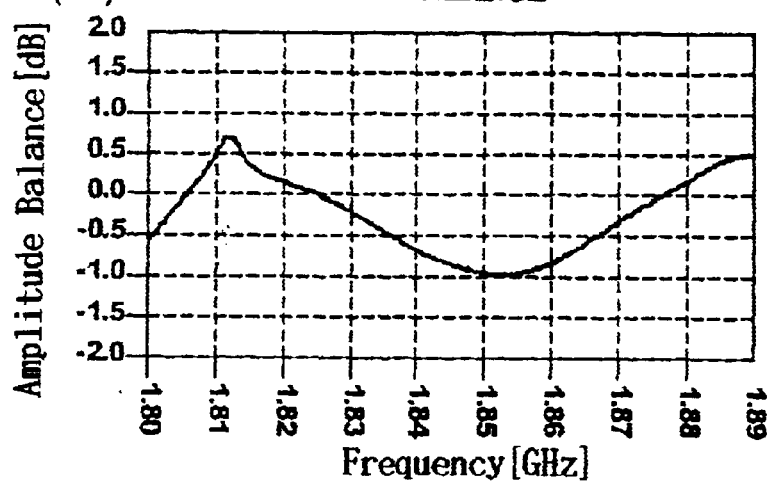
Figure 20:
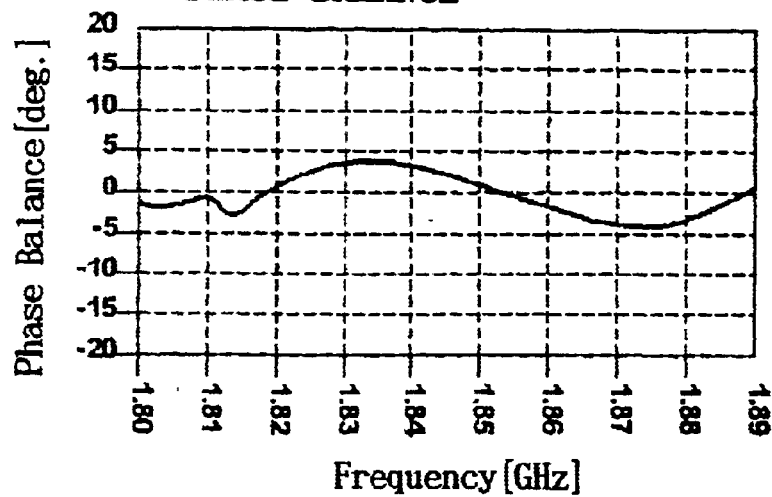

The characteristics of the surface acoustic wave filter of this embodiment determined by experiments are shown in FIG. 19, and the characteristics of the conventional surface acoustic wave filter determined by experiments are shown in FIG. 20.

The filter characteristic of the surface acoustic wave filter of this embodiment determined by experiments is shown in FIG. 19A, the amplitude balance of the surface acoustic wave filter of this embodiment determined by experiments is shown in FIG. 19B, and the phase balance of the surface acoustic wave filter of this embodiment determined by experiments is shown in FIG. 19C.

Also, the filter characteristic of the conventional surface acoustic wave filter determined by experiments is shown in FIG. 20A, the amplitude balance of the conventional surface acoustic wave filter determined by experiments is shown in FIG. 20B, and the phase balance of the conventional surface acoustic wave filter determined by experiments is shown in FIG. 20C.

If comparing FIG. 19 and FIG. 20, for the filter characteristic of the surface acoustic wave filter of this embodiment shown in FIG. 19, the attenuation limit is obtained outside the passband, and the characteristic of rapid attenuation is obtained outside the passband. For the filter characteristic of the conventional surface acoustic wave filter shown in FIG. 20A, on the other hand, the attenuation limit is not obtained outside the passband, and the characteristic of rapid attenuation is not obtained outside the passband.

Also, for the amplitude balance of the surface acoustic wave filter of this embodiment shown in FIG. 19B, a good characteristic is obtained over a wide frequency range. On the other hand, the amplitude balance of the conventional surface acoustic wave filter shown in FIG. 20B is degraded compared to the amplitude balance shown in FIG. 19B.

Also, for the phase balance of the surface acoustic wave filter of this embodiment shown in FIG. 19C, a good characteristic is obtained over a wide frequency range. On the other hand, the phase balance of the conventional surface acoustic wave filter shown in FIG. 20C is degraded compared to the phase balance shown in FIG. 19C.

In this way, the characteristics determined by simulation are generally similar to those determined by experiments. That is, in any case, the surface acoustic wave filter of this embodiment has better balance characteristics and a better filter characteristic than the conventional surface wave filter.

In this way, the influence by the parasitic component produced with the leading electrode from the balanced type terminal OUT1 can be substantially equalized with the influence by the parasitic component produced with the leading electrode from the balanced type terminal OUT2 by turning upside down the connection between the leading electrode 13 and the fifth IDT electrode 8 with respect to the connection between the leading electrode 14 and the sixth IDT electrode 9, and therefore degradation of balance characteristics can be prevented, thus making it possible to achieve an surface acoustic wave filter having good characteristics.

Figure 21:
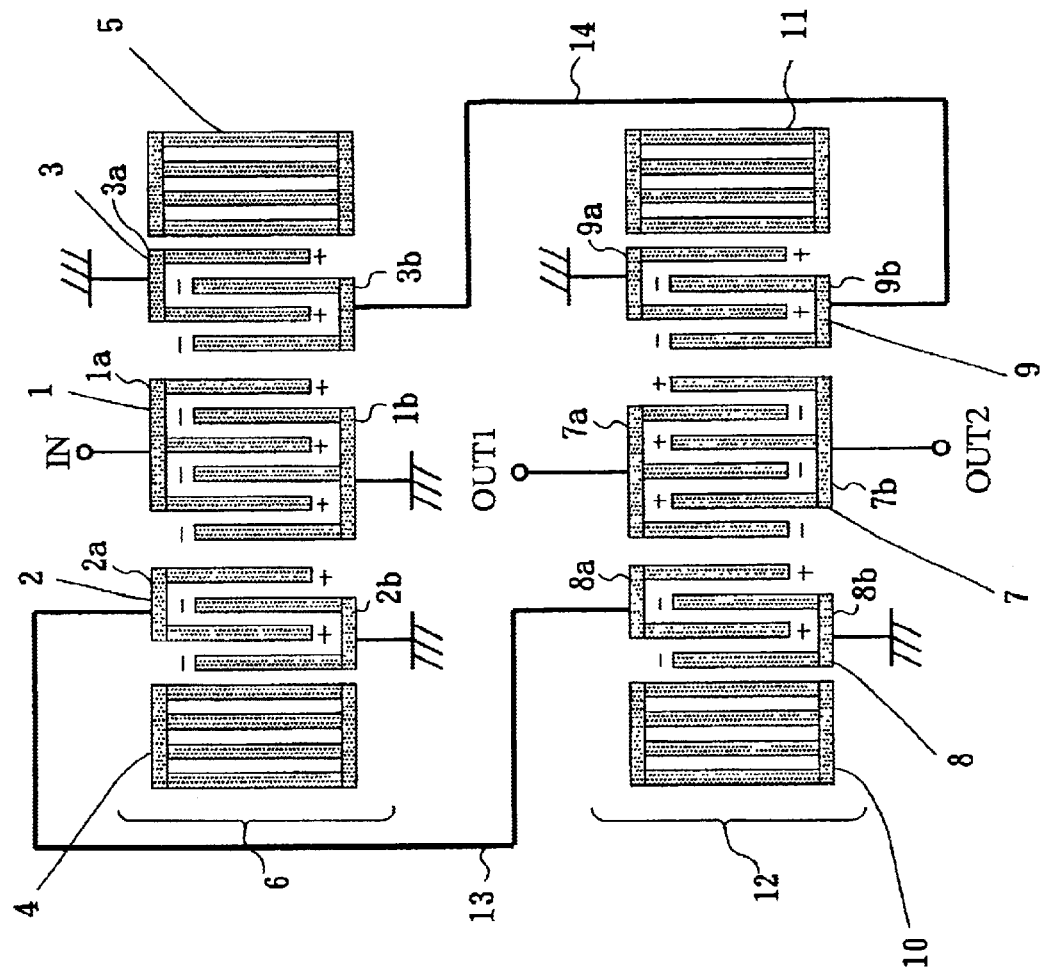
FIG. 21 illustrates how the IDT electrodes are arranged in Embodiment 7 of the present invention.
Figure 22:
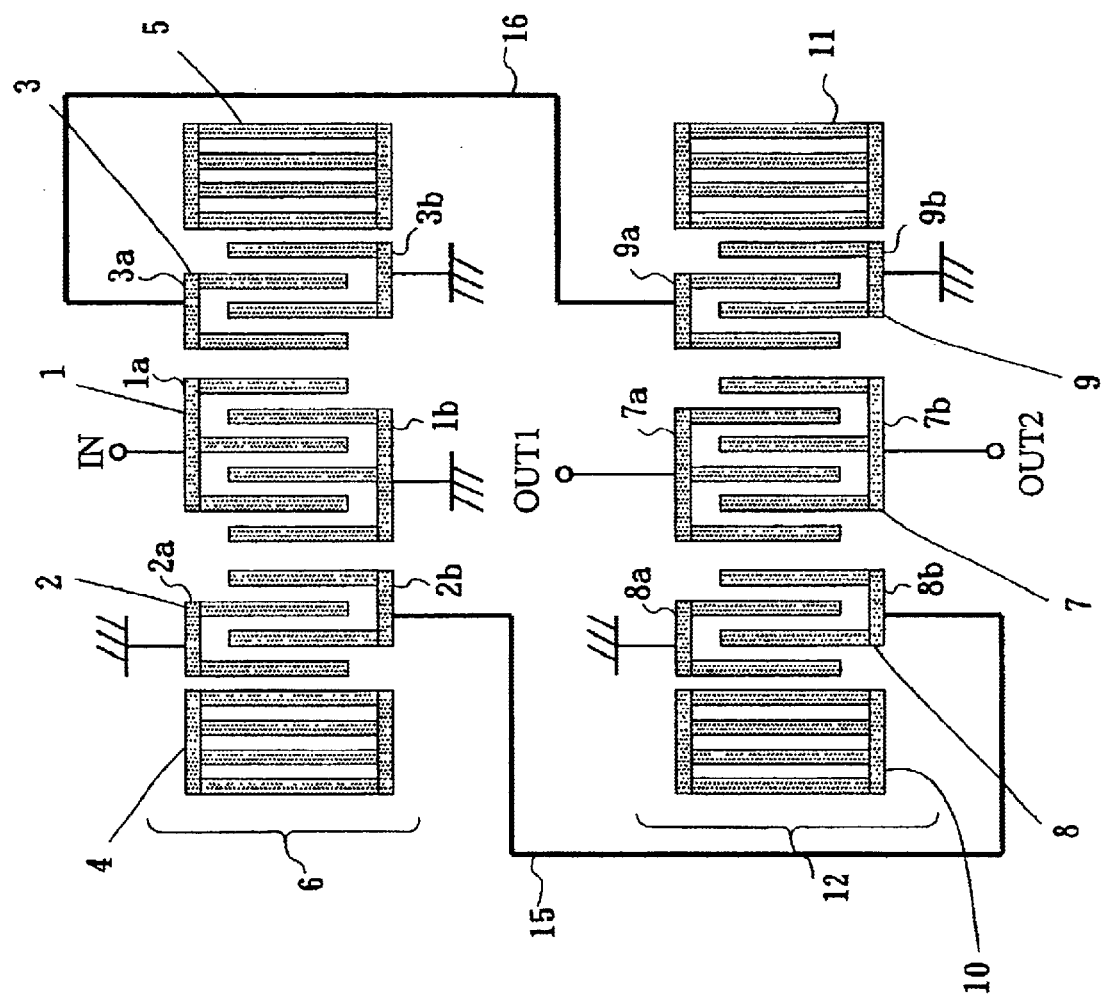
FIG. 22 is a schematic diagram of another surface acoustic wave filter in Embodiment 7 of the present invention.

Furthermore, the electrode fingers in each IDT electrode are arranged so that surface acoustic waves do not balance each other out. That is, given that the upper electrode 1a of the first IDT electrode 1 connected to the unbalanced type terminal IN is positive (+), and the lower electrode 1b of the first IDT electrode 1 grounded is negative (−), an arrangement with electrode fingers being identical in phase in terms of polarity is provided as shown in FIG. 21. Therefore, even the configuration shown in FIG. 22 makes it possible to achieve an effect equivalent to that of this embodiment, provided that the configuration is such that the arrangements of the electrode fingers do not allow the surface acoustic waves to be cancelled out. That is, FIG. 22 shows a configuration in which the arrangement of the upper electrodes 2a and 3a and the lower electrodes 2b and 3b of the second and third IDT electrodes 2 and 3 is shifted by one electrode finger, and the arrangement of the upper electrodes 8a and 9a and the lower electrodes 8b and 9b of the fourth and fifth IDT electrodes is shifted by one electrode finger. It also shows an configuration in which the lower electrode 2b of the second IDT electrode 2 is connected to the lower electrode 8b of the fifth IDT electrode 8 by the leading electrode 15, and the upper electrode 3a of the third IDT electrode 3 is connected to the upper electrode 9a of the sixth IDT electrode 9 by the leading electrode 16.

In this way, even the configuration in which the connections of the leading electrodes 13 and 14 of the surface acoustic wave filter of FIG. 14 are turned upside down makes it possible to achieve an effect equivalent to that of this embodiment. Furthermore, this is not a limiting case if the electrode is weighted. Here, weighting the electrode refers to the case where at least any one of electrode fingers is lead from an electrode located on the opposite side, while in the first IDT electrode 1 of FIG. 14, for example, the electrode finger lead from the upper electrode 1*a* and the electrode finger lead from the lower electrode 1*b* are arranged in an alternating manner.

Furthermore, in this embodiment, the signal is inputted to the unbalanced type terminal IN, and the signal is outputted from a pair of unbalanced type terminals OUT1 and OUT2, but this is not a limiting case. Even if the signal is inputted from a pair of balanced type terminals OUT1 and OUT2, and the signal is outputted from the unbalanced type terminal IN, an effect equivalent to that of this embodiment can be achieved.

Also, in this embodiment, the IDT electrodes and reflector electrodes are arranged so that the phase of the signal inputted to the leading electrode 13 is opposite to the phase of the signal inputted to the leading electrode 14, but this is not a limiting case. The IDT electrodes and reflector electrodes may be arranged so that the phase of the signal inputted to the leading electrode 13 is identical to the phase of the signal inputted to the leading electrode 14.

For the case where the IDT electrodes and reflector electrodes are arranged so that the phase of the signal inputted to the leading electrode 13 is identical to the phase of the signal inputted to the leading electrode 14, the filter characteristics of the surface acoustic wave filter of this embodiment and the filter characteristics of the conventional surface acoustic wave filter were determined by simulation and compared to each other.

For the conventional surface acoustic wave filter, the arrangements of the second and fifth IDT electrodes 2 and 8 were adjusted in the above described simulation conditions of FIG. 15, whereby the phase of the signal inputted to the leading electrode 32 was identical to the phase of the signal inputted to the leading electrode 33. Other simulation conditions are similar to those of FIG. 15.

Also, for the surface acoustic wave filter of this embodiment, the arrangements of the third and sixth IDT electrodes 3 and 9 were adjusted in the above described simulation conditions of FIG. 17, whereby the phase of the signal inputted to the leading electrode 13 was identical to the phase of the signal inputted to the leading electrode 14. Other simulation conditions are similar to those of FIG. 17.

Figure 28:
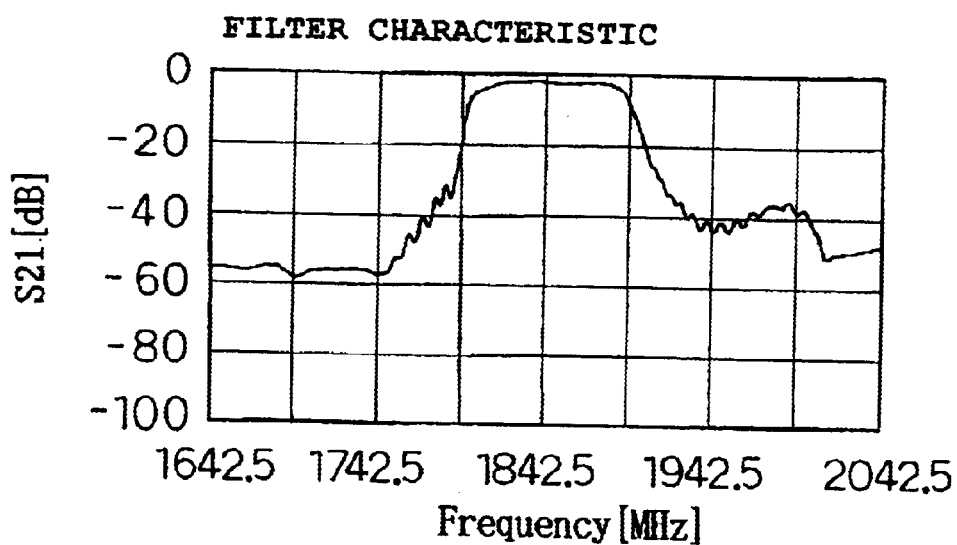
FIG. 28A shows the filter characteristic of the conventional surface acoustic wave filter determined by simulation when the phases of signals in leading electrodes are mutually identical.
FIG. 28B shows the phase balance of the conventional surface acoustic wave filter determined by simulation when the phases of signals in leading electrodes are mutually identical.
Figure 28:
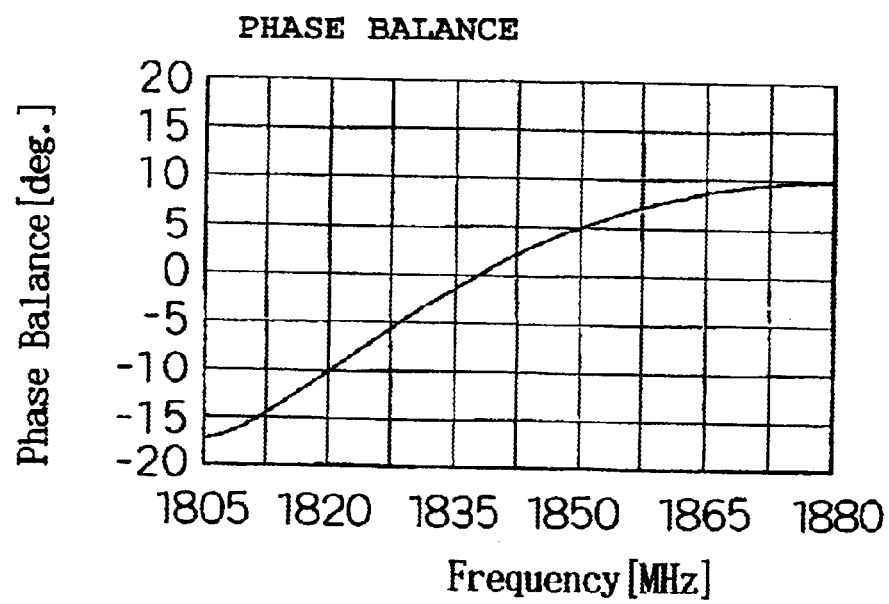

The filter characteristics of the conventional surface acoustic wave filter determined as a result of carrying out simulation under these simulation conditions are shown in FIG. 28. Specifically, FIG. 28A shows the filter characteristic of the conventional surface acoustic wave filter determined by simulation, and FIG. 28B shows the phase balance of the conventional surface acoustic wave filter determined by simulation.

Figure 29:
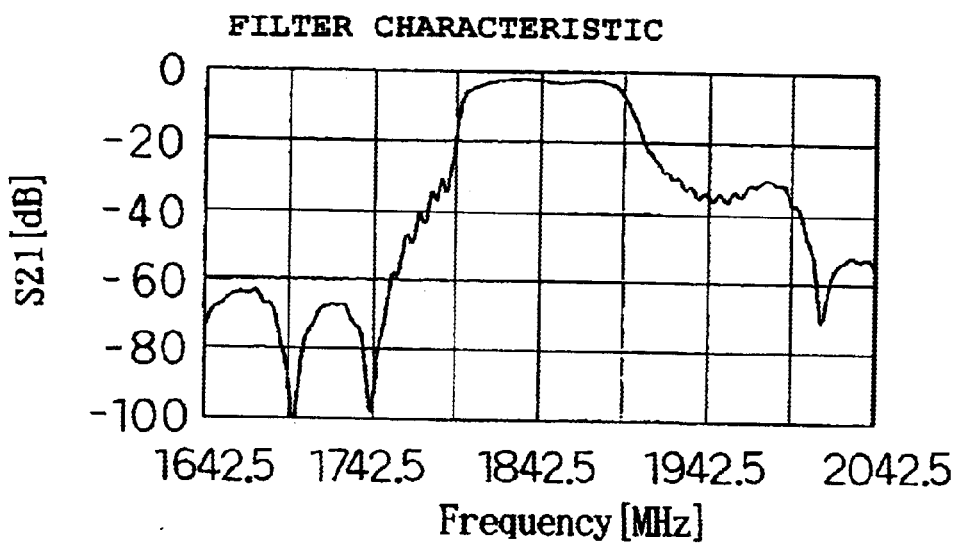
FIG. 29A shows the filter characteristic of the surface acoustic wave filter determined by simulation when the phases of signals in leading electrodes are mutually identical in Embodiment 7 of the present invention.
FIG. 29B shows the phase balance of the surface acoustic wave filter determined by simulation when the phases of signals in leading electrodes are mutually identical in Embodiment 7 of the present invention.
Figure 29:
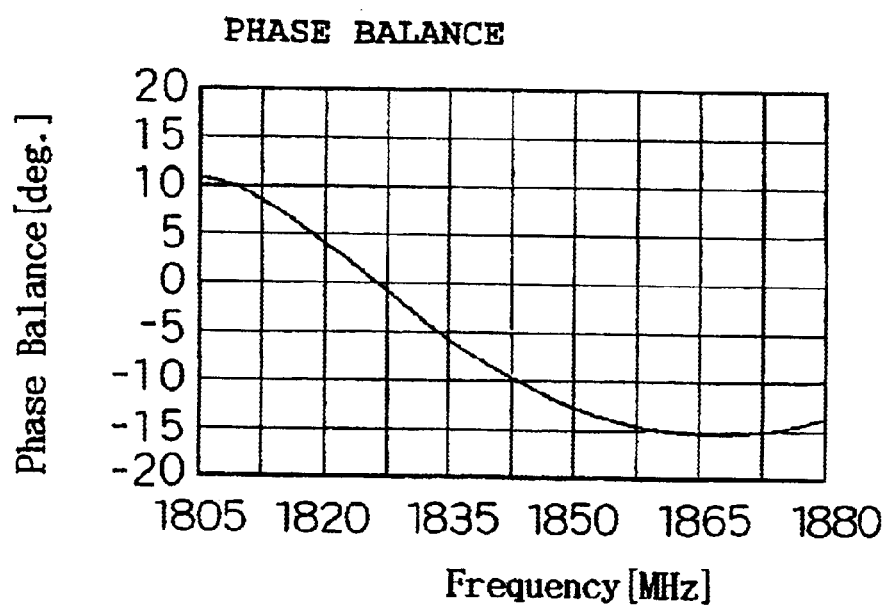

Also, the filter characteristics of the surface acoustic wave filter of this embodiment determined as a result of carrying out simulation under these simulation conditions are shown in FIG. 29. Specifically, FIG. 29A shows the filter characteristic of the surface acoustic wave filter of this embodiment determined by simulation, and FIG. 29B shows the phase balance of the surface acoustic wave filter of this embodiment determined by simulation.

If comparing FIG. 28 and FIG. 29, for the filter characteristic of the surface acoustic wave filter of this embodiment shown in FIG. 29A, the attenuation limit is obtained outside the passband, and there is a rapid attenuation outside the passband. For the filter characteristic of the conventional surface acoustic wave filter shown in FIG. 28A, on the other hand, the attenuation limit is not obtained outside the passband, and there is no rapid attenuation outside the passband.

Also, for the amplitude balance determined by simulation (not shown), it has been found that the surface acoustic wave filter of this embodiment is slightly superior to the conventional surface acoustic wave filter.

Also, the phase balance of the surface acoustic wave filter of this embodiment shown in FIG. 29B is superior to the phase balance of the conventional surface acoustic wave filter shown in FIG. 28B by about 2 degrees. In this way, the surface acoustic wave filter of this embodiment is still slightly superior in phase balance to the conventional surface acoustic wave filter.

In addition, when the filter characteristics of the surface acoustic wave filter of this embodiment shown in FIG. 29 are compared to the filter characteristics of FIG. 16 determined as a result of carrying out simulation of the conventional surface acoustic wave filter under the simulation conditions of FIG. 15, namely under the situation in which the signal phases for the leading electrodes are mutually opposite, the attenuation limit is obtained for the surface acoustic wave filter of this embodiment shown in FIG. 29 while the attenuation limit is not obtained for the filter characteristics of FIG. 16 so far as the filter characteristic is concerned, setting aside the amplitude balance and phase balance. Thus, for the filter characteristic, the surface acoustic wave filter of this embodiment where the phase of the signal inputted to the leading electrode 32 is identical to the phase of the signal inputted to the leading electrode 33 has apparently a better characteristic than the conventional surface acoustic wave filter in which the phases of signals inputted to the leading electrodes are mutually opposite.

In this way, even if the IDT electrodes and reflector electrodes are arranged so that the phase of the signal inputted to the leading electrode 13 is identical to the phase of the signal inputted to the leading electrode 14, a filter characteristic better than that of the conventional surface acoustic wave filter can be obtained.

(Embodiment 8)

Figure 23:
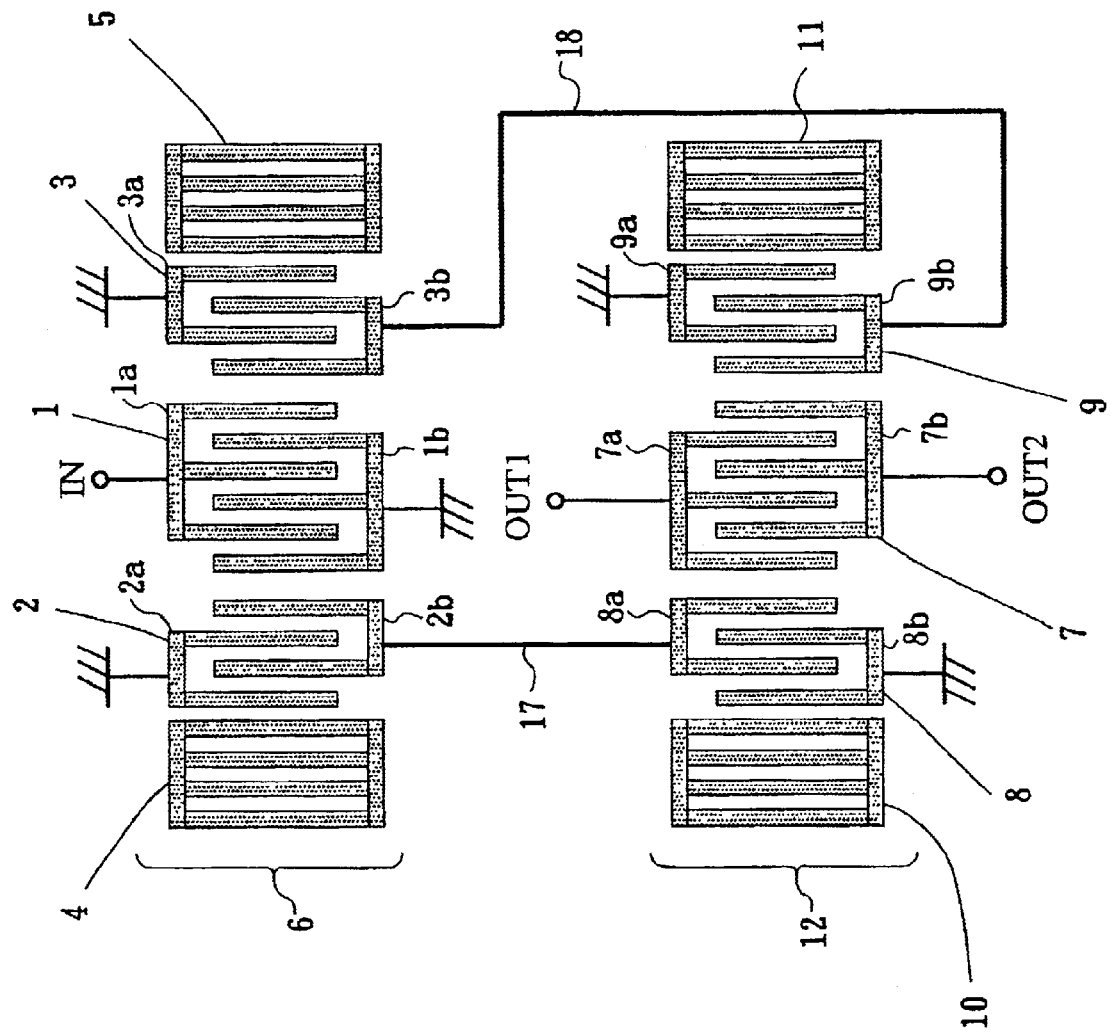
FIG. 23 is a schematic diagram of the surface acoustic wave filter in Embodiment 8 of the present invention.

The surface acoustic wave filter of Embodiment 8 of the present invention will be described below referring to the drawings. FIG. 23 is a schematic diagram of the surface acoustic wave filter in Embodiment 8.

The surface acoustic wave filter of this embodiment is a longitudinal mode type surface acoustic wave filter having unbalanced-balanced type input/output terminals as in the case of the aforementioned Embodiment 7.

Furthermore, the parts identical to those of the aforementioned Embodiment 7 in the surface acoustic wave filter of this embodiment are given the same symbols, and detailed description thereof are not presented.

In FIG. 23, the surface acoustic wave filter is constituted by the first-stage filter track 6 and the second-stage filter track 12 each placed on the piezoelectric substrate.

The first-stage filter track 6 comprises the first, second and third IDT electrodes 1, 2 and 3, and the first and second reflector electrodes 4 and 5. Also, the second-stage filter track 12 comprises the fourth, fifth and sixth IDT electrodes 7, 8 and 9, and the fourth and fifth reflector electrodes 10 and 11.

For the surface acoustic wave filter of this embodiment, unlike the surface acoustic wave filter described using FIG. 14 in the aforementioned Embodiment 7, the lower electrode 2*b* of the second IDT electrode 2 is connected to the upper electrode 8*a* of the fifth IDT electrode 8 by a leading electrode 17.

Other aspects are same as those of the aforementioned Embodiment 7.

Operations of this embodiment will now be described focusing on points of difference between this embodiment and the aforementioned Embodiment 7.

In this embodiment, the IDT electrodes are arranged in advance so that the phase of the signal inputted to the leading electrode 17 is opposite to the phase of the signal inputted to the leading electrode 18 as in the case of the aforementioned Embodiment 7.

In the aforementioned Embodiment 7, the leading electrode 13 is lead from the upper electrode 2a of the second IDT electrode 2, and therefore the leading electrode 13 is located in close vicinity to the leading electrode connecting the unbalanced type terminal IN to the upper electrode 1a of the first IDT electrode 1. Thus, in consideration of bonding between these leading electrodes, the leading electrode 17 and the leading electrode 18 are preferably lead from the lower electrode 2b of the second IDT electrode 2 and the lower electrode 3b of the third IDT electrode 3, respectively. That is, for the surface acoustic wave filter of this embodiment, both the leading electrodes 17 and 18 are located at greater distances from the leading electrode connecting the unbalanced type terminal IN to the upper electrode 1a of the first IDT electrode 1 compared to Embodiment 1. Thus, the influence of the parasitic component produced by the leading electrodes 17 and 18 with the leading electrode connecting the unbalanced type terminal IN to the upper electrode 1a of the first IDT electrode 1 is less significant compared to the aforementioned Embodiment 7.

In this way, the leading electrodes 17 and 18 are drawn so that bonding between themselves and the leading electrode connecting the unbalanced type terminal IN to the upper electrode 1a of the first IDT electrode 1 is reduced compared to the aforementioned Embodiment 7, thus making it possible to achieve an surface acoustic wave filter having good filter characteristics.

Furthermore, the electrode fingers in each IDT electrode are arranged so that surface acoustic waves do not balance each other out as in the case of aforementioned Embodiment 7.

Figure 24:
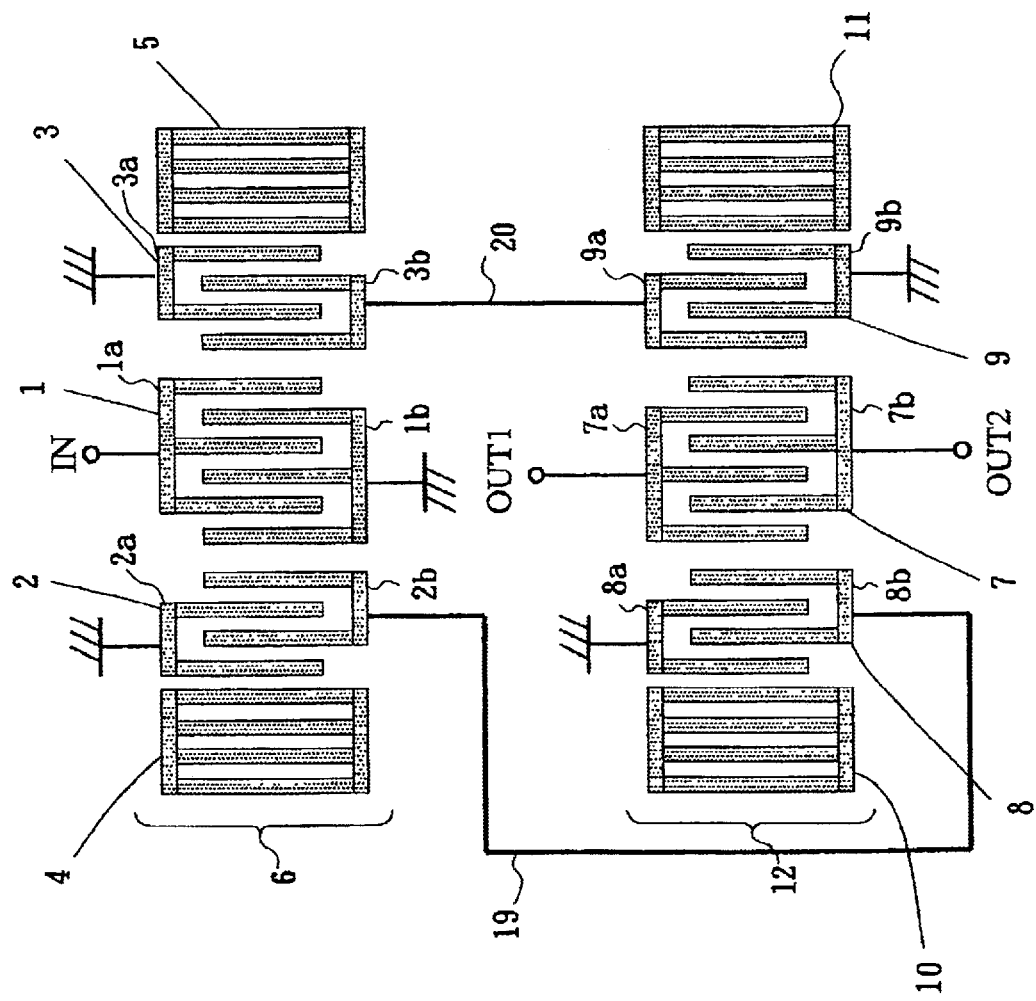
FIG. 24 is a schematic diagram of another surface acoustic wave filter in Embodiment 8 of the present invention.

Therefore, even the configuration shown in FIG. 24 makes it possible to achieve an effect equivalent to that of this embodiment, provided that the configuration is such that the arrangements of the electrode fingers do not allow the surface acoustic waves to be cancelled out. That is, FIG. 24 shows a configuration in which the arrangement of the upper electrodes 8a and 9a and the lower electrodes 8b and 9b of the fourth and fifth IDT electrodes 8 and 9 is shifted by one electrode finger. It also shows a configuration in which the lower electrode 2b of the second IDT electrode 2 is connected to the lower electrode 8b of the fifth IDT electrode 7 by a leading electrode 19, and the lower electrode 3b of the third IDT electrode 3 is connected to the upper electrode 9a of the sixth IDT electrode 9 by a leading electrode 20.

In this way, even if the connection of the leading electrodes 17 and 18 of the surface acoustic wave filter of FIG. 23 is turned upside down, an effect equivalent to that of this embodiment can be achieved.

(Embodiment 9)

Figure 25:
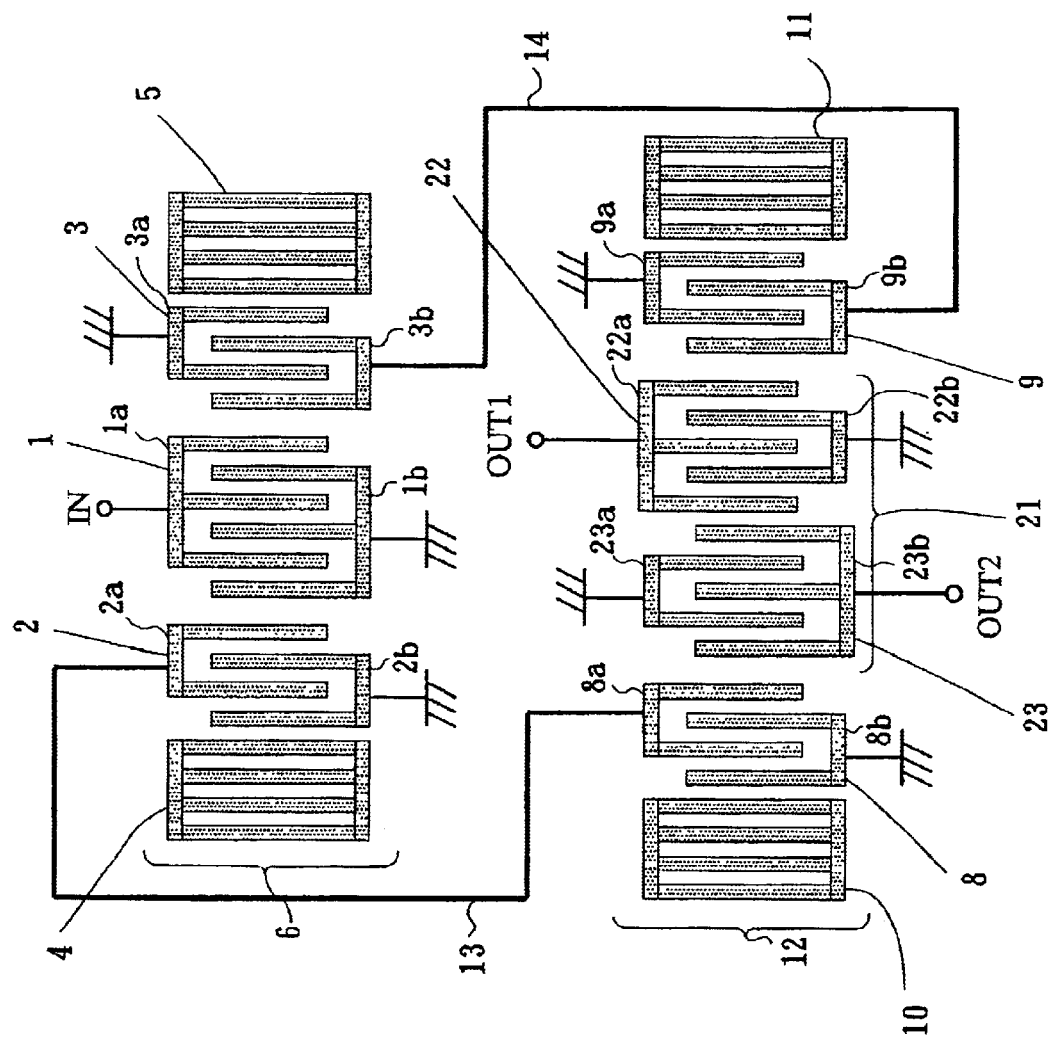
FIG. 25 is a schematic diagram of the surface acoustic wave filter in Embodiment 9 of the present invention.

The surface acoustic wave filter of Embodiment 9 of the present invention will be described below referring to the drawings. FIG. 25 is a schematic diagram of the surface acoustic wave filter in Embodiment 9.

The surface acoustic wave filter of this embodiment is a longitudinal mode type surface acoustic wave filter having unbalanced-balanced type input/output terminals as in the case of the aforementioned Embodiment 7.

The parts identical to those of the aforementioned Embodiment 7 in the surface acoustic wave filter of this embodiment are given the same symbols, and detailed description thereof are not presented.

Furthermore, a fourth IDT electrode 21 corresponds to the first IDT electrode of the present invention.

In FIG. 25, the surface acoustic wave filter is constituted by the first-stage filter track 6 and the second-stage filter track 12 each placed on the piezoelectric substrate.

The first-stage filter track 6 comprises the first, second and third IDT electrodes 1, 2 and 3, and the first and second reflector electrodes 4 and 5 as in the case of the aforementioned Embodiment 7. Also, the second-stage filter track 12 comprises the fourth, fifth and sixth IDT electrodes 21, 8 and 9, and the fourth and fifth reflector electrodes 10 and 11 as in the case of the aforementioned Embodiment 7.

For the surface acoustic wave filter of this embodiment, unlike the aforementioned Embodiment 7, the fourth IDT electrode 21 is divided into a first segmented IDT electrode 22 and a second segmented IDT electrode 23.

That is, the upper electrode 22a located on the side of the first-stage filter track 6, of the upper electrode 22a and lower electrode 22b of the first segmented IDT electrode 22, is connected to the balanced type terminal OUT1 of a pair of balanced type terminals. Also, the lower electrode 22b located on the side opposite to the first-stage filter track 6, of the upper electrode 22a and lower electrode 22b of the first segmented IDT electrode 22, is grounded.

Also, the lower electrode 23b located on the side opposite to the first filter track 6, of the upper electrode 23a and lower electrode 23b of the second segmented IDT electrode 23, is connected to the balanced type terminal OUT2 of a pair of balanced type terminals. The upper electrode 23a located on the side of the first filter track 6, of the upper electrode 23a and lower electrode 23b of the second segmented IDT electrode 23, is grounded.

Other aspects are same as the aforementioned Embodiment 7.

Operations of this embodiment will now be described focusing on points of difference between this embodiment and the aforementioned Embodiment 7.

For the surface acoustic wave filter of this embodiment, the fourth IDT electrode 21 is divided into the first segmented IDT electrode 22 and the second segmented IDT electrode 23, thereby making it possible to secure isolation between the balanced type terminal OUT1 and the balanced type terminal OUT2.

Also, provided that the number of electrode fingers is fixed, the number of widths of arms is fixed, and the central pitch between adjacent electrode fingers is fixed in the fourth IDT electrode 21, the impedances of the balanced type terminal OUT1 and the balanced type terminal OUT2 are higher when the fourth IDT electrode 21 is divided into the first segmented IDT electrode 22 and the second segmented IDT electrode 23 than when the fourth IDT electrode 21 is not divided. Therefore, by dividing the fourth IDT electrode 21 into the first segmented IDT electrode 22 and the second segmented IDT electrode 23, an surface acoustic wave filter can be achieved in which the filter characteristic of the filter is substantially unchanged, and the output impedances of the balanced type terminals OUT1 and OUT2 are high, with conditions such as the number of electrode fingers of the fourth IDT electrode 21 being fixed.

Furthermore, in the surface acoustic wave filter of this embodiment, the upper electrode 4a of the second IDT electrode 4 is connected to the upper electrode 8a of the fifth IDT electrode 8 by the leading electrode 13, and the lower electrode 3b of the third IDT electrode 3 is connected to the lower electrode 9b of the sixth IDT electrode 9 by the leading electrode 14, but this is not a limiting case. The lower electrode 2b of the second IDT electrode 2 may be connected to the lower electrode 8b of the fifth IDT electrode 8 by the leading electrode 13, and the upper electrode 3a of the third IDT electrode 3 may be connected to the upper electrode 9a of the sixth IDT electrode 9 by the leading electrode 14. Furthermore, in this case, each surface acoustic wave filter is arranged so that surface acoustic waves do not balance each other out.

Also, as described in the aforesaid Embodiment 8, the leading electrode 13 may be drawn from the lower electrode 2b of the second IDT electrode 2 in the first-stage filter track 6. In this case, the influence of the parasitic component produced with the leading electrode connecting the unbalanced type terminal IN to the upper electrode 1a of the first IDT electrode 1 can be decreased.

Also, in a similar way, the third IDT electrode of the surface acoustic wave filter described in the aforementioned Embodiment 8 maybe divided into a first segmented IDT electrode 22 and a second segmented IDT electrode 23 as in the case of the fourth IDT electrode 21 of this embodiment.

(Embodiment 10)

Figure 26:
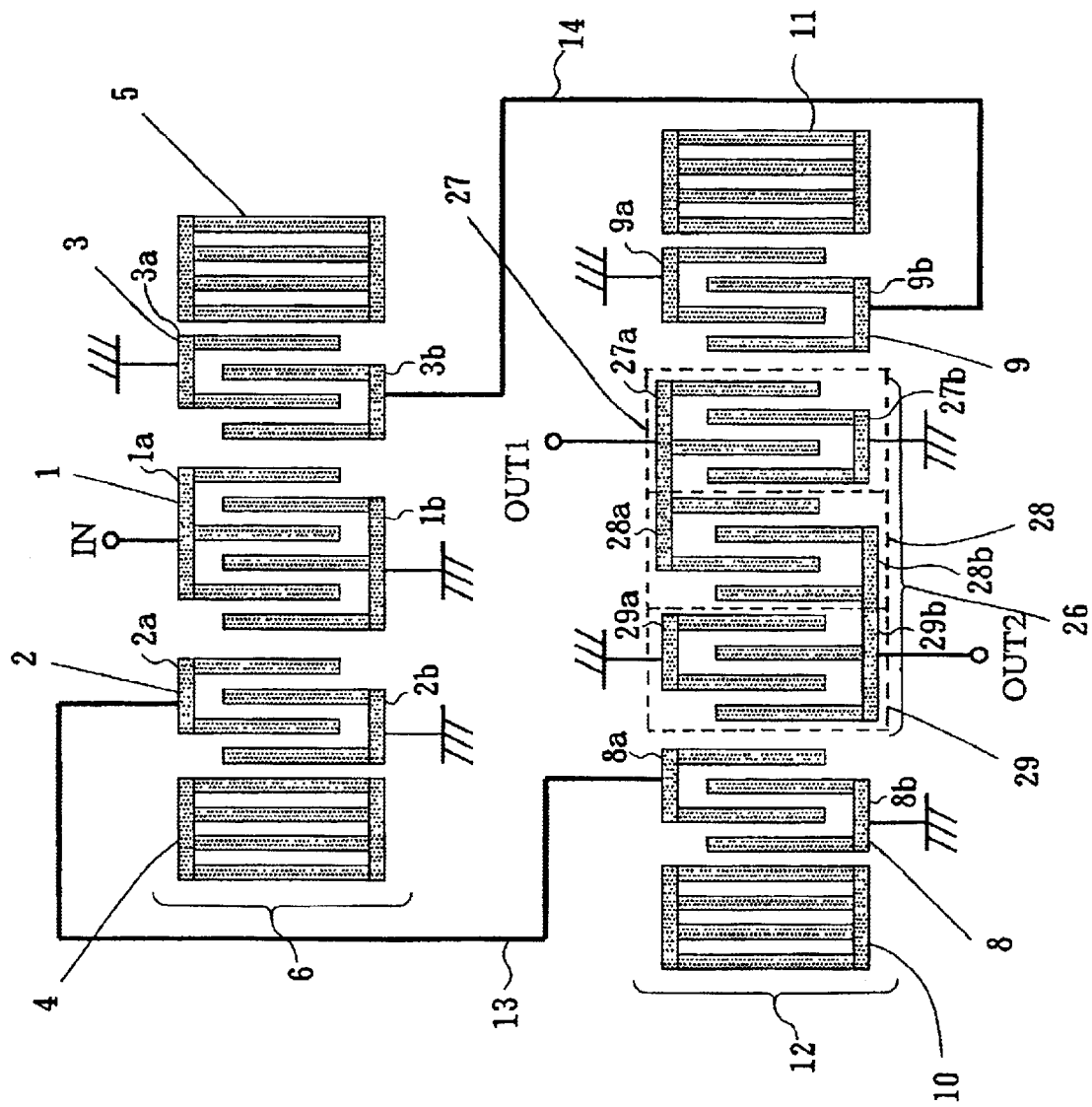
FIG. 26 is a schematic diagram of the surface acoustic wave filter in Embodiment 10 of the present invention.

The surface acoustic wave filter of Embodiment 10 of the present invention will be described below referring to the drawings. FIG. 26 is a schematic diagram of the surface acoustic wave filter in Embodiment 10.

The surface acoustic wave filter of this embodiment is a longitudinal mode type surface acoustic wave filter having unbalanced-balanced type input/output terminals as in the case of the aforementioned Embodiment 9.

The parts identical to those of the aforementioned Embodiment 9 in the surface acoustic wave filter of this embodiment are given the same symbols, and detailed description thereof are not presented.

Furthermore, a fourth IDT electrode 26 corresponds to the first IDT electrode of the present invention.

In FIG. 26, the surface acoustic wave filter is constituted by the first-stage filter track 6 and the second-stage filter track 12 each placed on the piezoelectric substrate.

The first-stage filter track 6 comprises the first, second and third IDT electrodes 1, 2 and 3, and the first and second reflector electrodes 4 and 5 as in the case of the aforementioned Embodiment 7. Also, the second-stage filter track 12 comprises the fourth, fifth and sixth IDT electrodes 26, 8 and 9, and the fourth and fifth reflector electrodes 10 and 11 as in the case of the aforementioned Embodiment 7.

For the surface acoustic wave filter of this embodiment, unlike the aforementioned Embodiment 9, the fourth IDT electrode 26 is divided into a first segmented IDT electrode 27, a second segmented IDT electrode 28 and a third segmented IDT electrode 29.

That is, the upper electrode 27a located on the side of the first-stage filter track 6, of the upper electrode 27a and lower electrode 27b of the first segmented IDT electrode 27, is connected to the balanced type terminal OUT1 of a pair of balanced type terminals. Also, the lower electrode 27b located on the side opposite to the first-stage filter track 6, of the upper electrode 27a and lower electrode 27b of the first segmented IDT electrode 27, is grounded.

Also, the upper electrode 28a located on the side of the first-stage filter track 6, of the upper electrode 28a and lower electrode 28b of the second segmented IDT electrode 28, is connected to the upper electrode 27a of the first segmented IDT electrode 27. The lower electrode 28b located on the side opposite to the first-stage filter track 6, of the upper electrode 28a and the lower electrode 28b of the second segmented IDT electrode 28, is connected to the lower electrode 29b located on the side opposite to the first-stage filter track 6, of the upper electrode 29a and the lower electrode 29b of the third segmented IDT electrode 29.

Also, the upper electrode 29a located on the side of the first-stage filter track 6, of the upper electrode 29a and the lower electrode 29b of the third segmented IDT electrode 29, is grounded. Also, the lower electrode 29b of the third segmented IDT electrode 29 is connected to the balanced type terminal OUT2 of a pair of balanced type terminals.

Other aspects are same as the aforementioned Embodiment 9.

Operations of this embodiment will now be described focusing on points of difference between this embodiment and the aforementioned Embodiment 9.

Provided that the number of electrode fingers is fixed, the number of widths of arms is fixed, and the central pitch between adjacent electrode fingers is fixed in the fourth IDT electrode 26, the impedances of the balanced type terminal OUT1 and the balanced type terminal OUT2 are higher when the fourth IDT electrode 26 is divided into the first segmented IDT electrode 27, the second segmented IDT electrode 28 and the third segmented IDT electrode 29 than when the fourth IDT electrode 26 is not divided. Therefore, by dividing the fourth IDT electrode 26 into the first segmented IDT electrode 27, the second segmented IDT electrode 28 and the third segmented IDT electrode 29, an surface acoustic wave filter can be achieved in which the output impedances of the balanced type terminals OUT1 and OUT2 are high, if conditions such as the number of electrode fingers of the fourth IDT electrode 28 are fixed. In addition, if conditions such as the number of electrode fingers of the fourth IDT electrode 26 are fixed, the surface acoustic wave filter in which the fourth IDT electrode 28 is divided has characteristics substantially identical to those of the surface acoustic wave filter in which the fourth IDT electrode 28 is not divided.

Therefore, by dividing the fourth IDT electrode 28, an surface acoustic wave filter with increased impedances of the balanced type terminals OUT1 and OUT2 can be achieved without changing the filter characteristics by dividing the fourth IDT electrode 28.

In addition, by adjusting the ratios of the number of electrode fingers of the second segmented IDT electrode 28 to the numbers of electrode fingers of the first and third segmented IDT electrodes 27 and 29, the impedances of the balanced type terminals OUT1 and OUT2 can be adjusted.

In this way, by dividing the fourth IDT electrode 26, the impedance can be controlled.

Furthermore, as described in the aforementioned Embodiment 8, the leading electrode 13 may be drawn from the lower electrode 2b of the second IDT electrode 2 in the first-stage filter track 6. In this case, the influence of the parasitic component between the leading electrode 13 and the leading electrode connecting the unbalanced type terminal IN to the upper electrode 1a of the first IDT electrode 1 can be reduced.

Furthermore, in Embodiments 7 to 10, the fourth segmented IDT electrode is divided into segmented IDT electrodes, but this is not a limiting case, and all or some of the first, second, third, fourth, fifth and sixth IDT electrodes may be divided into segmented IDT electrodes. If the first IDT electrode is divided into segmented IDT electrodes, an surface acoustic wave filter in which the impedance of the unbalanced type terminal IN is increased can be achieved.

Also, in Embodiments 7 to 10, the number of segmented IDT electrodes into which the IDT electrode is divided is 2 or 3, but the IDT electrode may be divided into four or more of segmented IDT electrodes.

Also, in Embodiments 7 to 10, the unbalanced type electrode IN is located on the side of the upper electrode 1a of the first IDT electrode 1: namely it is located on the side opposite to the second-stage filter track 12 in the first-stage filter track 6, and the upper electrode 1a of the first IDT electrode 1 is connected to the unbalanced type terminal IN, but this is not a limiting case. The configuration is also possible in which the unbalanced type terminal IN is located on the side of the lower electrode 1b of the first IDT electrode 1: namely it is located on the side of the second-stage filter track 12 in the first-stage filter-track 6, and the lower electrode 1b of the first IDT electrode 1 is connected to the unbalanced type terminal IN. The configuration is also possible in which the unbalanced type terminal IN is located on the side of the upper electrode 1a of the first IDT electrode 1, and the lower electrode 1b of the first IDT electrode 1 is connected to the unbalanced type electrode IN. The configuration is also possible in which the unbalanced type terminal IN is located on the side of the lower electrode 1b of the first IDT electrode 1, and the upper electrode 1a of the first IDT electrode 1 is connected to the unbalanced type terminal IN.

Also, in Embodiments 7 to 10, the upper electrode 1a of the first IDT electrode 1 is connected to the unbalanced type terminal IN, but this is not a limiting case. For these surface acoustic wave filters, the upper electrode 1a and the lower electrode 1b of the first IDT electrode 1 may be connected to one and the other balanced type terminal of a pair of terminals different from the pair of balanced type terminals OUT1 and OUT2, respectively. In this case, a balanced-balanced type surface acoustic wave filter is obtained. Then, the parasitic component between the leading electrode lead from one of the different pair of balanced type terminals and the leading electrode connecting the first-stage filter track 6 to the second-stage filter track 12 is equivalent to the parasitic component between the leading electrode lead from the other balanced type terminal of the different pair of balanced type terminals and the leading electrode connecting the first-stage filter track 6 to the second-stage filter track 12, and therefore a similar effect can be achieved.

Also, in Embodiments 7 to 10, the second-stage filter track 12 is located below the first-stage filter track 6, but this is not a limiting case, and the second-stage filter track 12 may be located above the first-stage filter track 6 without changing connections by leading electrode between the IDT electrodes and the unbalanced type terminal IN and a pair of balanced type terminals.

Also, in Embodiments 7 to 10, the electrode with no leading electrode connected thereto, of the upper electrode 2a and the lower electrode 2b of the second IDT electrode 2, is grounded, and the electrode with no leading electrode connected thereto, of the upper electrode 3a and the lower electrode 3b of the third IDT electrode 3, is grounded, but this is not a limiting case. If the phase of the signal passing through the leading electrode connected to the second IDT electrode 2 is opposite to the phase of the signal passing through the leading electrode connected to the third IDT electrode 3, these electrodes may be electrically connected instead of grounding them.

Also, in Embodiments 7 to 10, the electrode with no leading electrode connected thereto, of the upper electrode 8a and the lower electrode 8b of the fifth IDT electrode 8, is grounded, and the electrode with no leading electrode connected thereto, of the upper electrode 9a and the lower electrode 9b of the sixth IDT electrode 9, is grounded, but this is not a limiting case. If the phase of the signal passing through the leading electrode connected to the fifth IDT electrode 8 is opposite to the phase of the signal passing through the leading electrode connected to the sixth IDT electrode 9, these electrodes may be electrically connected instead of grounding them.

(Embodiment 11)

Figure 30:
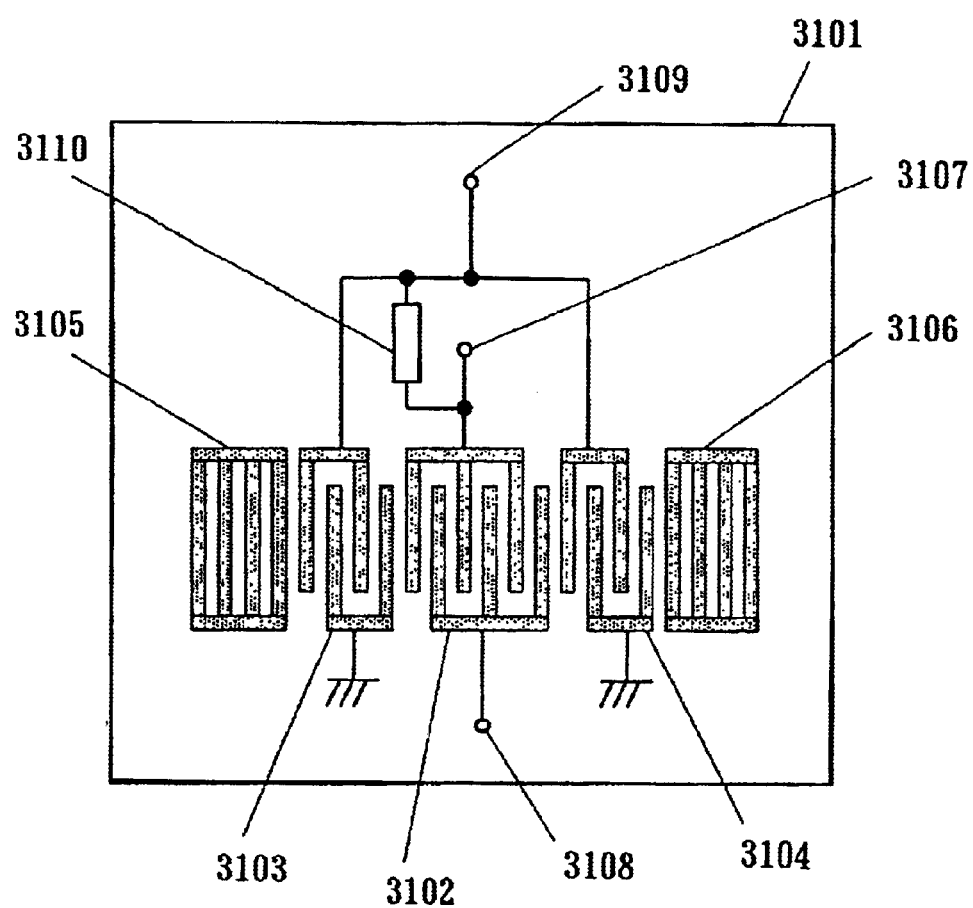
FIG. 30 is a block diagram of the surface acoustic wave filter in Embodiment 11 of the present invention.

The surface acoustic wave filter of Embodiment 11 of the present invention will be described below, referring to mainly FIG. 30.

Furthermore, a first IDT electrode 3102 corresponds to the first IDT electrode of the present invention, a second IDT electrode 3103 corresponds to the second IDT electrode of the present invention, and a third IDT electrode 3104 corresponds to the third IDT electrode of the present invention. Also, a first reflector electrode 3105 and a second reflector electrode 3106 correspond to the reflector electrodes of the present invention. Also, one of balanced type terminals 3107 corresponds to one of the first balanced type terminals of the present invention, and an unbalanced type terminal 3109 corresponds to the unbalanced type terminal of the present invention. Also, a reactance element 3110 corresponds to the reactance element of the present invention.

Before the configuration of the surface acoustic wave filter (FIG. 30) is described, discussions will be made on what cause degradation of the balance characteristic of the surface acoustic wave filter. For the surface acoustic wave filter requiring characteristics covering a wide band, which is used in the RF stage, piezoelectric substrates made of tantalum lithiumate ($LiTaO_3$) and niobium lithiumate ($LiNbO_3$) are generally used, and the effective dielectric constants of these plates are large with their values equal to about 48 and 49, respectively. Here, using relative dielectric constant tensors $\epsilon_{11}^T$ and $\epsilon_{33}^T$, the effective relative dielectric constant is defined by the following formula:

[Formula 1]

$$((\epsilon_{11}^T) \times (\epsilon_{33}^T))^{+e,fra} 1/2 + ee$$

Figure 40:
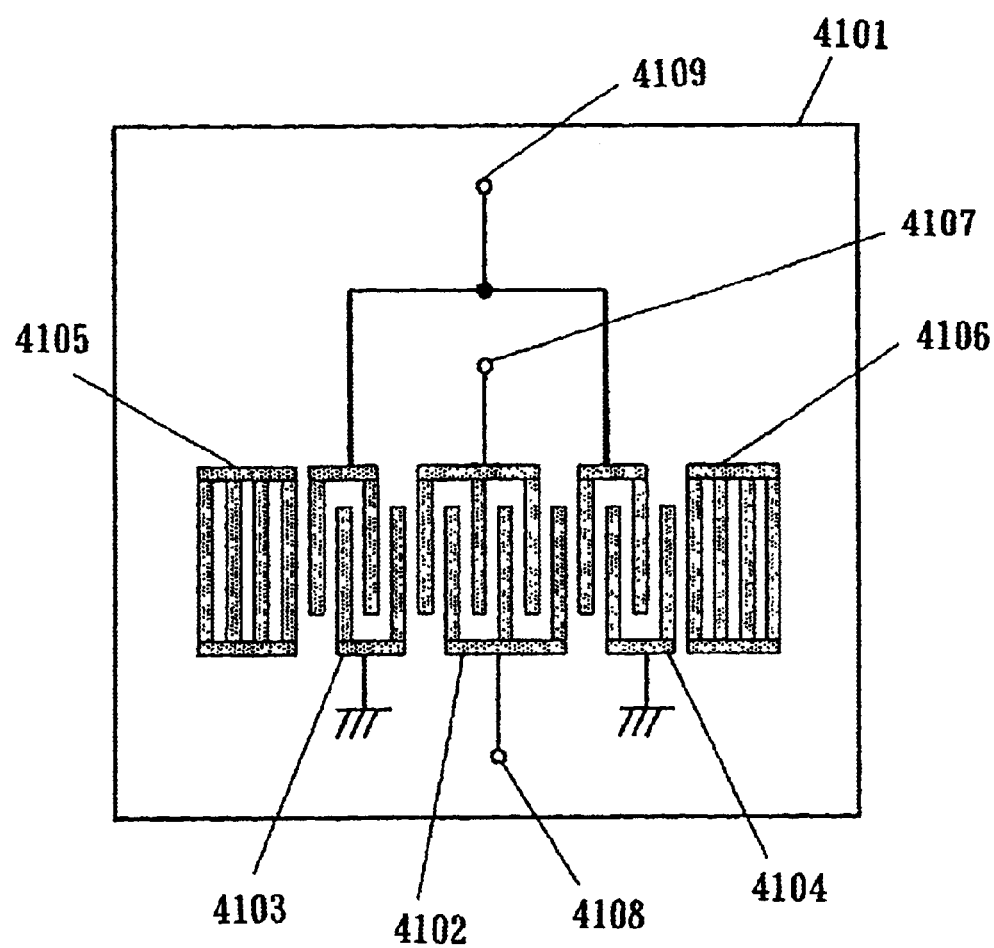
FIG. 40 is a block diagram of the conventional surface acoustic wave filter.
Figure 41:
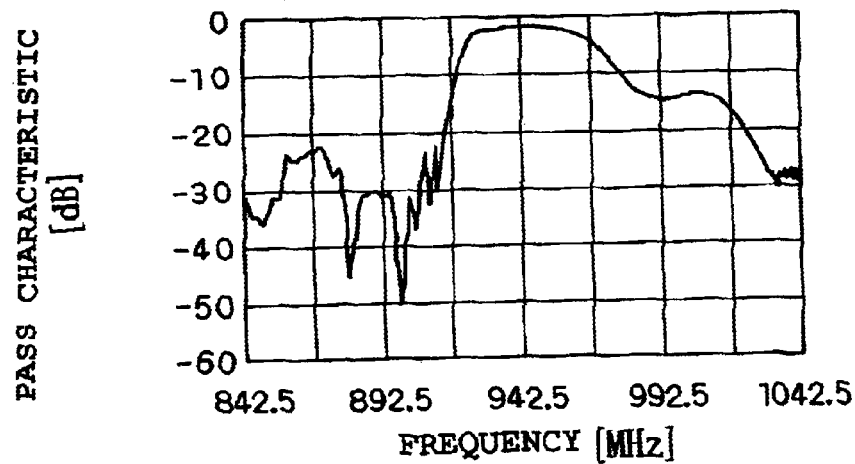
FIG. 41A shows the pass characteristic of the conventional surface acoustic wave filter.
FIG. 41B shows the amplitude balance characteristic of the conventional surface acoustic wave filter.
FIG. 41C shows the phase balance characteristic of the conventional surface acoustic wave filter.
Figure 41:
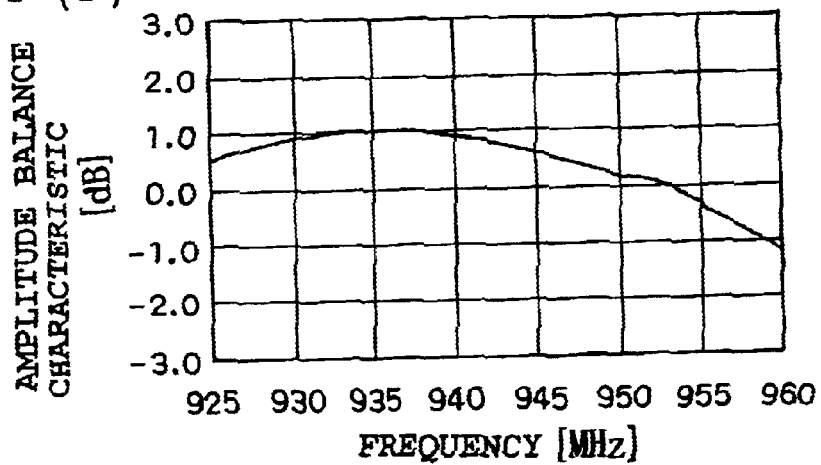
Figure 41:
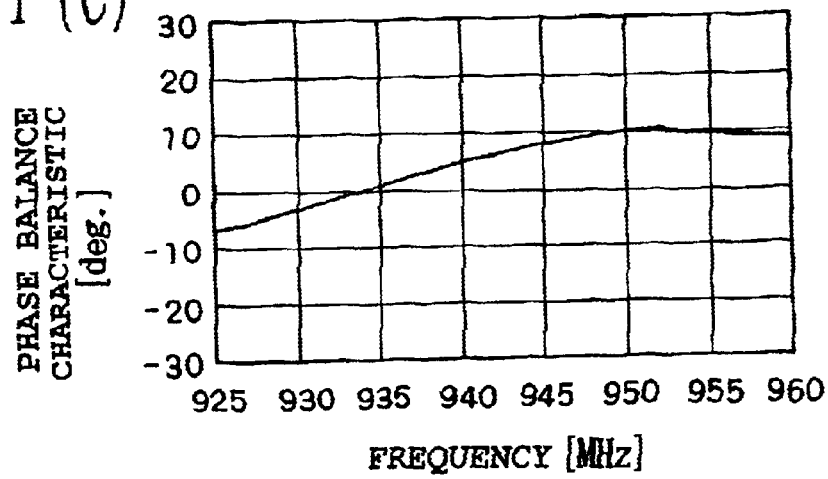
Figure 43:
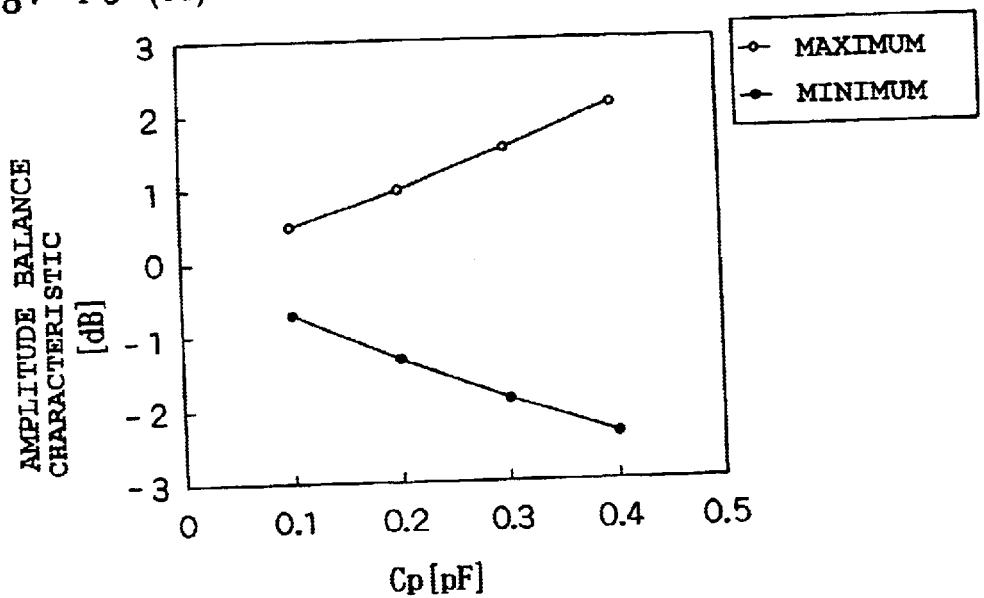
FIG. 43 shows the amplitude and phase balance characteristics of the surface acoustic wave filter.
Figure 43:
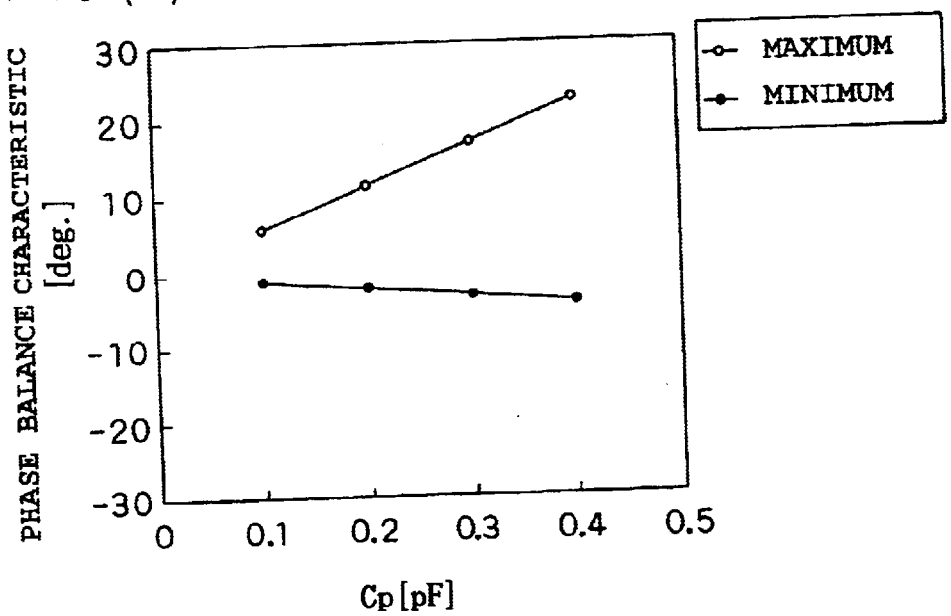

In the surface acoustic wave filter, because of the large effective dielectric constant of the piezoelectric substrate, not only spatial bonding between IDT electrodes but also bonding due to parasitic components between IDT electrodes in the piezoelectric substrate occurs, and in addition thereto, parasitic components are generated in wirings required for connecting IDT electrodes to terminals, and the like. Hitherto, improvements of balance characteristics by reducing unbalanced parasitic components between wirings have been described in various ways, and a configuration in contemplation of these parasitic components is shown in FIG. 42. The configuration of FIG. 42 has a capacitance component 4301 provided between IDT electrodes as a parasitic component for the surface acoustic wave filter of FIG. 40. The results of carrying out analyses for filters in the 900 MHz band with the capacitance value of the capacitance component 4301 being changed in the configuration shown in FIG. 41 are shown in FIG. 43. $LiTaO_3$ is used as a piezoelectric substrate.

FIGS. 43A and 43B show the maximum and minimum values of the amplitude and phase balance characteristics in the passband, respectively. As shown in FIGS. 43A and 43B, the balance characteristic becomes poorer as the capacitance value increases. That is, it has been demonstrated that as the bonding between IDT electrodes by the parasitic component is strengthened, the balance characteristic of the surface acoustic wave filter becomes poorer.

The configuration of the surface acoustic wave filter allowing the aforementioned degradation in balance characteristic to be improved will now be described. The configuration of the longitudinal mode type surface acoustic wave filter having balanced type terminals according to the present invention is shown in FIG. 30. In FIG. 30, the surface acoustic wave filter comprises first, second and third interdigital transducer electrodes 3102, 3103 and 3104 (hereinafter referred to as IDT electrodes), and first and second reflector electrodes 3105 and 3106 on a piezoelectric substrate 3101.

One electrode finger of the first IDT electrode 3102 is connected to one of balanced type terminals 3107, and the other electrode finger of the first IDT electrode 3102 is connected to the other balanced type terminal 3108. Also, the electrode fingers of the second and third IDT electrodes 3103 and 3104 on one side are connected to an unbalanced type terminal 3109, and the electrode fingers on the other side are grounded. In addition, the first IDT electrode is connected to the second and third IDT electrodes 3103 and 3104 with a reactance element 3110 therebetween. In this case, the reactance element is located between one of balanced type terminals 3107 and the unbalanced type terminal 3109. The above configuration makes it possible to obtain an surface acoustic wave filter having unbalanced-balanced type terminals.

Figure 31:
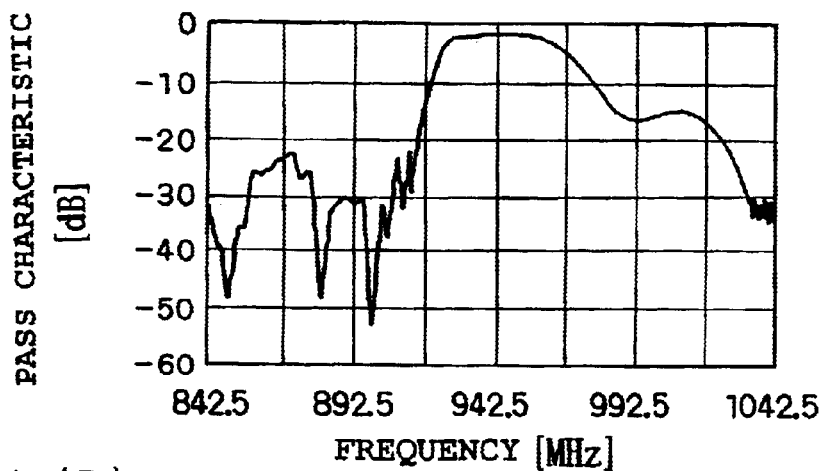
FIG. 31A shows the pass characteristic of the surface acoustic wave filter in Embodiment 11 of the present invention.
FIG. 31B shows the amplitude balance characteristic of the surface acoustic wave filter in Embodiment 11 of the present invention.
FIG. 31C shows the phase balance characteristic of the surface acoustic wave filter in Embodiment 11 of the present invention.
Figure 31:
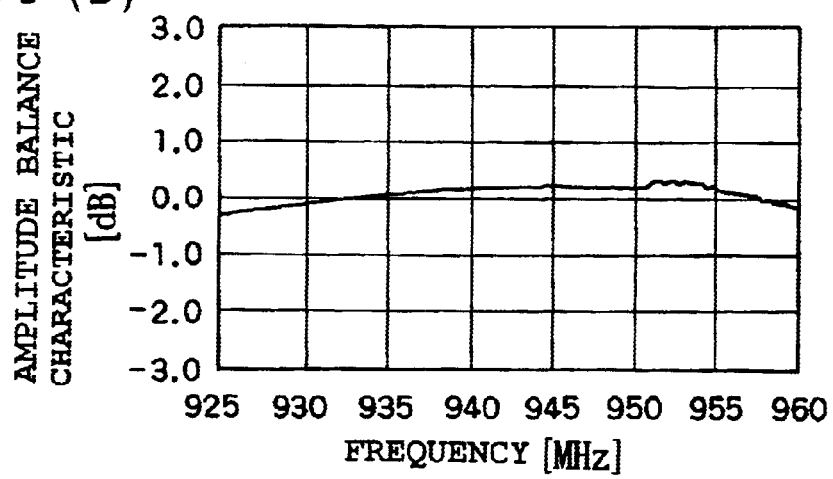
Figure 31:
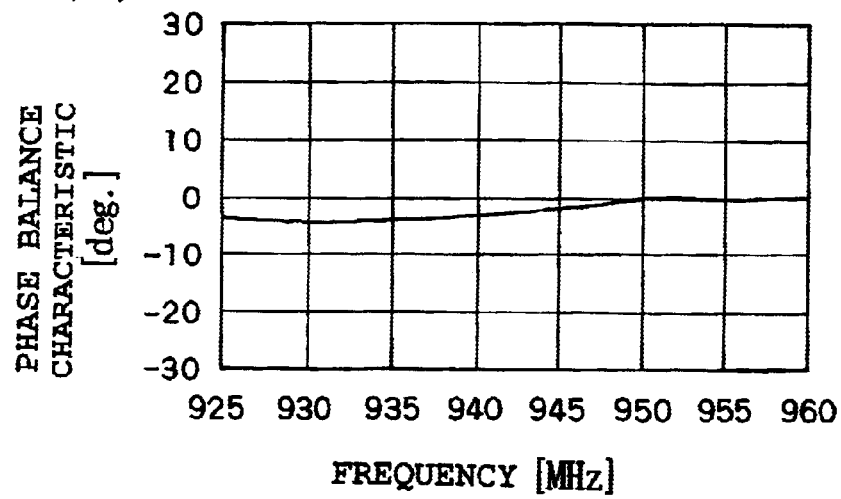

Shown in FIG. 31 is the characteristic of the surface acoustic wave filter in which an inductor is placed as a reactance element. LiTaO$_3$ is used as a piezoelectric substrate. In addition, the surface acoustic wave filter is set so that the resonance frequency of the parallel resonance formed by parasitic components such as bonding between IDT electrodes and spatial bonding, and the placed inductance falls within the passband. In FIG. 31, FIG. 31A shows a pass characteristic, FIG. 31B shows an amplitude balance characteristic in the passband, and FIG. 31C shows a phase balance characteristic in the passband. As apparent from FIG. 31, the amplitude balance characteristic is −0.2 dB to +0.2 dB, and the phase balance characteristic is −4° to +1° in the passband, and thus the balance characteristics are improved without degrading the pass characteristic, compared to the characteristics of the surface acoustic wave filter of FIG. 41.

Figure 32:
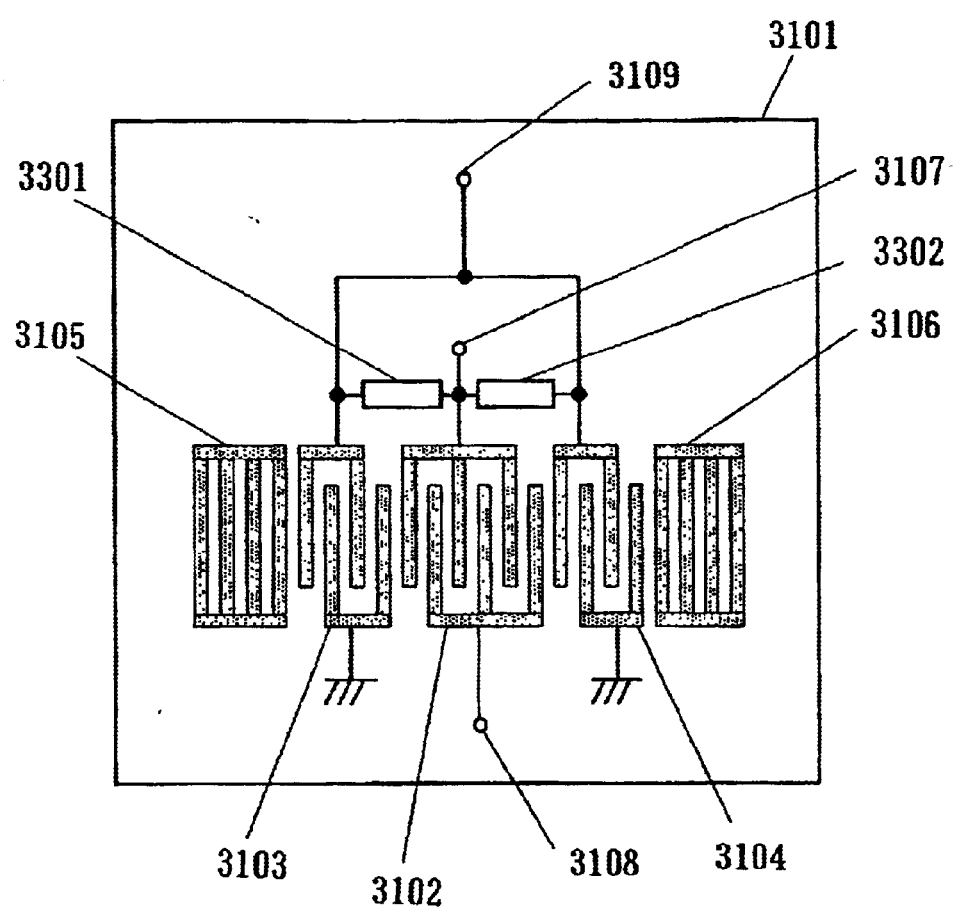
FIG. 32 is a block diagram of another surface acoustic wave filter in Embodiment 11 of the present invention.

Furthermore, in Embodiment 11, the reactance element is placed between one of balanced type terminals 3107 and the unbalanced type terminal 3109, as a reactance element between the first IDT electrode and the second and third IDT electrodes 3103 and 3104, but instead thereof, the reactance element may be placed between the other balanced type terminal 3108 and the unbalanced type terminal 3109. Also, as shown in FIG. 32, even if a first reactance element 3301 is placed between the first IDT electrode and the second IDT electrode 3103, and a second reactance element 3302 is placed between the first IDT electrode and the third IDT electrode 3104, the effect of improving the balance characteristics can be similarly achieved, as long as parasitic components such as bonding between IDT electrodes and spatial bonding form the parallel resonance with the reactance element, and makes its resonance frequency fall within the passband. Furthermore, the first reactance element 3301 and the second reactance element 3302 each correspond to the reactance element of the present invention.

(Embodiment 12)

Figure 33:
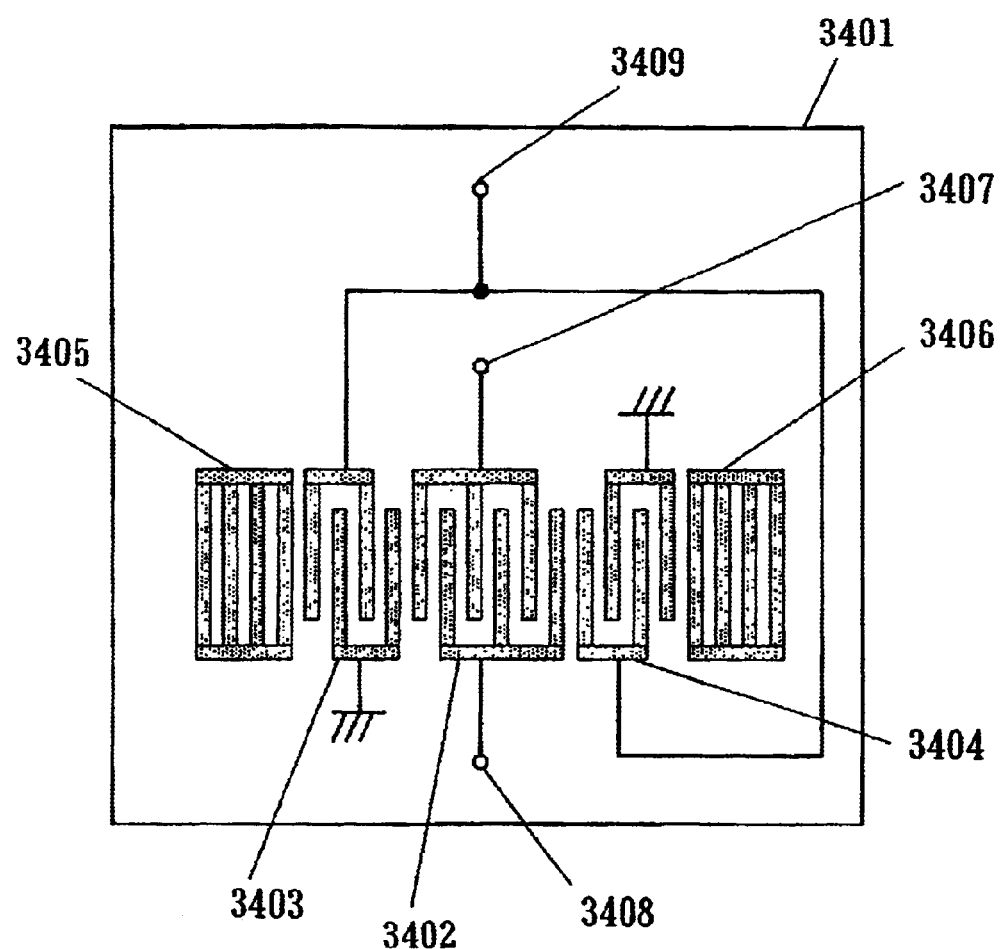
FIG. 33 is a block diagram of the surface acoustic wave filter in Embodiment 12 of the present invention.

The surface acoustic wave filter of Embodiment 12 of the present invention will be described below referring to the drawings. The configuration of the longitudinal mode type surface acoustic wave filter having balanced type terminals of the present invention is shown in FIG. 33. In FIG. 33, the surface acoustic wave filter comprises first, second and third IDT electrodes 3402, 3403 and 3404, and first and second reflector electrodes 3405 and 3406 on a piezoelectric substrate 3401.

One electrode finger of the first IDT electrode 3402 is connected to one of balanced type terminals 3407, and the other electrode finger of the first IDT electrode 3402 is connected to the other balanced type terminal 3408. Also, one electrode finger of the second IDT electrode 3403 and the other electrode finger of the third IDT electrode 3404 are connected to an unbalanced type terminal 3409, and the other electrode finger of the second IDT electrode 3403 and one electrode finger of the third IDT electrode 3404 are grounded. This configuration is different from that of FIG. 30 in that the electrode finger of the third IDT electrode connected to the unbalanced type terminal is turned upside down. The above configuration makes it possible to obtain an surface acoustic wave filter having unbalanced-balanced type terminals.

Figure 34:
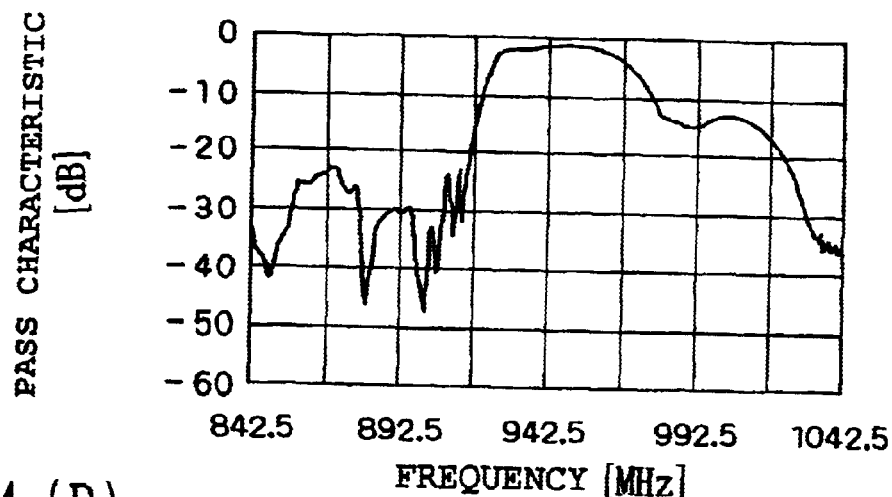
FIG. 34A shows the pass characteristic of the surface acoustic wave filter in Embodiment 12 of the present invention.
FIG. 34B shows the amplitude balance characteristic of the surface acoustic wave filter in Embodiment 12 of the present invention.
FIG. 34C shows the phase balance characteristic of the surface acoustic wave filter in Embodiment 12 of the present invention.
Figure 34:
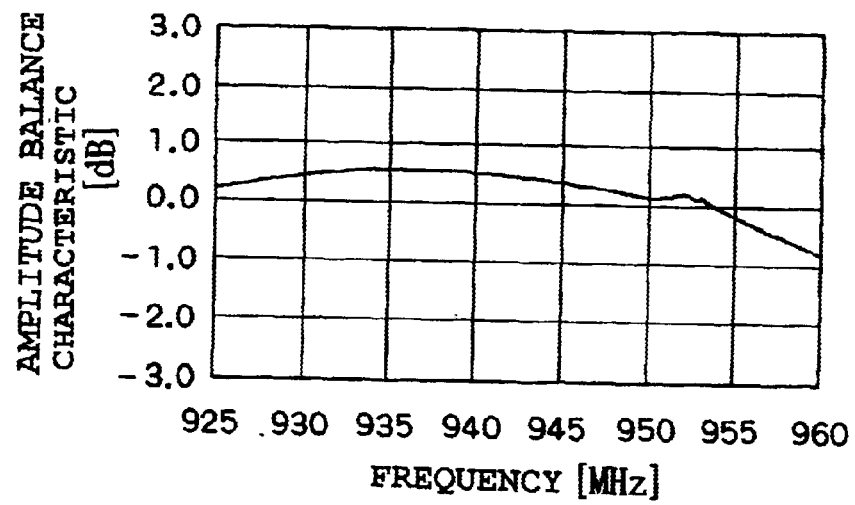
Figure 34:
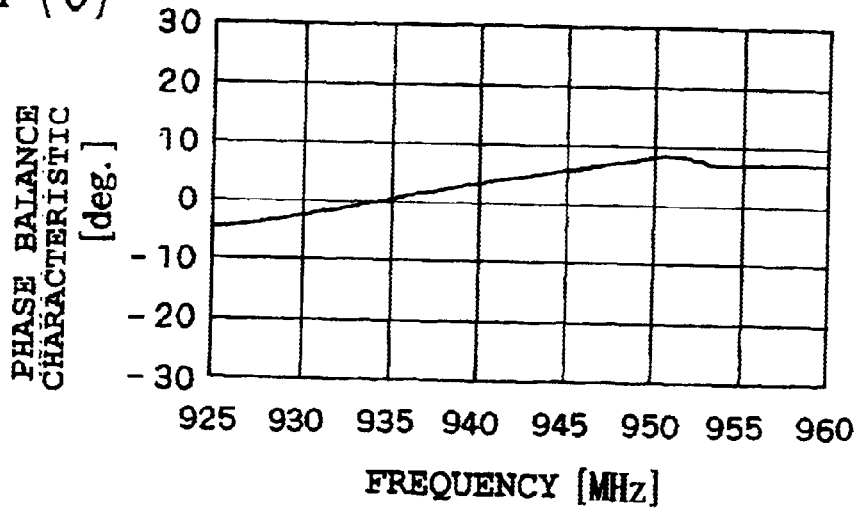

Shown in FIG. 34 is the characteristic of the surface acoustic wave filter of FIG. 33. LiTaO$_3$ is used as a piezoelectric substrate. In FIG. 34, FIG. 34A shows a pass characteristic, FIG. 34B shows an amplitude balance characteristic in the passband, and FIG. 34C shows a phase balance characteristic in the passband. As apparent from FIG. 34, the amplitude balance characteristic is −0.8 dB to +0.6 dB, and the phase balance characteristic is −5° to +8° in the passband, and thus the balance characteristics are improved compared to the characteristics of the surface acoustic wave filter of FIG. 41.

In this way, the balance characteristic is improved by turning upside down the connection of the electrode fingers of the second and third IDT electrodes 3403 and 3404, with respect to the connection between the second and third IDT electrodes 3403 and 3404 and the unbalanced type terminal 3409.

Figure 35:
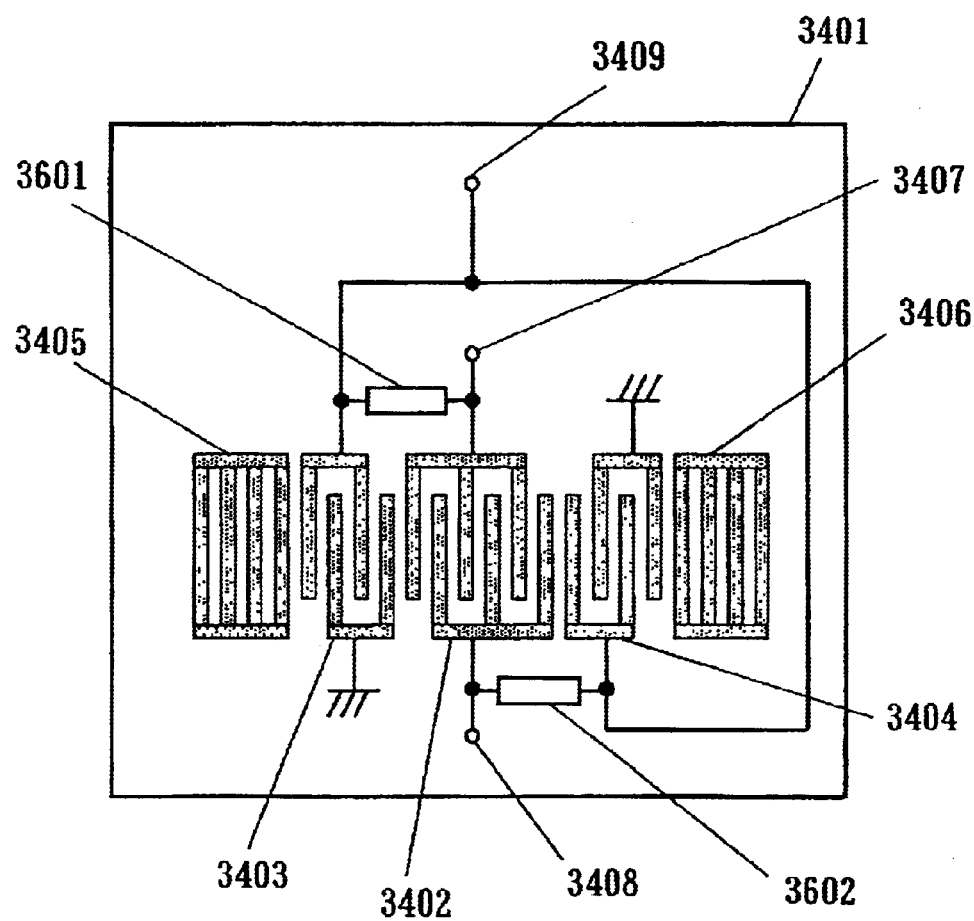
FIG. 35 is a characteristic diagram of another surface acoustic wave filter in Embodiment 12 of the present invention.

In addition, the first IDT electrode is connected to the second and third IDT electrodes 3403 and 3404 with a reactance element therebetween. As shown in FIG. 35, a first reactance element 3601 is located between one of balanced type terminals 3407 and the unbalanced type terminal 3409, and a second reactance element 3602 is located between the other balanced type terminal 3408 and the unbalanced type terminal 3409.

Furthermore, the first IDT electrode 3402 corresponds to the first IDT electrode of the present invention, the second IDT electrode 3403 corresponds to the second IDT electrode of the present invention, and the third IDT electrode 3404 corresponds to the third IDT electrode of the present invention. Also, the first reflector electrode 3405 and the second reflector electrode 3406 correspond to the reflector electrodes of the present invention. Also, one of balanced type terminals 3407 corresponds to one of the first balanced type terminals of the present invention, and the unbalanced type terminal 3409 corresponds to the unbalanced type terminal of the present invention. Also, the first reactance element 3601 and the second reactance element 3602 each correspond to the reactance element of the present invention.

Figure 36:
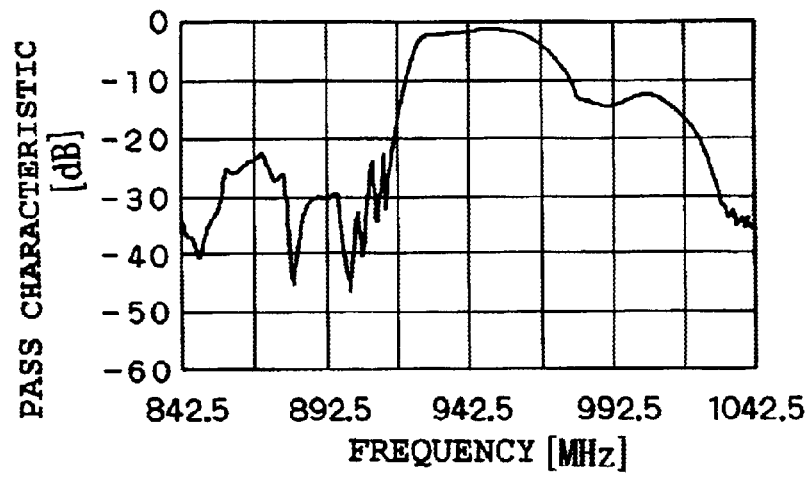
FIG. 36A shows the pass characteristic of another surface acoustic wave filter in Embodiment 12 of the present invention.
FIG. 36B shows the amplitude balance characteristic of another surface acoustic wave filter in Embodiment 12 of the present invention.
FIG. 36C shows the phase balance characteristic of another surface acoustic wave filter in Embodiment 12 of the present invention.
Figure 36:
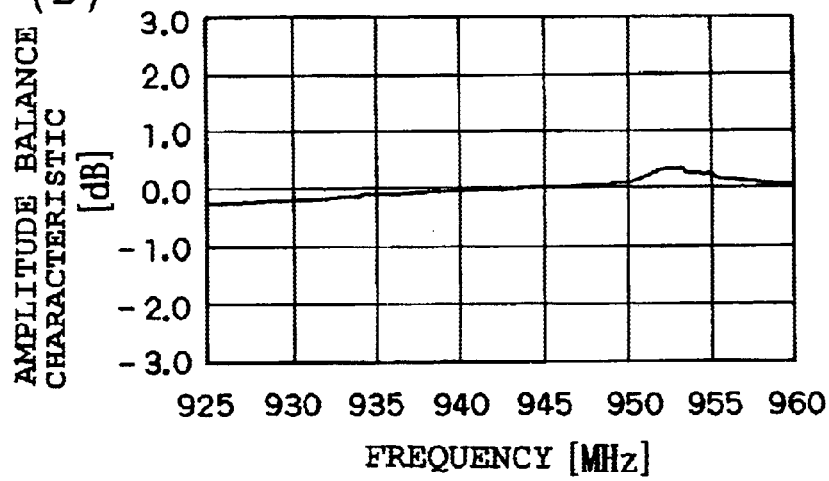
Figure 36:
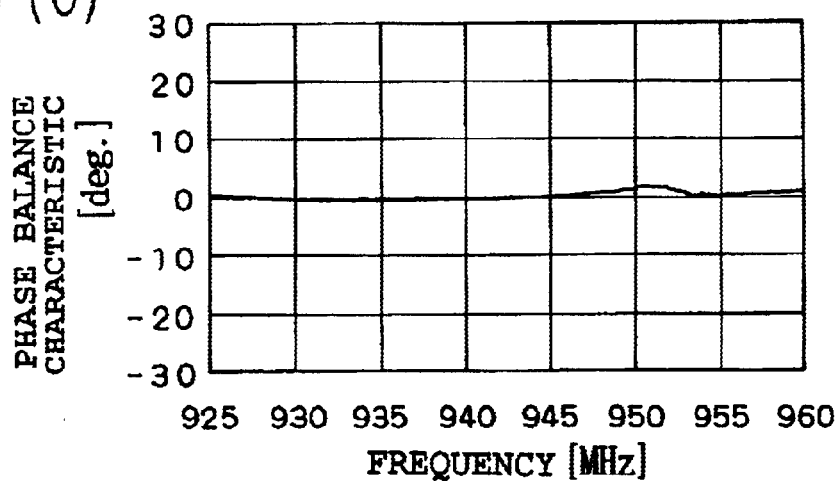

Shown in FIGS. 36A to 36C are the characteristics of the surface acoustic wave filter in which an inductor is placed as a reactance element. LiTaO$_3$ is used as a piezoelectric substrate. In addition, the surface acoustic wave filter is set so that the resonance frequency of the parallel resonance formed by parasitic components such as bonding between IDT electrodes and spatial bonding, and the placed inductance falls within the passband. In FIG. 36, FIG. 36A shows a pass characteristic, FIG. 36B shows an amplitude balance characteristic in the passband, and FIG. 36C shows a phase balance characteristic in the passband. As apparent from FIG. 36, the amplitude balance characteristic is −0.2 dB to +0.4 dB, and the phase balance characteristic is −1° to +2° in the passband, and thus the balance characteristic is significantly improved compared to the characteristic of the conventional surface acoustic wave filter of FIG. 40. Also, the balance characteristic is improved even compared to the characteristic of the surface acoustic wave filter in the configuration of FIG. 33.

Furthermore, in Embodiment 12, the first reactance element 3601 is placed between one of balanced type terminals 3407 and the unbalanced type terminal 3409, and the second reactance element 3602 is placed between the other balanced type terminal 3408 and the unbalanced type terminal 3409, but even if the reactance element is placed only in one of the above positions, the effect of improving the balance characteristics can be similarly achieved, as long as parasitic components such as bonding between IDT electrodes and spatial bonding form the parallel resonance with the reactance element, and makes its resonance frequency fall within the passband.

Figure 50:
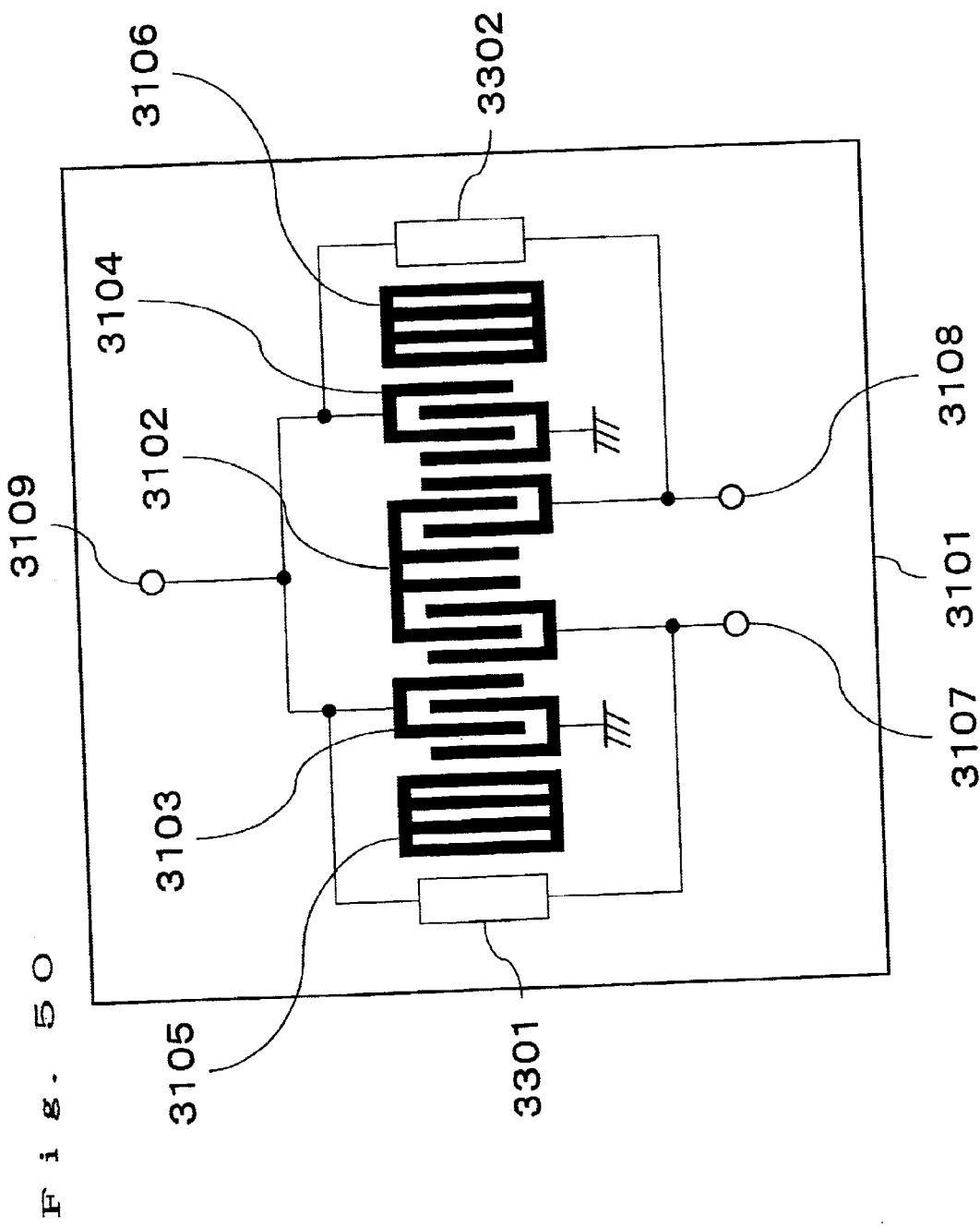
FIG. 50 is a block diagram of the surface acoustic wave filter in the embodiment of the present invention.

Furthermore, as shown in FIG. 50, a filter with a balanced type terminal can be realized by dividing the first IDT electrode 3102 into two divided IDT electrodes. Furthermore, in this case, capacitance of the first IDT electrode can be reduced, thus making it possible to set its impedance at a higher level.

(Embodiment 13)

The surface acoustic wave filter of Embodiment 13 of the present invention will be described below referring to the drawings. The configuration of the longitudinal mode type surface acoustic wave filter having balanced type terminals of the present invention is shown in FIG. 37.

Furthermore, a second IDT electrode 3803 corresponds to the first IDT electrode of the present invention, a first IDT electrode 3802 corresponds to the second IDT electrode of the present invention, and a third IDT electrode 3804 corresponds to the third IDT electrode of the present invention. Also, a first reflector electrode 3805 and a second reflector electrode 3806 correspond to the reflector electrodes of the present invention. Also, one of balanced type terminals 3807 corresponds to one of the first balanced type terminals of the present invention, the other balanced type terminal 3808 corresponds to the other of the first balanced type terminals of the present invention, and an unbalanced type terminal 3809 corresponds to the unbalanced type terminal of the present invention. Also, a first reactance element 3810 and a second reactance element 3811 each correspond to the reactance element of the present invention.

Figure 37:
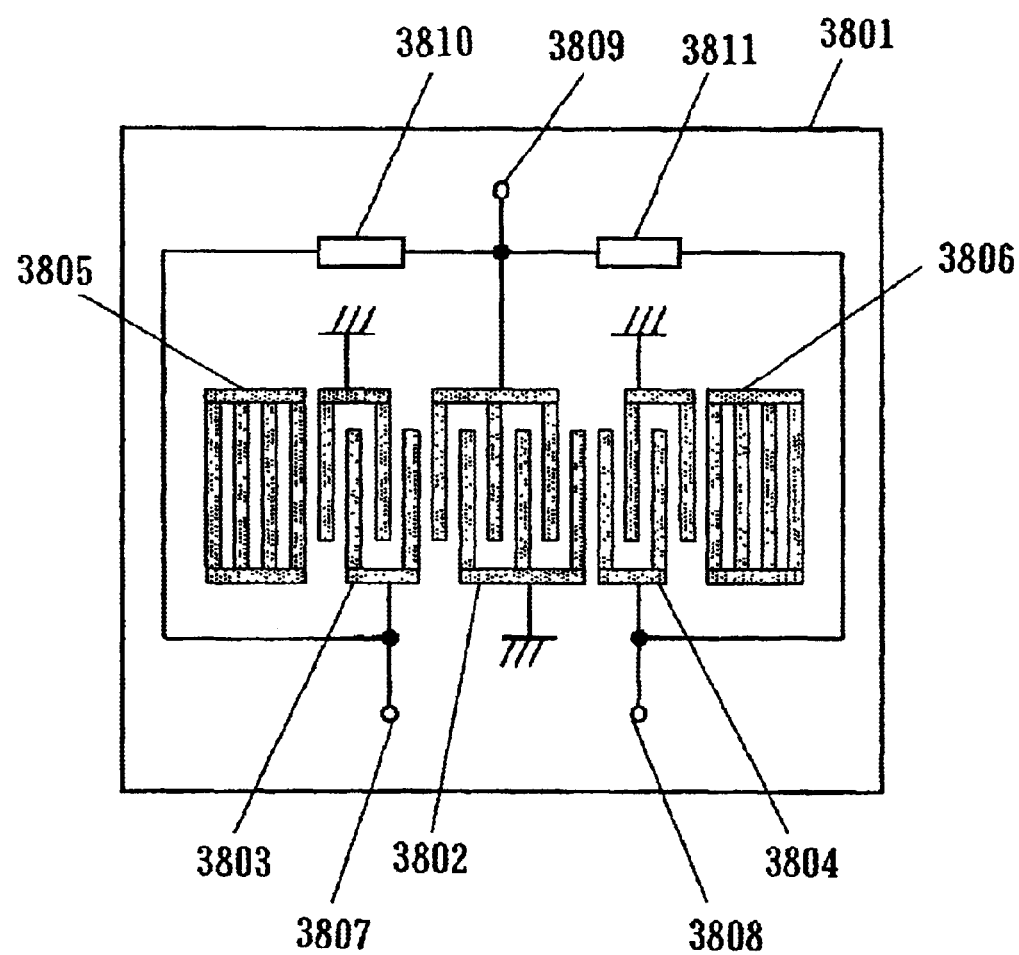
FIG. 37 is a block diagram of the surface acoustic wave filter in Embodiment 13 of the present invention.

In FIG. 37, the surface acoustic wave filter comprises first, second and third IDT electrodes 3802, 3803 and 3804, and first and second reflector electrodes 3805 and 3806 on a piezoelectric substrate 3801.

One electrode finger of the second IDT electrode 3803 is connected to one of balanced type terminals 3807, and one electrode finger of the third IDT electrode 3804 is connected to the other balanced type terminal 3808. Also, one electrode finger of the first IDT electrode 3802 is connected to one of unbalanced type terminals 3807. In addition, one electrode finger of the first IDT electrode is connected to one electrode finger of the second IDT electrode 3803 and one electrode finger of the third IDT electrode 3804 through the first and second reactance elements 3810 and 3811, respectively. That is, as shown in FIG. 37, the first reactance element 3810 is located between one of balanced type terminals 3807 and the unbalanced type terminal 3809, and the second reactance element 3811 is located between the other balanced type terminal 3808 and the unbalanced type terminal 3809. The above configuration makes it possible to obtain an surface acoustic wave filter having unbalanced-balanced type terminals.

In the surface acoustic wave filter having the configuration described above, parasitic components such as bonding between IDT electrodes and spatial bonding form the parallel resonance with the first and second reactance elements 3810 and 3811, and makes its resonance frequency fall within the passband, whereby an surface acoustic wave filter having good balance characteristics can be achieved. Also, in this configuration, the numbers of electrode fingers of the second and third IDT electrodes are smaller than the number of the electrode fingers of the first IDT electrode 3802, and therefore the impedance on the balanced type terminal side can be set at a high level compared to the embodiments 11 and 12.

Figure 38:
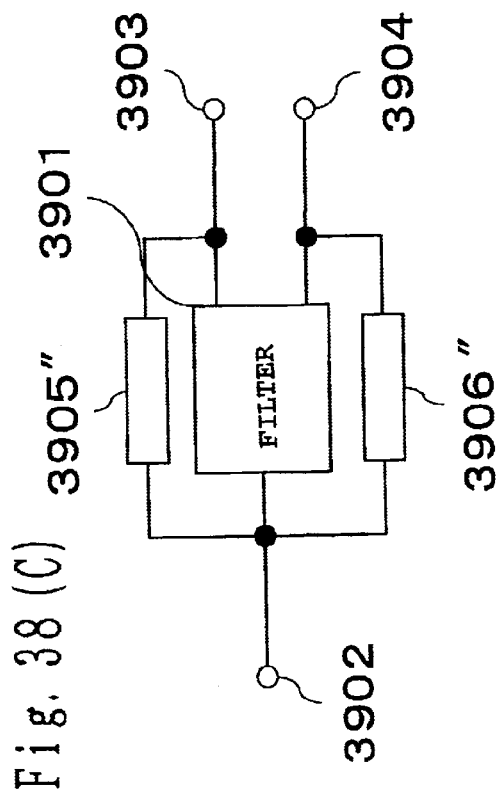
FIG. 38A is an illustrative view (No. 1) in regard to addition of a reactance element to the surface acoustic wave filter in the embodiment of the present invention.
FIG. 38B is an illustrative view (No. 2) in regard to addition of the reactance element to the surface acoustic wave filter in the embodiment of the present invention.
FIG. 38C is an illustrative view (No. 3) in regard to addition of the reactance element to the surface acoustic wave filter in the embodiment of the present invention.
Figure 38:
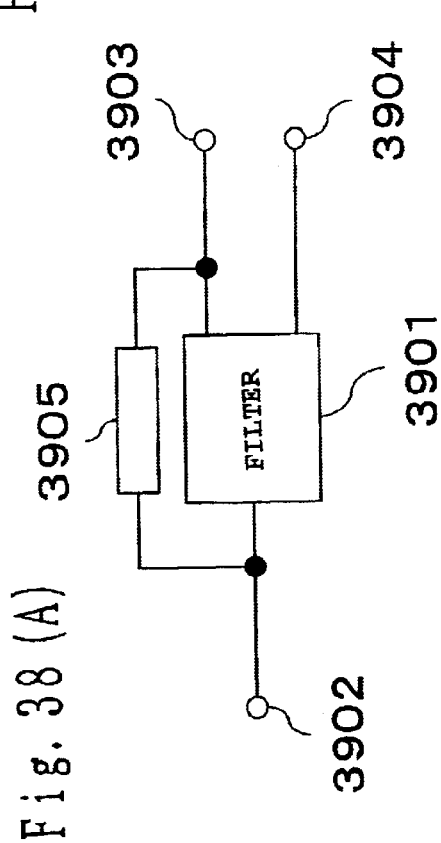
Figure 38:
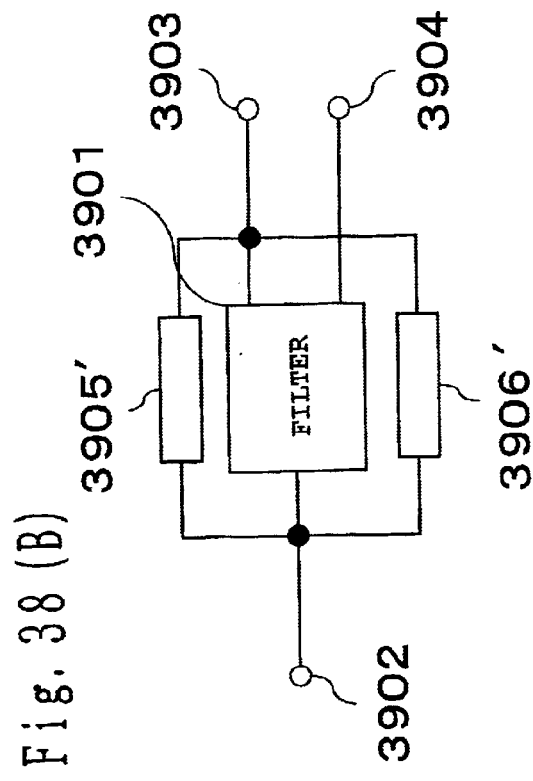

Furthermore, this embodiment has been described using the surface acoustic wave filter, but as shown in FIGS. 38A and 38B, a filter having good balance characteristics can be obtained by configuring in a same manner as this embodiment any filter having at least one balanced type terminal (FIG. 38A is electrically equivalent to FIG. 38B; reactance elements 3905' and 3906' may be inserted in parallel ).

For example, in a filter 3901, a reactance element 3905 is placed between an unbalanced type terminal 3902 and one of balanced type terminals 3903, and the parallel resonance is formed and its resonance frequency is made to fall within the passband by parasitic components generated between the balanced type terminal and the unbalanced type terminal, and the reactance element 3905, whereby good balance characteristics can be achieved. In this way, a configuration similar to that of the surface acoustic wave filter shown in FIG. 30 is obtained, but it is not necessarily required that the reactance element 3905 should be provided on the piezoelectric substrate. Furthermore, the unbalanced type terminal 3902 corresponds to the unbalanced type terminal 3109 (see FIG. 30), one of balanced type terminals 3903 corresponds to one of balanced type terminals 3107 (see FIG. 30), and the other balanced type terminal 3904 corresponds to the other balanced type terminal 3108 (see FIG. 30).

Also, in the filter 3901, reactance elements 3905' and 3906' are placed between the unbalanced type terminal 3902 and one of balanced type terminals 3903, and the parallel resonance is formed and its resonance frequency is made to fall within the passband by parasitic components generated between the balanced type terminal and the unbalanced type terminal, and the reactance elements 3905' and 3906', whereby good balance characteristics can be achieved In this way, a configuration similar to that of the surface acoustic wave filter shown in FIG. 32 is obtained, but it is not necessarily required that the reactance elements 3905' and 3906' should be provided on the piezoelectric substrate.

Also, in the filter 3901, the reactance element 3905" is placed between the unbalanced type terminal 3902 and one of balanced type terminals 3903, and the reactance element 3906" is placed between the unbalanced type terminal 3902 and the other balanced type terminal 3904, and the parallel resonance is formed and its resonance frequency is made to fall within the passband by parasitic components generated between the balanced type terminal and the unbalanced type terminal, and the reactance elements 3905" and 3906", whereby good balance characteristics can be achieved. In this way, a configuration similar to those of the surface acoustic wave filters shown in FIGS. 35 and 37 is obtained, but it is not necessarily required that the reactance elements 3905" and 3906" should be provided on the piezoelectric substrate. Furthermore, the unbalanced type terminal 3902 corresponds to the unbalanced type terminal 3409 (see FIG. 35), one of balanced type terminals 3903 corresponds to one of balanced type terminals 3407 (see FIG. 35), and the other balanced type terminal 3904 corresponds to the other balanced type terminal 3408 (see FIG. 35). Furthermore, the unbalanced type terminal 3902 corresponds to the unbalanced type terminal 3809 (see FIG. 37), one of balanced type terminals 3903 corresponds to one of balanced type terminals 3807 (see FIG. 37), and the other balanced type terminal 3904 corresponds to the other balanced type terminal 3808 (see FIG. 37).

Furthermore, Embodiments 11 to 13 have been described with respect to the unbalanced-balanced type surface acoustic wave filter, but even in the case of the balanced-balanced type surface acoustic wave filter, which is just different in how the reactance element is connected, balance characteristics can be similarly improved by setting within the passband the resonance frequency of the parallel resonance by parasitic components such as bonding between IDT electrodes and spatial bonding and the reactance element.

Also, Embodiments 11 to 13 have been described using $LiTaO_3$ as a piezoelectric substrate, but other materials such as $LiNbO_3$ may be used for the piezoelectric substrate, and its effect is increased with the effective dielectric constant of the piezoelectric substrate, and any piezoelectric substrate with the effective dielectric constant equal to or greater than 40 such as $LiTaO_3$ and $LiNbO_3$ can bring about a sufficient effect.

Also, Embodiments 11 to 13 have been described using an inductance as a reactance element, but this is not a limiting case, and a transmission line and the like may be used in combination, namely a similar improvement effect can be achieved by setting a configuration such that capacitance components produced between terminals balance each other out in the passband. Also, reactance element is formed in a package or is mounted on a substrate.

Also, these Embodiments have been described for the one-stage surface acoustic wave filter, but a plurality of surface acoustic wave filters connected in cascade may also be accepted.

Also, Embodiments 11 to 13 have been described using the longitudinal mode type filter having three electrodes, but even a longitudinal mode type filter having two, four (referred to FIG. 33(b)) or five electrodes, or a ladder-type or symmetric grid-type filter using surface acoustic resonators can bring about a similar effect with respect to balance characteristics as long as it has a configuration in which the reactance element is placed between the balanced type terminal and other terminal in a similar way.

Figure 44:
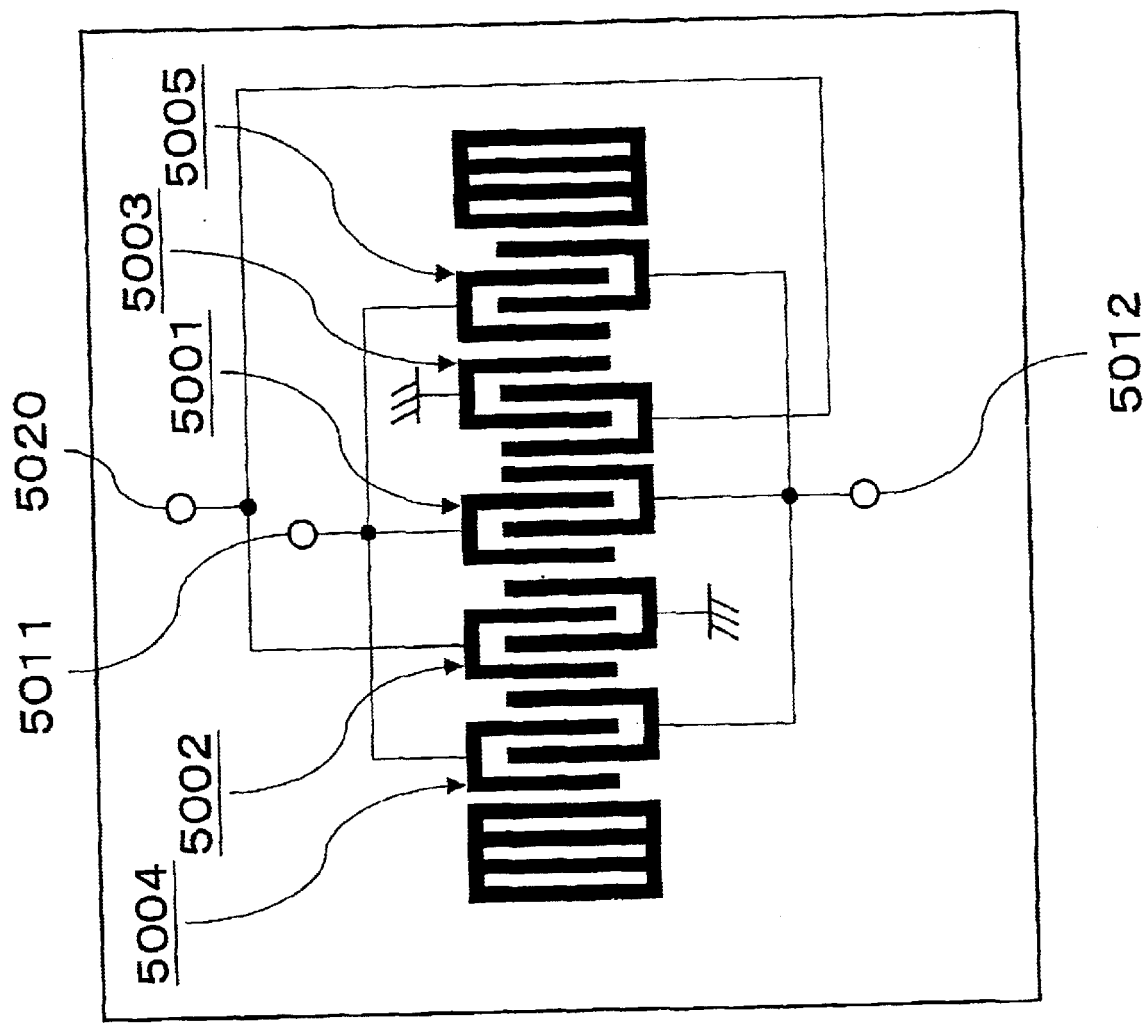
FIG. 44 is a block diagram of the surface acoustic wave filter having a five-electrode configuration of the embodiment according to the present invention.

Also, as shown in FIG. 44 being a schematic diagram of an surface acoustic wave filter having a five-electrode configuration of the embodiment according to the present invention, an surface acoustic wave filter comprising IDT electrodes 5001 to 5005 placed substantially in the direction of propagation of surface acoustic waves, wherein (1) the IDT electrode 5001 has one of its comb electrodes connected to one of balanced type terminals 5011, and the other comb electrode connected to the other balanced type terminal 5012, (2) the IDT electrode 5002 has one of its comb electrodes connected to an unbalanced type terminal 5002, (3) the IDT electrode 5103 has one its comb electrodes located on the side opposite to the one comb electrode of the IDT electrode 5002 connected to the unbalanced type terminal 5020, (4) the IDT electrode 5104 has one of its comb electrodes connected to one of balanced type terminals 5011, and the other comb electrode connected to the other balanced type terminal 5012, and (5) the IDT electrode 5105 has one of its comb electrodes connected to one of balanced type terminals 5011, and the other comb electrode connected to the other balanced type terminal 5012 is included in the present invention.

Also, a pad electrode for connecting terminals may be connected to a bus bar electrode of the IDT electrode through a leading electrode, or may be combined with the bus bar electrode of the IDT electrode as one united body.

Figure 45:
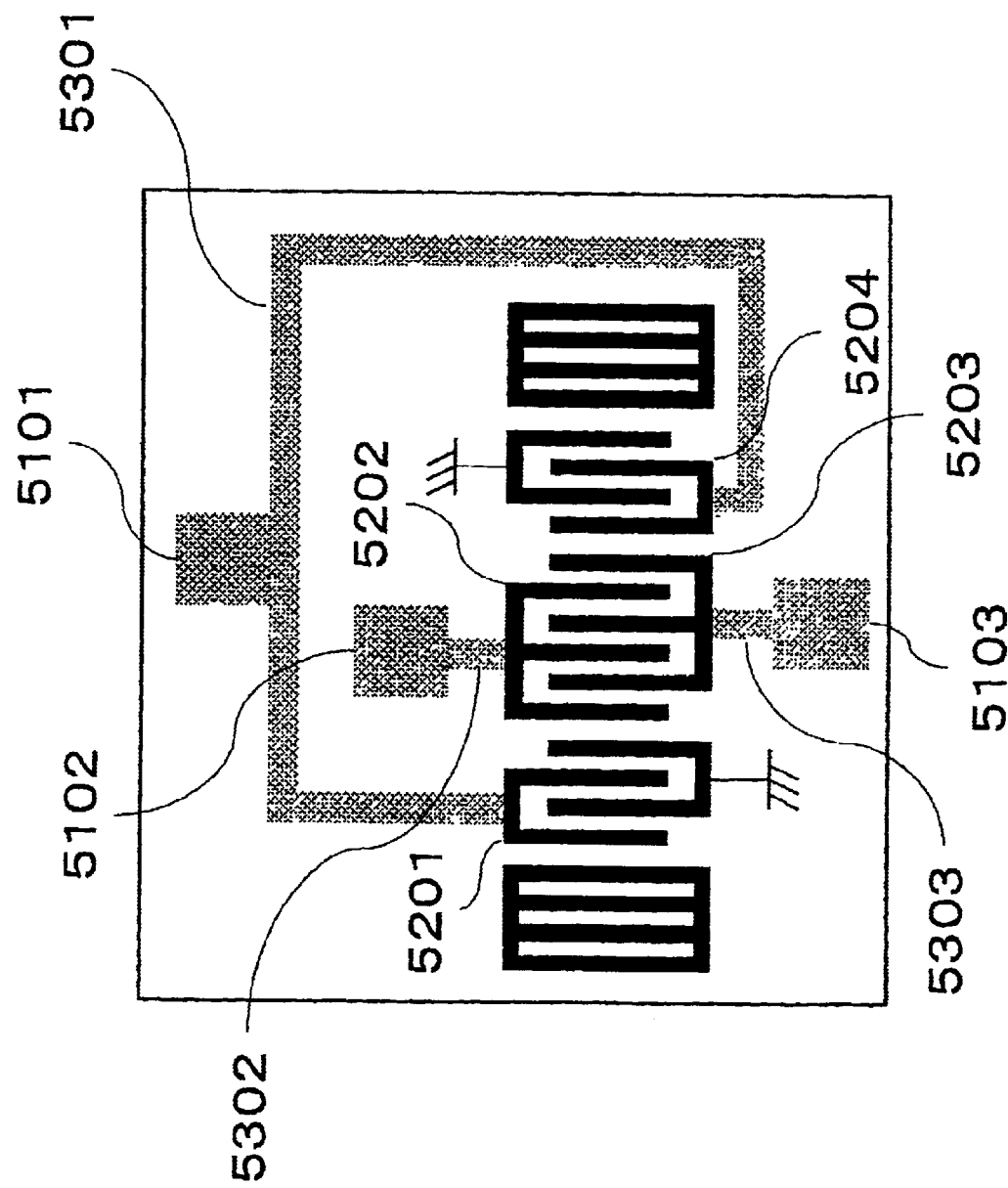
FIG. 45 is an illustrative view (No. 1) for connection of a pad electrode to a bus bar electrode in the surface acoustic wave filter of the embodiment according to the present invention.
Figure 46:
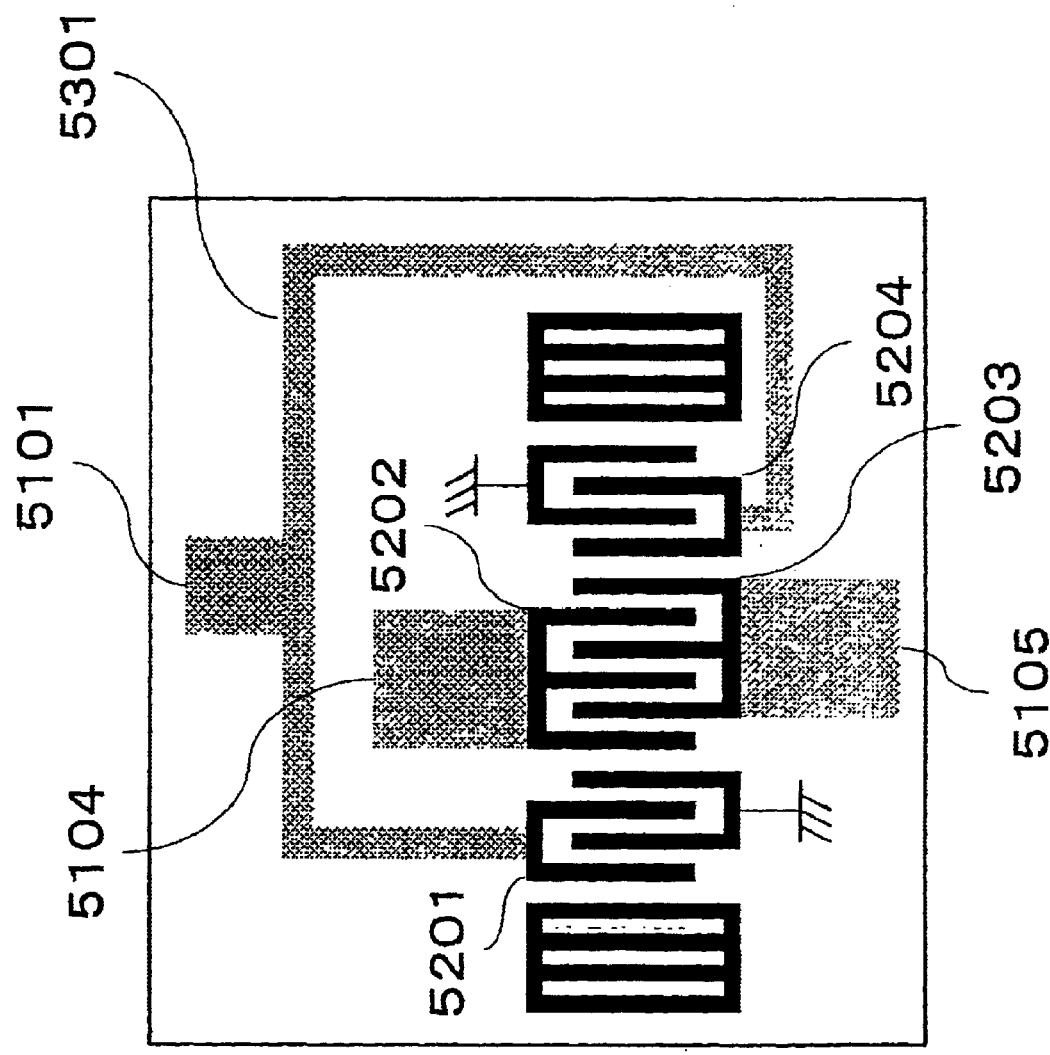
FIG. 46 is an illustrative view (No. 2) for connection of the pad electrode to the bus bar electrode in the surface acoustic wave filter of the embodiment according to the present invention.

More specifically, as shown in FIG. 45 being an explanatory view (No. 1) on connection of the pad electrode to the bus bar electrode in the surface acoustic wave filter of the embodiment according to the present invention, an surface acoustic wave filter wherein-a pad-electrode 5101 is connected to bus bar electrodes 5201 and 5204 through a leading electrode 5301, a pad electrode 5102 is connected to a bus bar electrode 5202 through a leading electrode 5302, and a pad electrode 5103 is connected to a bus bar electrode 5203 through a leading electrode 5303 is included in the present invention. Also, as shown in FIG. 46 being an explanatory view (No. 2) on connection of the pad electrode to the bus bar electrode in the surface acoustic wave filter of the embodiment according to the present invention, an surface acoustic wave filter wherein a pad electrode 5104 is combined with a bus bar electrode 5202 as one united body, and a pad electrode 5105 is combined with a bus bar electrode 5203 as one united body is included in the present invention.

(Embodiment 14)

The communication device of Embodiment 14 of the present invention will be described below referring to the drawings. Shown in FIG. 39 is an surface acoustic wave filter of the embodiment of the present invention, or a block diagram of a communication device 4001 using a balanced type filter.

Figure 39:
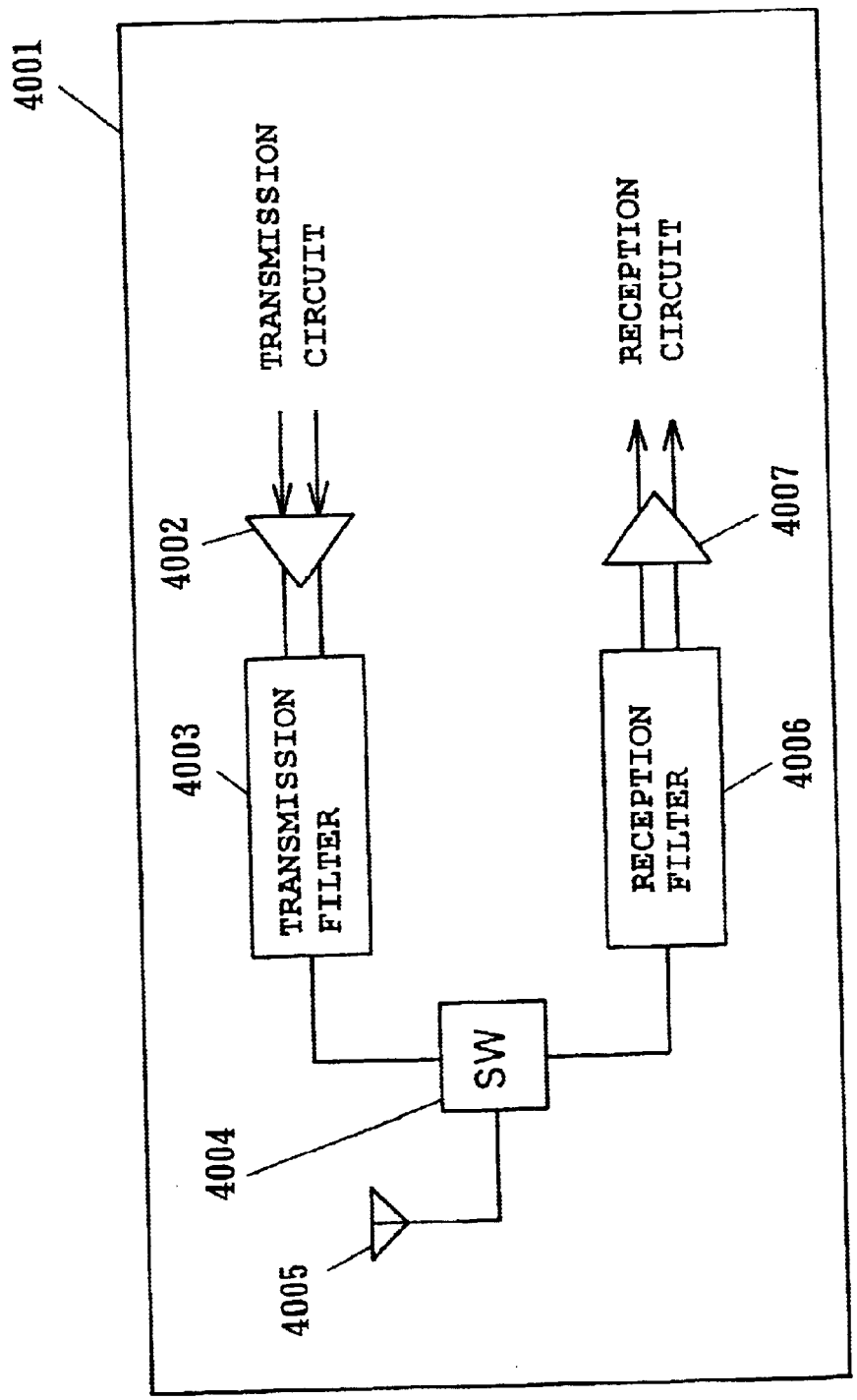
FIG. 39 is a block diagram showing the configuration of a communication device in Embodiment 14 of the present invention.

In FIG. 39, a send signal outputted from a transmission circuit is sent from an antenna 4005 through a transmission amplifier 4002, a transmission filter 4003 and a switch 4004. Also, a receive signal received from the antenna 4005 is inputted to a reception circuit through the switch 4004, a reception filter 4006 and a reception amplifier 4007. Here, because the transmission amplifier 4002 is of balanced type, and the switch 4004 is of unbalanced type, the transmission filter 4003 has unbalanced-balanced type terminals Also, because the reception amplifier 4007 is of balanced type, and the switch 4004 is of unbalanced type, the reception filter 4006 has unbalanced-balanced type terminals.

By applying the surface acoustic wave filter or the balanced type filter of the embodiment according to the present invention to the transmission filter 4003 or the reception filter 4006 of the communication device 4001, degradation in modulation accuracy during transmission due to degradation of balance characteristics can be curbed, and degradation in sensitivity during reception due to degradation of balance characteristics can be curbed, thus making it possible to achieve a high-performance communication device.

Furthermore, in Embodiment 14, the transmission filter 4003 and the reception filter 4006 are of unbalanced-balanced type, but instead thereof, the transmission filter 4003 and the reception filter 4006 may be of balanced type if the switch 4004 is of balanced type. Even in this case, a high-performance communication device can be achieved by adding a reactance element to the transmission filter 4003 and the reception filter 4006 to improve balance characteristics.

Also, if the switch 4004 is of balanced type, and the transmission amplifier 4002 or the reception amplifier 4007 is of unbalanced type, a similar effect can be achieved by changing places between balanced type and unbalanced type input/output terminals of the transmission filter 4003 or the reception filter 4006.

Also, in the communication device 4001, the switch 4004 is used as means of switching between transmission and reception, but instead thereof, a shared device may be used.

Communication devices using the surface acoustic wave filter and the balanced type filter of the present invention include cellular phone terminals, PHS terminals, car phone terminals, radio stations for cellular phones and wireless installations to conduct communications by radio. In short, the communication device of the present invention may be any device of conducting communications using high frequency signals, wherein the surface acoustic wave filter of the present invention is used in part of the circuit allowing functions of the device to be achieved.

As apparent from what has been described above, the present invention has an advantage that an surface acoustic wave filter, a balanced type filter and a communication device having better filter characteristics can be provided.

What is claimed is:

1. A surface acoustic wave filter comprising:
    a first IDT electrode disposed between second and third IDT electrodes along a direction of propagation of surface acoustic waves, each of the IDT electrodes including a pair of opposing comb electrodes placed on a piezoelectric substrate,
    a comb electrode of the second IDT electrode and an opposing comb electrode of the third IDT electrode connected together defining an unbalanced type terminal or balanced type terminals, and
    a comb electrode and an opposing comb electrode of the first IDT electrode defining balanced type terminals.

2. The surface acoustic wave filter according to claim 1, wherein said one comb electrode of said second IDT electrode is connected to one of second balanced type terminals, and
    said one comb electrode of said third IDT electrode is connected to said one of said second balanced type terminals.

3. The surface acoustic wave filter according to claim 1, comprising:
    a first reflector electrode located on the side of said second IDT electrode with respect to said first IDT electrode; and
    a second reflector electrode located on the side of said third IDT electrode with respect to said first IDT electrode,
    wherein said at least first to third IDT electrodes are placed between said first reflector electrode and said second reflector electrode, and
    said leading electrode for inputting a signal to or outputting a signal from the one comb electrode of said second IDT electrode and said leading electrode for inputting a signal to or outputting a signal from the one comb electrode of said third IDT electrode are connected to each other, and are connected to unbalanced type terminal.

4. The surface acoustic wave filter according to claim 3, wherein the other comb electrode of said second IDT electrode is grounded, and
    the other comb electrode of said third IDT electrode is grounded.

5. The surface acoustic wave filter according to claim 4, wherein said first and second reflector electrodes are grounded, and
    the other electrode of said second IDT electrode is grounded by being connected to said first reflector electrode, and
    the other electrode of said third IDT electrode is grounded by being connected to said second reflector electrode.

6. The surface acoustic wave filter according to claim 4, wherein said first and second reflector electrodes are connected to said unbalanced type terminal, and
    the one electrode of said second IDT electrode is connected to said unbalanced type terminal by being connected to said first reflector electrode, and
    the one electrode of said third IDT electrode is connected to said unbalanced type terminal by being connected to said second reflector electrode.

7. The surface acoustic wave filter according to claim 4, wherein said first reflector electrode and/or said second reflector electrode have divided into at least two segmented reflector electrodes.

8. The surface acoustic wave filter according to claim 7, wherein the segmented reflector electrode adjacent to said second and/or third IDT electrode, of said at least two segmented reflector electrodes, is directly grounded or grounded through the other segmented reflector electrode.

9. The surface acoustic wave filter according to claim 8, wherein (1) said first reflector electrode is divided, the other electrode of said second IDT electrode is grounded by being connected to the grounded segmented reflector electrode of said segmented reflector electrodes constituting said first reflector electrode, and
    (2) said second reflector electrode is divided, the other electrode of said third IDT electrode is grounded by being connected to the grounded segmented reflector electrode of said segmented reflector electrodes constituting said second reflector electrode.

10. The surface acoustic wave filter according to claim 9, wherein (1) said first reflector electrode is divided, the one electrode of said second IDT electrode is connected to the non-grounded segmented reflector electrode of said segmented reflector electrodes constituting said first reflector electrode, and said segmented reflector electrode with the one electrode of the second IDT electrode connected thereto is connected to said unbalanced type terminal, and
    (2) said second reflector electrode is divided, the one electrode of said third IDT electrode is connected to the non-grounded segmented reflector electrode of said segmented reflector electrodes constituting said second reflector electrode, and said segmented reflector electrode with the one electrode of the third IDT electrode connected thereto is connected to said unbalanced type terminal.

11. The surface acoustic wave filter according to claim 7, wherein (1) said first reflector electrode is divided into said at least two segmented reflector electrodes, at least two segmented reflector electrodes of the segmented reflector electrodes have mutually different pitches of electrode fingers, and
    (2) said second reflector electrode is divided into said at least two segmented reflector electrodes, at least two segmented reflector electrodes of the segmented reflector electrodes have mutually different pitches of electrode fingers.

12. The surface acoustic wave filter according to claim 7, wherein (1) said first reflector electrode is divided into said at least two segmented reflector electrodes, at least two segmented reflector electrodes of the segmented reflector electrodes have mutually different metallization ratios, and (2) said second reflector electrode is divided into said at least two segmented reflector electrodes, at least two segmented reflector electrodes of the segmented reflector electrodes have mutually different metallization ratios.

13. The surface acoustic wave filter according to claim 7, wherein (1) said first reflector electrode is divided into said at least three segmented reflector electrodes, not all the intervals between two neighboring segmented reflector electrodes of said segmented reflector electrodes are equal, and (2) said second reflector electrode is divided into said at least three segmented reflector electrodes, not all the intervals between two neighboring segmented reflector electrodes of said segmented reflector electrodes are equal.

14. The surface acoustic wave filter according to claim 7, wherein said the segmented reflector electrodes is divided in the crossing direction to the direction in which said first to third IDT electrodes are arranged.

15. The surface acoustic wave filter according to claim 14, wherein (1) said first reflector electrode is divided into said at least two segmented reflector electrodes, one electrode of said second IDT electrode is connected to said segmented reflector electrode constituting said first reflector electrode, and said segmented reflector electrode with the one electrode of the second IDT electrode connected thereto is connected to said unbalanced type terminal, and (2) said second reflector electrode is divided into said at least two segmented reflector electrodes, one electrode of said third IDT electrode is connected to said segmented reflector electrode constituting said second reflector electrode, and said segmented reflector electrode with the one electrode of the third IDT electrode connected thereto is connected to said unbalanced type terminal.

16. The surface acoustic wave filter according to claim 14, wherein (1) said first reflector electrode is divided into said at least two segmented reflector electrodes, the other electrode of said second IDT electrode is connected to said segmented reflector electrode constituting said first reflector electrode, and said segmented reflector electrode with the one electrode of the second IDT electrode connected thereto is grounded, and (2) said second reflector electrode is divided into said at least two segmented reflector electrodes, the other electrode of said third IDT electrode is connected to said segmented reflector electrode constituting said second reflector electrode, and said segmented reflector electrode with the one electrode of the third IDT electrode connected thereto is grounded.

17. The surface acoustic wave filter according to claim 14, wherein (1) said first reflector electrode is divided into said at least two segmented reflector electrodes, the segmented reflector electrode adjacent to said second IDT electrode, of said segmented reflector electrodes constituting said first reflector electrode, is further divided into two or more laterally segmented reflector electrodes in the direction orthogonal to the direction in which said first to third IDT electrodes are arranged, and (2) said second reflector electrode is divided into said at least two segmented reflector electrodes, the segmented reflector electrode adjacent to said third IDT electrode, of said segmented reflector electrodes constituting said second reflector electrode, is further divided into two or more laterally segmented reflector electrodes in the direction orthogonal to the direction in which said first to third IDT electrodes are arranged.

18. The surface acoustic wave filter according to claim 17, wherein (1) said first reflector electrode is divided into said at least two segmented reflector electrodes and the segmented reflector electrode adjacent to said second IDT electrode is further divided into said two or more lateral segmented reflector electrodes, some of the lateral segmented reflector electrodes are connected to said unbalanced type terminal, and (2) if said second reflector electrode is divided into said at least two segmented reflector electrodes, and the segmented reflector electrode adjacent to said third IDT electrode is further divided into said two or more lateral segmented reflector electrodes, some of the lateral segmented reflector electrodes are connected to said unbalanced type terminal.

19. The surface acoustic wave filter according to claim 17, wherein (1) said first reflector electrode is divided into said at least two segmented reflector electrodes, and the segmented reflector electrode adjacent to said second IDT electrode is further divided into said two or more lateral segmented reflector electrodes, some of the lateral segmented reflector electrodes are grounded, and (2) said second reflector electrode is divided into said at least two segmented reflector electrodes and the segmented reflector electrode adjacent to said third IDT electrode is further divided into said two or more lateral segmented reflector electrodes, some of the lateral segmented reflector electrodes are grounded.

20. The surface acoustic wave filter according to claim 3, wherein one or more surface acoustic wave resonators are connected to said unbalances type terminal in series and/or in parallel.

21. The surface acoustic wave filter according to claim 1, the surface acoustic wave filter having a function to convert the unbalanced type into the balanced type or convert the balanced type into the unbalanced type.

22. The surface acoustic wave filter according to claim 1, comprising:

a first filter track having (1) a fourth IDT electrode with other IDT electrodes located on its both sides, (2) a fifth IDT electrode of the other IDT electrodes having a signal inputted to or outputted from one of its comb electrodes through a leading electrode, and (3) a sixth IDT electrode of the other IDT electrodes located on the side opposite to said fifth IDT electrode having a signal inputted to or outputted from one of its comb electrodes through a leading electrode, the fourth to sixth IDT electrodes being arranged in the direction of propagation of said surface acoustic wave, each constituted by a pair of opposing comb electrodes placed on said piezoelectric substrate; and a second filter track having said first IDT electrode, said second IDT electrode and said third IDT electrode, wherein said first filter track and said second filter track are connected to each other in cascade, said leading electrode for inputting a signal to or outputting a signal from the one comb electrode of said second IDT electrode and said leading electrode for inputting a signal to or outputting a signal from the one comb electrode of said fifth IDT electrode are connected to each other, and said leading electrode for inputting a signal to or outputting a signal from the one comb electrode of said third IDT electrode and said leading electrode for inputting a signal to or outputting a signal from the one comb electrode of said sixth IDT electrode are connected to each other.

23. The surface acoustic wave filter according to claim 22, wherein the one comb electrode of said fifth IDT electrode is located on the side same as that of the one comb electrode of said sixth IDT electrode.

24. The surface acoustic wave filter according to claim 22, wherein the one comb electrode of said fifth IDT electrode is located on the side opposite to the one comb electrode of said sixth IDT electrode.

25. The surface acoustic wave filter according to claim 22, wherein the one comb electrode of said fourth IDT electrode is connected to an unbalanced type terminal.

26. The surface acoustic wave filter according to claim 25, wherein the one comb electrode of said fourth IDT electrode is located opposite to said second filter track.

27. The surface acoustic wave filter according to claim 22, wherein the other comb electrode of said second IDT electrode is grounded,
the other comb electrode of said third IDT electrode is grounded,
the other comb electrode of said fifth IDT electrode is grounded, and
the other comb electrode of said sixth IDT electrode is grounded.

28. The surface acoustic wave filter according to claim 22, wherein (1) the phase in which a signal is inputted to or outputted from the one comb electrode of said second IDT electrode is substantial opposite to (2) the phase in which a signal is inputted to or outputted from the one comb electrode of said third IDT electrode.

29. The surface acoustic wave filter according to claim 22, wherein (1) the reactance component of wiring for connecting the leading electrode for inputting a signal to or outputting a signal from the one comb electrode of said second IDT electrode to the leading electrode for inputting a signal to or outputting a signal from the one comb electrode of said fifth IDT electrode is substantially equal to (2) the reactance component of wiring for connecting the leading electrode for inputting a signal to or outputting a signal from the one comb electrode of said third IDT electrode to the leading electrode for inputting a signal to or outputting a signal from the one comb electrode of said sixth IDT electrode.

30. The surface acoustic wave filter according to claim 22, wherein one comb electrode of said fourth IDT electrode is connected to one of second balanced type terminals, and
the other comb electrode of said fourth IDT electrode is connected to the other of said second balanced type terminals.

31. The surface acoustic wave filter according to claim 22, comprising:
a first reflector electrode located on the side of said second IDT electrode with respect to said first IDT electrode;
a second reflector electrode located on the side of said third IDT electrode with respect to said first IDT electrode;
a third reflector electrode located on the side of said fifth IDT electrode with respect to said fourth IDT electrode; and
a fourth reflector electrode located on the side of said sixth IDT electrode with respect to said fourth IDT electrode,
wherein said at least first to third IDT electrodes are placed between said first reflector electrode and said second reflector electrode, and
said at least fourth to sixth IDT electrodes are placed between said third reflector electrode and said fourth reflector electrode.

32. The surface acoustic wave filter according to claim 22, wherein at least one of said first to sixth IDT electrodes is divided into a plurality of segmented IDT electrodes,
all or part of the comb electrodes located on one side, of the comb electrodes of said plurality of segmented IDT electrodes, are electrically connected together, and
all or part of the comb electrodes located on the other side, of the comb electrodes of said plurality of segmented IDT electrodes, is electrically connected together.

33. The surface acoustic wave filter according to claim 32, wherein at least one of said first to sixth IDT electrodes is divided into two or three segmented IDT electrodes.

34. The surface acoustic wave filter according to claim 22, wherein the central pitch of neighboring electrode fingers of a pair of said opposing comb electrodes has a value substantially in the range of from $0.9 \times \lambda/2$ to $1.1 \times \lambda/2$ with respect to the central frequency $\lambda$ of the surface acoustic wave filter.

35. The surface acoustic wave filter of claim 1 including:
a reactance element connected between a comb electrode of the first IDT electrode and a comb electrode of the second IDT electrode.

36. The surface acoustic wave filter according to claim 35, further comprising:
a third IDT electrode constituted by a pair of opposing comb electrodes placed on said piezoelectric substrate, with one of the comb electrodes connected to said unbalanced type terminal,
wherein said first to third IDT electrodes are arranged substantially in the direction of propagation of the surface acoustic wave so that said second IDT electrode is located on the side opposite to said third IDT electrode with respect to said first IDT electrode, and
the other comb electrode of said first IDT electrode is connected to the other of said first balanced type terminals.

37. The surface accoustic wave filter according to claim 36,
wherein a reactance element is connected between the one comb electrode of said first IDT electrode and the one comb electrode of said third IDT electrode.

38. The surface acoustic wave filter according to claim 37, wherein the one comb electrode of said second IDT electrode is located on the side opposite to the one comb electrode of said third IDT electrode with respect to the first to third IDT electrodes arranged substantially in the direction of propagation of said surface acoustic wave.

39. The surface acoustic wave filter according to claim 35, further comprising:
a third IDT electrode constituted by a pair of opposing comb electrodes placed on said piezoelectric substrate, with one of the comb electrodes connected to the other of said first balanced type terminals,
wherein said first to third IDT electrodes are arranged substantially in the direction of propagation of the surface acoustic wave so that said first IDT electrode is located on the side opposite to said third IDT electrode with respect to said second IDT electrode.

40. The surface accoustic wave filter according to claim 39,
wherein a reactance element is connected between the one comb electrode of said first IDT electrode and the one comb electrode of said third IDT electrode.

41. The surface accoustic wave filter according to claim 35, comprising (1) a first surface accoustic wave resonator, having said first IDT electrode, and two reflector electrodes with said first IDT electrodes located therebetween, and (2) a second surface accoustic wave resonator, having said second IDT electrode, and two reflector electrodes with said second IDT electrodes located therebetween, wherein said first surface accoustic wave resonator and second surface accoustic wave resonator are connected in a ladder form.

42. The surface acoustic wave filter according to claim 35, wherein a parallel resonance circuit with the resonance frequency set in the pass band is formed by parasitic components existing between said unbalanced type terminal and said balanced type terminal, and said reactance element.

43. The surface acoustic wave filter according to claim 35, wherein said reactance element is an inductance.

44. The surface acoustic wave filter according to claim 35, wherein said piezoelectric substrate has an effective relative dielectric constant of 40 or greater.

45. The surface acoustic wave filter according to claim 35, wherein said piezoelectric substrate is made by using lithium tantalate or lithium niobate.

46. The surface accoustic wave filter according to claim 35, further comprising:

a third IDT electrode constituted by a pair of opposing comb electrodes placed on said piezoelectric substrate, with one of the comb electrodes connected to said unbalanced type terminal, wherein said first to third IDT electrodes are arranged substantially in the direction of propagation of the surface accoustic wave so that said second IDT electrode is located on the side opposite to said third IDT electrode with respect to said first IDT electrode, said one of the comb electrodes of said first IDT electrode is divided into a first divided comb electrode and a second divided comb electrodes, said first divided comb electrode is connected to the one of said first balanced type terminals, and said second divided comb electrode is connected to the other of said first balanced type terminals.

47. A balanced type fitter comprising a plurality of IDTs, and an unbalanced type terminal and balanced type terminals, wherein at least one predetermined reactance element is connected between said unbalanced type terminal and said at least one of balanced type terminals.

48. The balanced type filter according to claim 47, wherein a parallel resonance circuit with the resonance frequency set in the pass band is formed by parasitic components existing between said unbalanced type terminal and said balanced type terminal, and said reactance element.

49. A communication device comprising:

transmission/reception means of performing transmission and/or reception; and the surface acoustic wave filter according to claim 1 or 35 or the balanced type filter according to claim 47 filtering a send signal to be used in said transmission and/or a receive signal to be used in said reception.

* * * * *